United States Patent
Zaderej et al.

(10) Patent No.: US 7,992,294 B2
(45) Date of Patent: Aug. 9, 2011

(54) METHOD OF MANUFACTURING AN INTERCONNECT DEVICE WHICH FORMS A HEAT SINK AND ELECTRICAL CONNECTIONS BETWEEN A HEAT GENERATING DEVICE AND A POWER SOURCE

(75) Inventors: Victor Zaderej, St. Charles, IL (US);
Kevin O'Connor, Lisle, IL (US);
Charlie Manlapaz, Brookfield, IL (US);
Timothy Hagan, Sugar Grove, IL (US);
Samuel C. Ramey, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 636 days.

(21) Appl. No.: 12/126,635

(22) Filed: May 23, 2008

(65) Prior Publication Data
US 2008/0307646 A1 Dec. 18, 2008

Related U.S. Application Data

(60) Provisional application No. 60/931,878, filed on May 25, 2007, provisional application No. 61/008,655, filed on Dec. 21, 2007, provisional application No. 61/038,469, filed on Mar. 21, 2008.

(51) Int. Cl.
*H05K 3/02* (2006.01)
*H05K 3/10* (2006.01)
(52) U.S. Cl. .............................. 29/846; 29/874; 29/876
(58) Field of Classification Search .................. 29/846, 29/874, 876, 884; 257/676, 719, E33.061
See application file for complete search history.

(56) References Cited

U.S. PATENT DOCUMENTS

| | | | |
|---|---|---|---|
| 4,084,312 A | 4/1978 | Kirk et al. | |
| 4,675,575 A | 6/1987 | Smith et al. | |
| 4,727,289 A | 2/1988 | Uchida | |
| 4,869,954 A | 9/1989 | Squitieri | |
| 5,049,973 A | 9/1991 | Satriano et al. | |
| 5,102,829 A | 4/1992 | Cohn | |
| 5,155,579 A | 10/1992 | AuYeung | |
| 5,160,200 A | 11/1992 | Cheselske | |
| 5,422,472 A | 6/1995 | Tavislan et al. | |
| 5,427,532 A | 6/1995 | Owen et al. | |
| 5,463,280 A | 10/1995 | Johnson | |
| 5,575,459 A | 11/1996 | Anderson | |
| 5,608,267 A | 3/1997 | Mahulikar et al. | |
| 5,655,830 A | 8/1997 | Ruskouski | |
| 5,688,042 A | 11/1997 | Madadi et al. | |
| 5,721,430 A | 2/1998 | Wong | |
| 5,765,940 A | 6/1998 | Levy et al. | |
| 5,803,579 A | 9/1998 | Turnbull et al. | |
| 5,805,430 A | 9/1998 | Atwood et al. | |
| 5,806,965 A | 9/1998 | Deese | |
| 5,813,752 A | 9/1998 | Singer et al. | |

(Continued)

OTHER PUBLICATIONS

"Thermal Management of Golden Dragon LED" Application Note; Dated Apr. 2006; Eleven (11) pages; Author Rainer Huber.

(Continued)

*Primary Examiner* — Thiem Phan
(74) *Attorney, Agent, or Firm* — Stephen L. Sheldon

(57) ABSTRACT

An interconnect device is used to mate a heat generating device to a power source. Plated components are provided on the interconnect device to provide a heat sink function for the heat generating device when the heat generating device is connected to the interconnect device, and to provide an electrical path between the heat generating device and the power source. A method of manufacturing same is also disclosed.

5 Claims, 38 Drawing Sheets

U.S. PATENT DOCUMENTS

| | | | |
|---|---|---|---|
| 5,839,816 | A | 11/1998 | Varga et al. |
| 5,890,794 | A | 4/1999 | Abtahi et al. |
| 5,941,626 | A | 8/1999 | Yamuro |
| 5,947,588 | A | 9/1999 | Huang |
| 5,953,593 | A | 9/1999 | Ferri et al. |
| 5,982,092 | A | 11/1999 | Chen |
| 6,020,649 | A | 2/2000 | Watanabe et al. |
| 6,025,992 | A | 2/2000 | Dodge et al. |
| 6,045,240 | A | 4/2000 | Hochstein |
| 6,055,158 | A | 4/2000 | Pavlovic |
| 6,137,064 | A | 10/2000 | Kiani et al. |
| 6,149,283 | A | 11/2000 | Conway et al. |
| 6,212,070 | B1 | 4/2001 | Atwood et al. |
| 6,220,722 | B1 | 4/2001 | Begemann |
| 6,227,679 | B1 | 5/2001 | Zhang et al. |
| 6,274,408 | B1 | 8/2001 | Watanabe et al. |
| 6,326,678 | B1 | 12/2001 | Karnezos et al. |
| 6,465,961 | B1 | 10/2002 | Cao |
| 6,499,860 | B2 | 12/2002 | Begemann |
| 6,502,952 | B1 | 1/2003 | Hartley |
| 6,552,417 | B2 | 4/2003 | Combs |
| 6,561,680 | B1 | 5/2003 | Shih |
| 6,577,073 | B2 | 6/2003 | Shimizu et al. |
| 6,580,228 | B1 | 6/2003 | Chen et al. |
| 6,724,071 | B2 | 4/2004 | Combs |
| 6,746,885 | B2 | 6/2004 | Cao |
| 6,796,698 | B2 | 9/2004 | Sommers et al. |
| 6,851,837 | B2 | 2/2005 | Tessnow et al. |
| 6,890,175 | B2 | 5/2005 | Fischer et al. |
| 6,896,381 | B2 | 5/2005 | Benitez et al. |
| 6,940,659 | B2 | 9/2005 | McLean et al. |
| 6,971,765 | B2 | 12/2005 | Wu |
| 6,994,546 | B2 | 2/2006 | Fischer et al. |
| 7,047,040 | B2 | 5/2006 | Kim et al. |
| 7,056,116 | B2 | 6/2006 | Scott et al. |
| 7,070,340 | B2 | 7/2006 | Crane, Jr. et al. |
| 7,074,040 | B2 | 7/2006 | Kanca |
| 7,092,612 | B1 | 8/2006 | Coushaine |
| 7,106,523 | B2 | 9/2006 | McLean et al. |
| 7,108,055 | B2 | 9/2006 | Krassowski et al. |
| D530,013 | S | 10/2006 | Fischer et al. |
| 7,119,422 | B2 | 10/2006 | Chin |
| 7,144,135 | B2 | 12/2006 | Martin et al. |
| 7,144,250 | B2 | 12/2006 | Fischer et al. |
| 7,153,015 | B2 | 12/2006 | Brukilacchio |
| 7,218,522 | B2 | 5/2007 | Chen et al. |
| 7,221,042 | B2 | 5/2007 | Bambridge |
| 2003/0019838 | A1 | 1/2003 | Shaw et al. |
| 2003/0215766 | A1 | 11/2003 | Fischer et al. |
| 2004/0012298 | A1 | 1/2004 | Cunningham et al. |
| 2004/0025855 | A1 | 2/2004 | Hageman et al. |
| 2004/0041222 | A1 | 3/2004 | Loh |
| 2005/0039948 | A1 | 2/2005 | Asai et al. |
| 2006/0237838 | A1 | 10/2006 | Fery et al. |

OTHER PUBLICATIONS

"New Technologies" by David Shiller, V.P. New Business Dev.; Feb. 25-27, 2008; 200/8 Energy Star Lighting Partner Meeting, Phoenix, AZ; Nine (9) pages.

In the News—"LCPs hold bright LEDs"; Dated Mar. 20, 2008; One (1) page.

Printout from www.goodmart.com; Copyright 2000-2008; Standard Light Bulb Base Types; Two (2) pages.

METHOD OF MANUFACTURING AN INTERCONNECT DEVICE WHICH FORMS A HEAT SINK AND ELECTRICAL CONNECTIONS BETWEEN A HEAT GENERATING DEVICE AND A POWER SOURCE

This application claims the domestic benefit of U.S. Provisional Application Ser. No. 60/931,878 filed on May 25, 2007, U.S. Provisional Application Ser. No. 61/008,655 filed on Dec. 21, 2007, and U.S. Provisional Application Ser. No. 61/038,469 filed on Mar. 21, 2008, which disclosures are hereby incorporated by reference.

FIELD OF THE INVENTION

This invention is generally directed to an interconnect device for housing heat generating devices, such as an LED device, resistors and capacitors and the like. The interconnect device forms a connection between heat generating devices and a power source.

BACKGROUND OF THE INVENTION

LED lighting is becoming very important in the lighting industry. LED lighting has significant advantages over both incandescent and fluorescent lighting. LED lighting is more energy efficient than incandescent bulbs and LED lighting does not have the cold temperature use and mercury issues of the fluorescent bulbs. Furthermore, because of the small size of LED lights, LED lights can be packaged in ways that incandescent and fluorescent lighting cannot be packaged.

In the electronics industry, heat is a significant problem. The electrical devices in products, such as LED lighting, produce heat. This energy increases the temperature of the devices and of the system in which they are in. This, in turn, may reduce the performance and life of not only the devices themselves, but of the entire system. Therefore, one of the primary challenges in fully commercializing LED lighting is the solution to the thermal management of the heat generated by LED lighting in a cost effective manner. To date, most suppliers have used aluminum core circuit boards onto which they surface mount solder the LED device. Two dimensional aluminum core boards have limited surface area to dissipate heat. In addition, the LED lights cannot be easily interchanged to either replace defective units or to change the product color.

In order to reduce the effect of this detrimental energy, heat sinks are attached to the devices such as LED lighting. The heat sinks provide a means for removing the energy from the device through convection and radiation of the energy away from the device.

Energy loss from a heat sink occurs through natural convection, forced convection or radiation. The effectiveness of the heat sink in pulling energy away from the device is dependant on the ability to spread or dissipate the heat generated from what is often a small source over a larger area so that it can be removed through the flow of air over the surface or by radiation to the environment.

In effect, as long as the heat generated by the devices to be cooled can be effectively spread over a larger surface, the effectiveness of the heat sink is primarily dependent on the amount of available surface area. Whether the material is a conductor throughout its body or just on the surface does not affect its ability to transfer heat to the environment.

Heat management in electrical devices that are becoming smaller, lighter, and more compact is an ever increasing challenge. Historically, the heat sinks used to dissipate the energy have been made of metals such as zinc, aluminum, or copper and can be either machined, cast or extruded. Because the heat sinks are made of metal, the heat sinks are often heavy. As the devices become smaller and the need to reduce part weight and cost increases, alternative methods to control heat must be found. Furthermore, since the devices are electrical conductors, the attachment of heat sinks to the devices requires modifications to the heat sink so that electrical circuitry providing either signals or power can be provided without shorting such electrical circuitry to the metal heat sink.

Unlike incandescent and fluorescent lighting sources that perform well when they are warm/hot, LEDs need to be kept cool for optimal life and performance. By keeping the junction temperature (Tj) of the LED below its maximum temperature limit, the life of an LED can be extended to over 50,000 hours of operation. Because the heat generated at the LED junction is concentrated in a very small volume, the temperature can quickly rise to well over 150° C. if the heat is not efficiently removed.

The thermal model most commonly used for heat management at the LED junction between the LED device and the heat sink is provided by the following equation 1:

$$Tj = Ta + Pd \times Rja$$

Where,
 Tj is the junction temperature;
 Ta is the ambient temperature for the heat sink;
 Pd is the power that is being dissipated by the LED; and
 Rja is the sum of the thermal resistances between the junction and ambient environment.

The primary factors that affect the temperature at the junction Tj are:
 1. The ambient temperature Ta of the LED device;
 2. The sum of the thermal resistances between Tj and Ta;
 3. The power that must be dissipated; and
 4. The airflow.

Assuming that the amount of power that must be dissipated by the LED is determined by the device being used, its efficiency, and the lighting requirements, the only variable in equation 1 that can be controlled is the thermal resistance between the junction and ambient Rja. The value of Rja can be determined by adding the various thermal resistances between the LED junction that emits the light and the ambient environment. A list of the resistance values that are included in Rja is as follows:
 1. The thermal resistance of the LED die;
 2. The thermal resistance of the die attach between the die and the internal heat sink;
 3. The thermal resistance of the internal heat sink;
 4. The thermal resistance between the internal heat sink and the solder point;
 5. The thermal resistance of the solder pad on the substrate technology onto which the LED package is soldered;
 6. The thermal resistance of the dielectric board onto which the LED package is mounted;
 7. The thermal resistance of the attachment method between the dielectric board and a heat sink; and
 8. The thermal resistance of the heat sink to the ambient environment.

Of these thermal resistance values, items 1 through 4 are internal to the LED being manufactured by companies such as Lumileds, Cree, Osram, and Nichia. These values are predefined and can only be improved or modified by the manufacturers of the LEDs. The sum of these resistances is defined as Rjs, or the thermal resistance between the junction, j, and solder point, s, of the internal LED heat sink.

Items 5 and 6 form the thermal resistance associated with the substrate technology chosen to both electrically and thermally interconnect the LED to the heat sink that will dissipate the heat to the ambient environment. This value is defined as Rsb where s is the solder point on the LED and b is the board onto which the LED is attached.

Items 7 and 8 are combined to create Rba where b is the board onto which the LED is mounted and a the ambient environment. In effect, Rba is the thermal resistance of the heat sink that is optimized for dissipating heat to the ambient environment.

When designing high power LED lighting devices, some of the guidelines provided by Cree (2) are as follows:
1. Reduce the amount of heat that must be removed near the LED junction by keeping the LED drive circuitry far enough away from the LED that it does not affect the junction temperature during operation.
2. Minimize the ambient temperature inside the fixture that encloses the LED by efficient thermal packaging. Optimizing heat dissipation surface area as well as ensuring that there is good natural or forced air flow will significantly improve thermal performance.
3. Minimizing the thermal resistance between the LED junction and ambient environment is critical to the success of keeping the junction temperature down. By eliminating or reducing the thermal resistances in the path between the two, it is possible to dramatically improve the performance of the heat management system.
4. The orientation of the LED/heat sink assembly is important in that some positions will enhance natural convection over heat dissipating surfaces and others will retard the flow of air.

Of the guidelines provided above, the design of the thermal path between the LED junction and the surrounding ambient environment is what can be most affected for non-specific product designs. By either eliminating some of the thermal resistance paths or minimizing them, the temperature at the LED junction can be reduced.

The following equation 2 is the result of adding the three grouped thermal resistances together to determine the value of Rja:

$$Rja = Rjs + Rsb + Rba$$

Examples of values of Rjs for some of the more common LEDs currently on the market are shown in the following table:

| Manufacturer | LED Type | Thermal Resistance (C/W) |
|---|---|---|
| Cree | XLamp XR (white, blue green) | 8 |
| Cree | XLamp XR (amber, red) | 15 |
| Osram | Diamond Dragon | 2.5 |
| Osram | Golden Dragon (green) | 11 |
| Lumileds | Rebel | 10 |
| Lumileds | K2 with TFFC | 5.5 |

The second value Rsb in equation 2 is the thermal resistance associated with the electrical substrate technology chosen. Because all high power LEDs have two electrical connections and a thermal connection, the LEDs must be attached to a substrate that provides electrical pats to a power source as well as a "thermal drain" into which heat can be pulled from the device. The two electrical connections being made to the LED are most often made on some form of circuit board material, but because all circuit board materials are made of some form of dielectric, there is a significant thermal resistance added to the thermal path between the LED and the ambient environment.

Testing performed by Osram on a variety of substrate technologies is summarized in Table 2.

| Substrate Technology | Thermal Resistance Rsb (C/Watt) |
|---|---|
| Metal Core PCB with enhanced dielectric | 3.4 |
| Metal Core PCB with FR4 dielectric | 7.3 |
| Flexible Printed Circuit on Al with standard pressure sensitive adhesive | 9.5 |
| Flexible Printed Circuit on Al with thermal enhanced pressure sensitive adhesive | 7.6 |
| FR4- PCB glued on Al with thermal vias | 9.7 |

The third component to the thermal resistance model, Rba, is the resistance between the board (i.e. substrate material) and the ambient environment. In most situations, this is the heat sink that is used to distribute the heat and transfer it to the environment. There are a variety of factors that affect the performance of heat sinks. Some of the factors include:
1. The surface area exposed to the working fluid;
2. The heat transfer coefficient of the surface;
3. The orientation of the exposed surface areas;
4. The thermal conductivity of the transfer surfaces; and
5. The aspect ratio of the product with respect to the heat source.

As stated, some of the materials used for heat sinks are aluminum, zinc, and copper, with aluminum being the most common due to its reasonable cost/weight performance. The thermal resistance of the heat sink, Rba, changes based on the footprint area and how the orientation of the flat heat sink changes these values. For example, a horizontal aluminum heat sink with a thermal resistance of 32 C/Watt would have a footprint of roughly 2200 square mm. This would require a round heat sink with a diameter of 53 mm (2.1 inches).

Using equation 2 to calculate the total thermal resistance of a white Cree XLamp mounted on a Metal Core PCB with FR4 dielectric and a flat heat sink with a diameter of 53 mm, the following total resistance is obtained:

$$Rja = 8\ C/W + 7.3\ C/W + 32\ C/W = 47.3\ C/W$$

Assuming the maximum allowable ambient temperature is 85° C. and the power that must be dissipated is 1 W, will the junction temperature exceed the 145° C. maximum?

$$Tj = Ta + Pd \times Rja$$

Placing values into this equation, the following is obtained:

$$Tj = 85\ C + 1\ W \times 47.3\ C/W = 132.3\ C$$

In this situation, provided as the maximum power to be dissipated is 1 W or less, the maximum temperature at the junction will be less than the 145° C. maximum allowable.

In the 1980's, an industry to selectively plate three-dimensional plastic components was emerging. In the development stages of the industry, there were many techniques used by the various companies to selectively plate their products. Techniques such as hot stamping, pad printing, roller coating, film over-molding, film transfer, two shot molding, and three-dimensional masking were used.

Many of these techniques are complicated and require many steps to produce the end product, resulting in a very expensive and uneconomic process. Some of the other techniques that showed promise to be cost effective, had other limitations with respect to lead times for tooling or limitations on resolution.

Early in the new millennium, another process to image patterns onto three-dimensional interconnects emerged. This process was developed by LPKF Laser in Hanover Germany and was patented under U.S. Pat. No. 6,696,173. This process is unique in that it uses a group of plastics that have been doped with a catalyst that when exposed to a YAG laser beam will allow the plastic to be plated in the areas of exposure. In the past, fine pitch selective plating of single-shot plastics required that the part be molded, electroless-plated, electrophoretic-resist coated, exposed in three-dimensions, resist-developed, electroplated, stripped, and etched. Furthermore, this process could not be used for decorative parts because the entire surface of the product needed to be etched, making the surfaces non-cosmetic.

A second technique to manufacture products that has continued to be viable utilizes a two shot molding process. With this method, a material doped with a palladium catalyst is molded along with a non-doped material in a two shot molding operation. Wherever the doped material is exposed to the surface of the molded product, it will plate after it is etched with the appropriate etchant and then immersed into an electroless plating solution.

Each of these techniques has some advantages and limitations on how they can be used. The laser marking process is ideal when fine pitch patterns are used, when the plated area is relatively small, when changes may need to be made to the patterns, or when some surfaces must be decorative. It has some limitations in that it is a line of sight process. This makes plated through-holes more difficult to manufacture and any plating on surfaces that is not on a line of sight plane requires that the part be moved. Furthermore, the processing time under the laser is an additional cost that the two shot process does not have.

The two shot process has the advantage of being able to produce highly three-dimensional parts, plated through-holes are very simple to produce, and because the plated pattern is produced in the mold, it is a very cost effective technique to make products. The two shot process limitations include higher cost tooling, longer lead-time prototypes, and line/space limitations.

SUMMARY OF THE INVENTION

An interconnect device is used to mate a heat generating device to a power source, Plated components are provided on the interconnect device to provide a heat sink function for the heat generating device when the heat generating device is connected to the interconnect device, and to provide an electrical path between the heat generating device and the power source. A method of manufacturing same is also disclosed.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
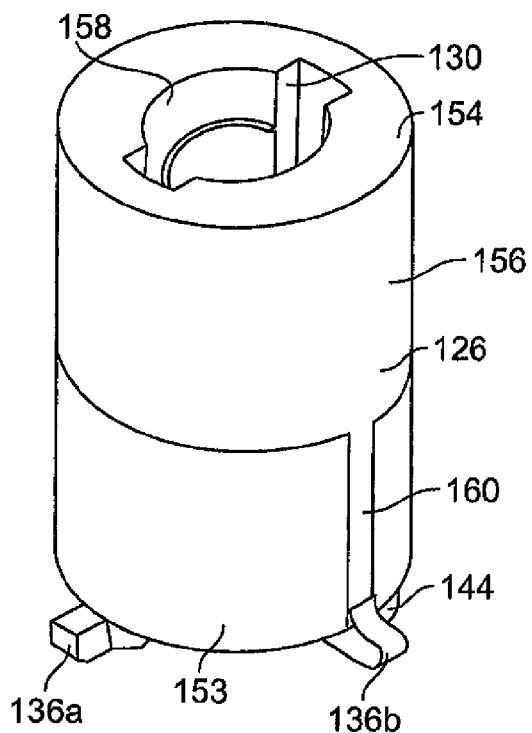
FIG. 1 is a top perspective view of an interconnect device which incorporates the features in accordance with a first embodiment of the present invention.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein. While directional terms, such as upper, lower, vertical, horizontal and the like are used herein, these do not denote a specific desired orientation and instead are used for ease in describing the present invention.

An interconnect device 120, 220, 320, 420, 520, 620, 720, 820 which forms a heat sink for use with a heat generating device, such as an light emitting diode (LED) device 22, 22a, 22b, 22c, 22d, is provided. The interconnect device 120, 220, 320, 420, 520, 620, 720 also provides the electrical path for providing power to the LED device 22, 22a, 22b, 22c from a power source or circuit member 24, such as a printed circuit board or flex circuitry. The interconnect device 820 provides the electrical path for providing power to the LED device 22d from a power source, such as a printed circuit board or flex circuitry. The interconnect device 820 forms a lightbulb.

In one embodiment, the interconnect device 120, 220, 320, 420, 520, 620, 720, 820 is produced by utilizing a two shot molding process. With this process, a material doped with a palladium catalyst is molded along with a non-doped material in a two shot molding operation. Wherever the doped material is exposed to the surface of the molded product, it will plate (i.e. being covered by a thin coat of metal) after it is etched with the appropriate etchant and then immersed into an electroless plating solution. The conductive layer provides a conductive path for the energy to be transferred between the heat generating device and the outside environment. Because the interconnect device 120, 220, 320, 420, 520, 620, 720, 820 is produced in this manner, there is no need for expensive aluminum or copper substrates to be used.

In a first through fifth embodiments of the present invention, the LED device 22, 22a can be easily inserted and removed from the interconnect device 120, 220, 320, 420, 520. In addition, in the first through fifth embodiments of the present invention, when the LED device 22, 22a no longer functions, the LED device 22, 22a is easily replaced by removing it from the interconnect device 120, 220, 320, 420, 520. This significantly reduces costs by eliminating the costly and time consuming reworking of wire bonding or hand soldering the LED device directly to the circuit member. Furthermore, an ease of field service is provided. The LED device 22, 22a can be easily upgraded in the field to change the color, brightness and the like. In the sixth, seventh and eighth embodiments of the present invention, the LED device 22b, 22c, 22d is permanently attached to the interconnect device 620, 720, 820. The interconnect device 620, 720, 820 provides a holder to which a high power/intensity LED device 22b, 22c, 22d can be attached. In the sixth through eighth embodiments, the LED device 22b, 22c, 22d and the interconnect device 620, 720, 820 are removed from the power source and replaced when the LED device 22b, 22c, 22d becomes defective. The present invention eliminates the need to wire bond or hand solder the LED device 22, 22a, 22b, 22c, 22d directly to the power source or circuit member 24 as described herein.

In one embodiment of the process for manufacturing, the interconnect device 120, 220, 320, 420, 520, 620, 720, 820 is made using a two or more shot process that uses two or more kinds of materials. At least one of the materials is plateable so that after plating, a conductive path both for the removal of heat and for creating an electrical connection between the interconnect device 120, 220, 320, 420, 520, 620, 720, 820, power sources, and other devices, such as the LED device 22, 22a, 22b, 22c, 22d is provided. Using this process is cost effective because it results in a reduction in assembly steps versus the prior art, the interconnect device 120, 220, 320, 420, 520, 620, 720, 820 is lighter in weight than using solid metal for the construction, and the need for costly stamping dies and assembly equipment is eliminated.

The use of the interconnect device 120, 220, 320, 420, 520, 620, 720, 820 to house the LED device 22, 22a, 22b, 22c, 22d allows for the incorporation of the LED device 22, 22a, 22b, 22c, 22d within more complex sub-assemblies. Because the interconnect device 120, 220, 320, 420, 520, 620, 720, 820 is formed using two or more shots, great flexibility is provided in placement of the plating. As a result, there is great flexibility in routing of the circuitry through the interconnect device 120, 220, 320, 420, 520, 620, 720, 820. In addition, because the interconnect device 120, 220, 320, 420, 520, 620, 720, 820 can take a variety of three-dimensional shapes, the LED device 22, 22a, 22b, 22c, 22d can be packaged in a three-dimensional assembly which allows for reduction in the size, weight and assembly labor. This results in a lower cost. Because the interconnect device 120, 220, 320, 420, 520, 620, 720, 820 provides a packaging solution in three-dimensions, an effective means for miniaturization strategies is provided.

The first embodiment of the interconnect device 120 which incorporates the features of the present invention is shown in FIGS. 1-8. This interconnect device 120 provides a socket into which the heat generating device, such as LED device 22, is screwed for seating. The second embodiment of the interconnect device 220 which incorporates the features of the present invention is shown in FIGS. 9-13. This interconnect device 220 provides a socket into which an LED device 22a is slid into for seating. The third embodiment of the interconnect device 320 which incorporates the features of the present invention is shown in FIGS. 14-18; the fourth embodiment of the interconnect device 420 which incorporates the features of the present invention is shown in FIGS. 19-23. In the third and fourth embodiments, the interconnect device 320, 420 has a socket into which an LED device 22a is placed for seating. The fifth embodiment of the interconnect device 520 which incorporates the features of the present invention is shown in FIGS. 24-29. In the fifth embodiment, the LED device 22a is seated on the interconnect device 520 and a cover snapped over the LED device 22a. The sixth embodiment of the interconnect device 620 which incorporates the features of the present invention is shown in FIGS. 31-35, and the seventh embodiment of the interconnect device 720 which incorporates the features of the present invention is shown in FIGS. 36-41. The eighth embodiment of the interconnect device 820 which incorporates the features of the present invention is shown in FIGS. 45-59. The eighth embodiment of interconnect device 820 provides a lightbulb. In the sixth, seventh and eighth embodiments, the LED device 22b, 22c, 22d is permanently seated on the interconnect device 620, 720, 820.

Figure 2:
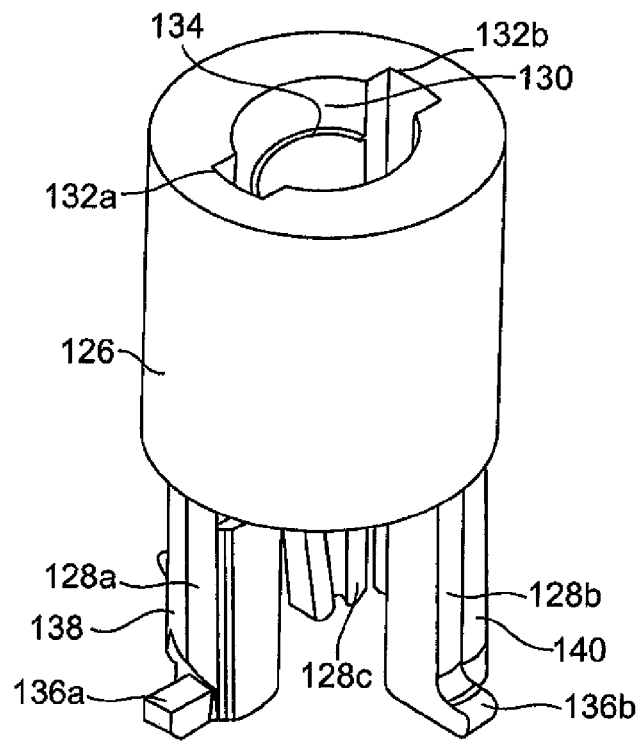
FIG. 2 is a top perspective view of a first shot of the interconnect device of FIG. 1.
Figure 3:
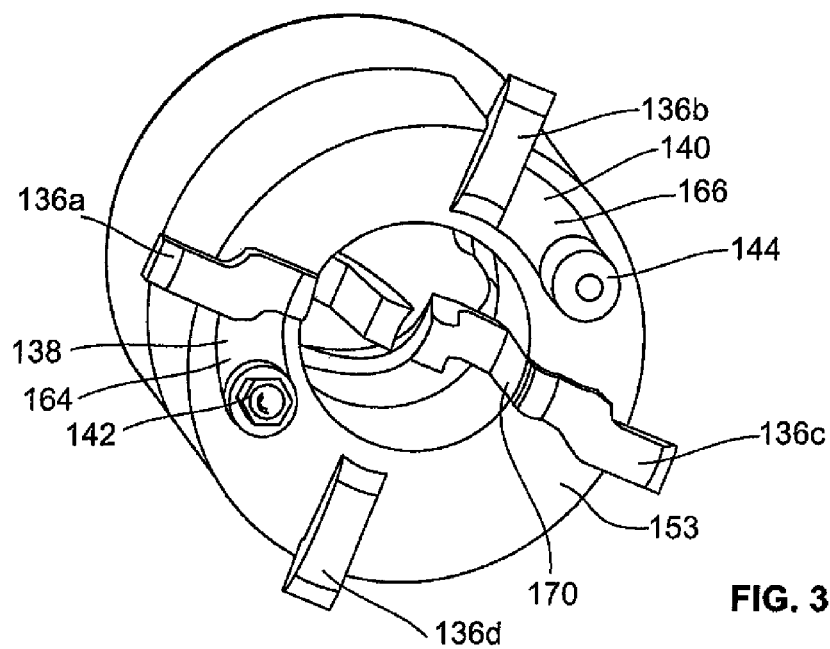
FIG. 3 is a bottom perspective view of the interconnect device of FIG. 1.
Figure 4:
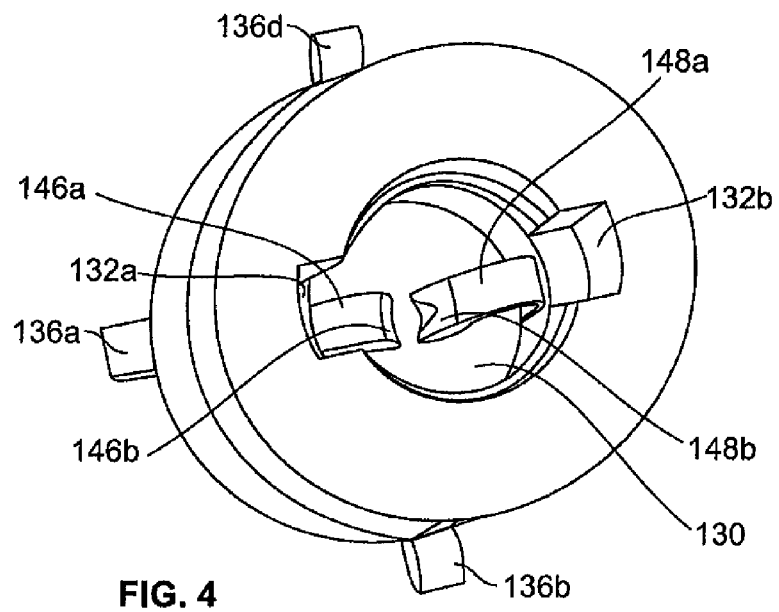
FIG. 4 is a top perspective view of the interconnect device of FIG. 1.
Figure 5:
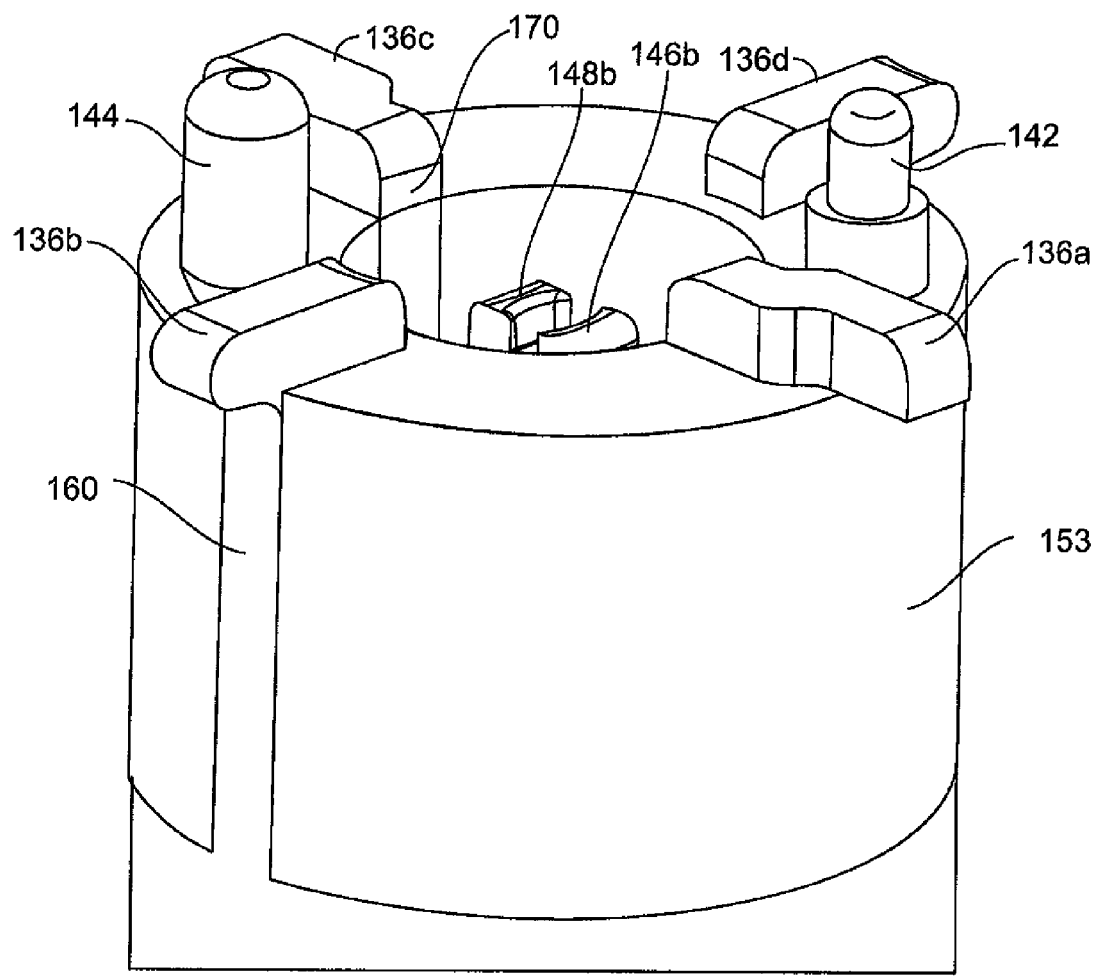
FIG. 5 is an enlarged bottom perspective view of the interconnect device of FIG. 1.
Figure 6:
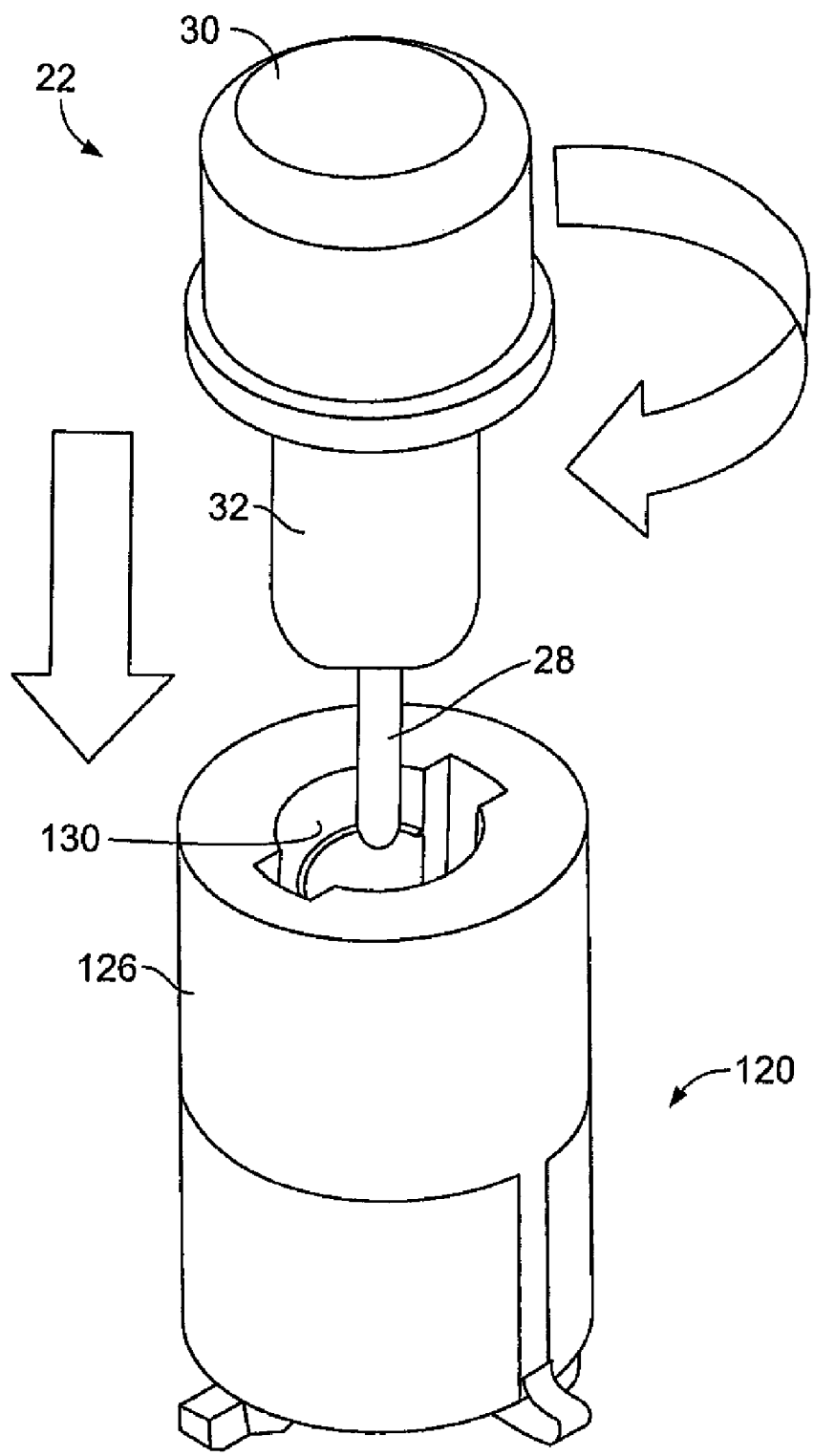
FIG. 6 is a top perspective view of the interconnect device of FIG. 1, and having an LED device exploded therefrom.
Figure 7:
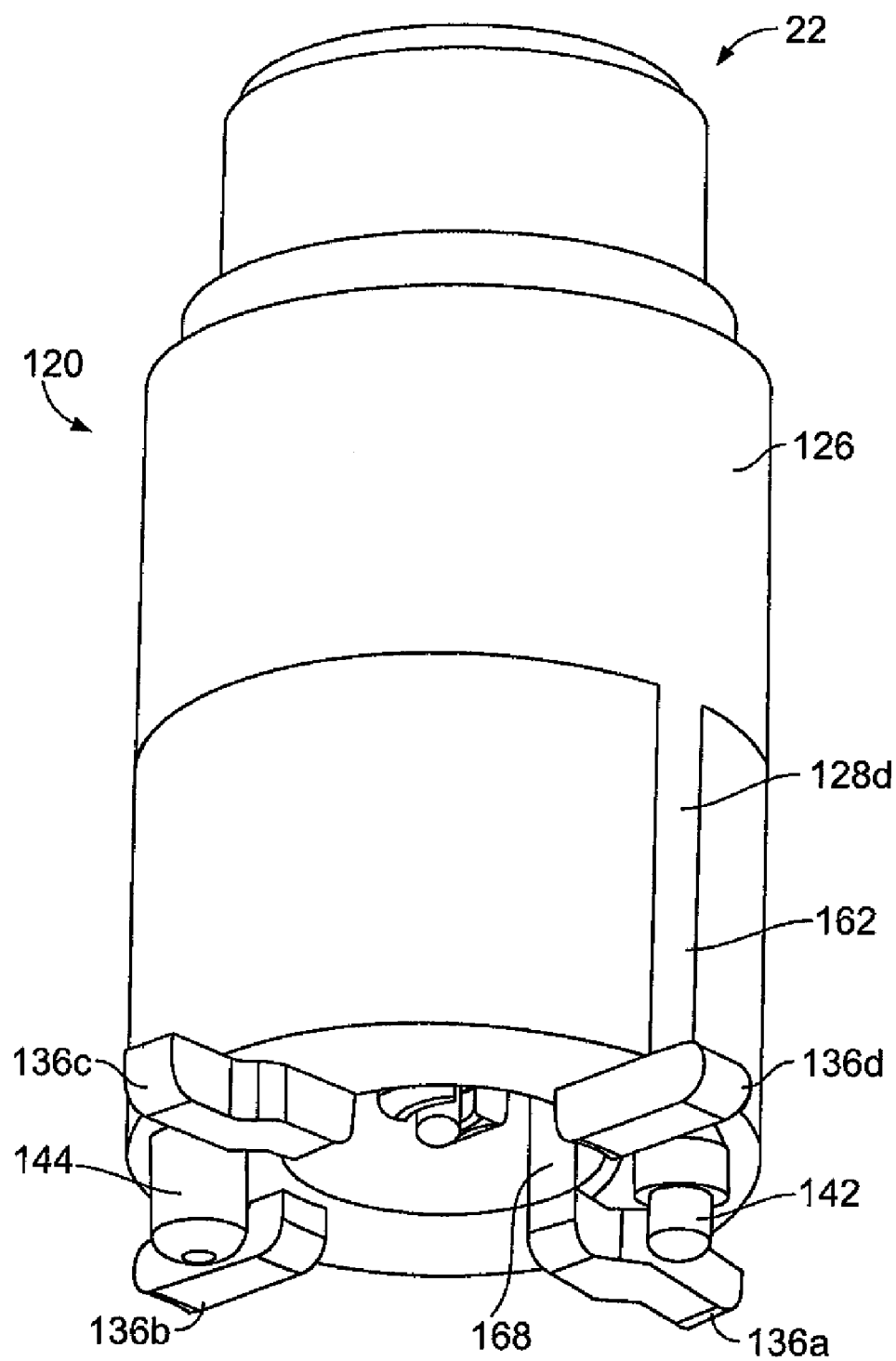
FIG. 7 is a top perspective view of the interconnect device of FIG. 1 showing the LED device attached thereto.

Attention is invited to the first embodiment of the interconnect device 120 which is shown in FIGS. 1-8. As shown in FIG. 2, the first shot creates a base member which includes a base 126 having a plurality of legs 128a, 128b, 128c, 128d extending from a lower end thereof. The first shot is formed of a plateable thermoplastic material that can be metalized because of a palladium catalyst added to the plastic. The base 126 is generally cylindrical and has a cylindrical central passageway 130 extending from an upper end to the lower end therethrough. The upper end of the passageway 130 has diametrically opposed recesses 132a, 132b which radiate outwardly from the passageway 130. A thread form 134 is provided in the passageway 130 so that the LED device 22 can be mated with the base 126.

Each leg 128a, 128b, 128c, 128d is generally vertical and extends downwardly from the base 126. A generally horizontal foot 136a, 136b, 136c, 136d extends perpendicularly from the respective leg 128a, 128b, 128c, 128d. As shown, four legs 128a, 128b, 128c, 128d extend from and are equi-distantly spaced around the base 126.

A polarization portion 138 extends from, and is connected to, leg 128a; and a polarization portion 140 extends from, and is connected to, leg 128b; legs 128a and 128b being adjacent to each other. Polarization portion 138 extends downwardly from the base 126 and extends from leg 128a toward leg 128d. A peg 142 extends downwardly from the free end of the polarization portion 138. Polarization portion 140 extends downwardly from the base 136 and extends from leg 138b toward leg 128c. A peg 144 extends downwardly from the free end of the polarization portion 140. The pegs 142, 144 extend downwardly past the bottom end of the feet 136a, 136b. The pegs 142, 144 do not need to be identical in shape and, as shown, differ in size and configuration.

Legs 128a and 128c, which are opposite to each other, have an inwardly extending spring beam 146, 148. Each spring beam 146, 148 has a first portion 146a, 148a which extends inwardly from an upper end of the respective leg 128a, 128c toward each other. Each spring beam 146, 148 further has a second portion 146b, 148b which extends downwardly from the inner end of the respective first portion 146a, 148a. As a result, a space 150 is provided between the ends of the second portions 146b, 148b. The ends of the second portions 146a, 148b proximate to the space 150 may be curved for accepting a cylindrical anode 28 of the LED device 22 as discussed herein.

After the base member is created by the first shot, the second shot 153 is overmolded onto the base member. The second shot 153 is formed of a non-plateable thermoplastic which acts as an insulator. After the second shot 153 is completed, the only remaining surfaces of the first shot that are still exposed are surfaces that provide a heat sink portion of the interconnect device 120, and surfaces that provide the desired electrical paths. Specifically, the only remaining exposed surfaces are 1) the top surface 154, outer surface 156 and inner surface 158 of the base 126, 2) the outer surfaces 160 and 162 of legs 128b and 128d, 3) all surfaces of feet 136a, 136b, 136c, 136d, 4) the bottom surface 164, 166 and peg 142, 144 of each polarization portion 138, 140, 5) the inner surfaces 168, 170 of legs 128a, 128c, and 6) the spring beams 146, 148.

Thereafter, the exposed portions are etched and only the exposed portions of the first shot are metal plated. Preferably, the exposed and etched portions of the first shot are plated with a conductive copper layer and then metalized with a copper, nickel, palladium and/or gold finish.

As a result, an anode of the interconnect device 120 is formed by peg 142, lower surface 164 of polarization portion 138, foot 136a, inner surface 168 of leg 128a and spring beam 146, and foot 136c, inner surface 170 of leg 128c and spring beam 148. A cathode is formed by peg 144, lower surface 166 of polarization portion 140, foot 136b, outer surface 160 of leg 128b, foot 136d, outer surface 162 of leg 128d and the base 126. The anode and the cathode are electrically isolated from each other by the insulative second shot 153. A heat sink is provided by way of the top surface 154, outer surface 156 and inner surface 158 of the base 126. In this first embodiment, the cathode and the heat sink are electrically connected and the cathode provides a heat sink function. The anode and the cathode provide for an electrical path between the circuit member and the LED device 22. As a result, the heat sink function and the electrical path function are provided by the interconnect device 120. The anode, cathode and heat sink are simultaneously formed when the exposed portions of the first shot are metal plated.

The polarization portions 138, 140 and the associated pegs 142, 144 align the feet 136a, 136b, 136c, 136d. The feet 136a, 136b, 136c, 136d are surface mount soldered to the power source, such as the circuit member.

The LED device 22 has an upper portion 30 in which at least one LED is provided. The upper portion 30 includes a lens cover over the at least one LED. A cathode 32 extends downwardly from the upper portion 30 and has a thread form on its exterior. The anode 28 is electrically isolated from the cathode 32 and extends downwardly therefrom.

To mate the LED device 22 with the interconnect device 120, the cathode 32 of the LED device 22 is screwed into the passageway 130 in the base 126 and connects with the cathode of the interconnect device 120. The anode 28 of the LED device 22 seats within the space 150 between the spring beams 146, 148. The spring beams 146, 148 can flex to accommodate the anode 28. The bottom of the LED device 22 sits against the top surface 154 of the base 126.

Figure 8:
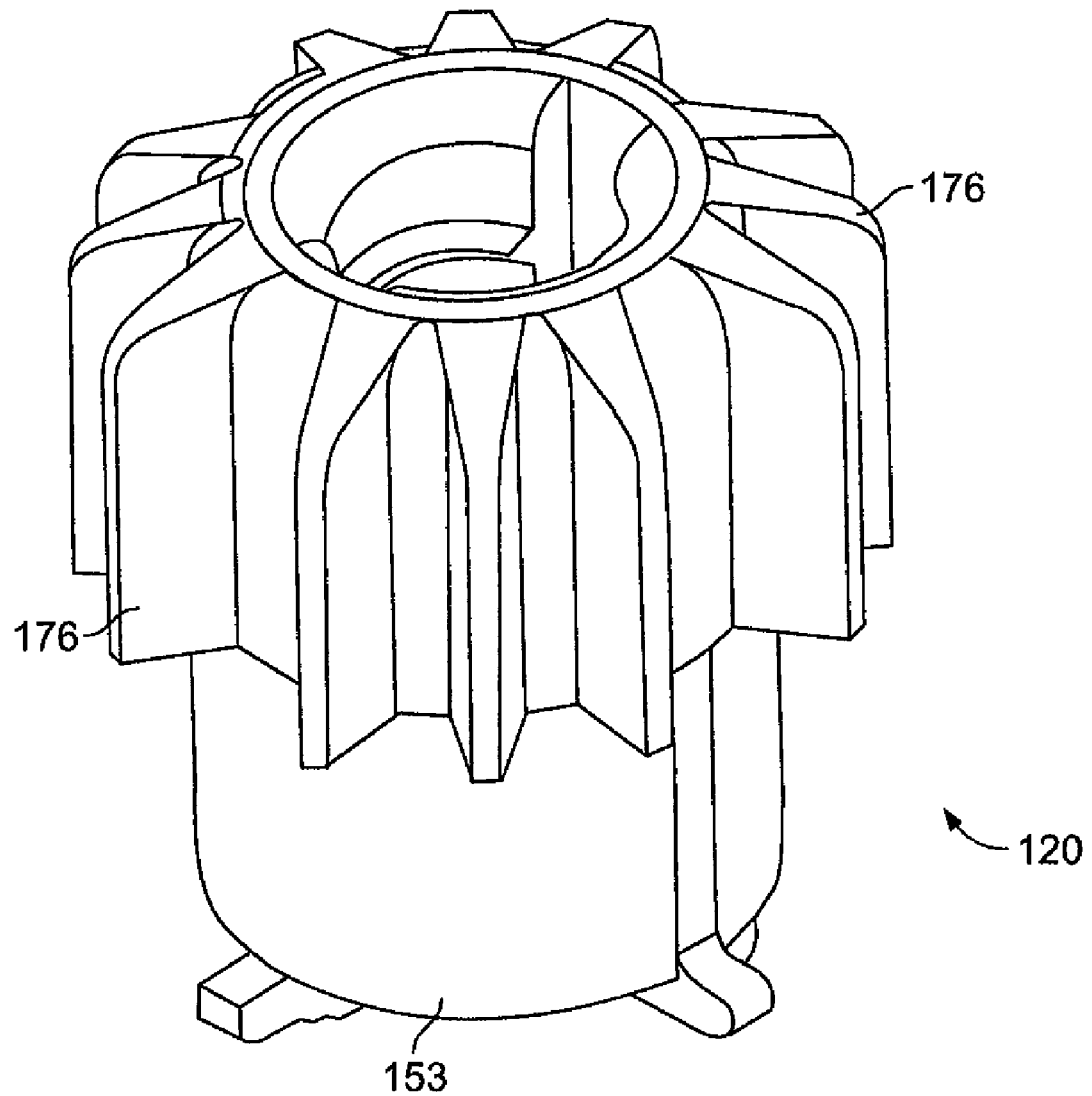
FIG. 8 is a top perspective view of the interconnect device of FIG. 1, having heat sink fins provided thereon.
Figure 9:
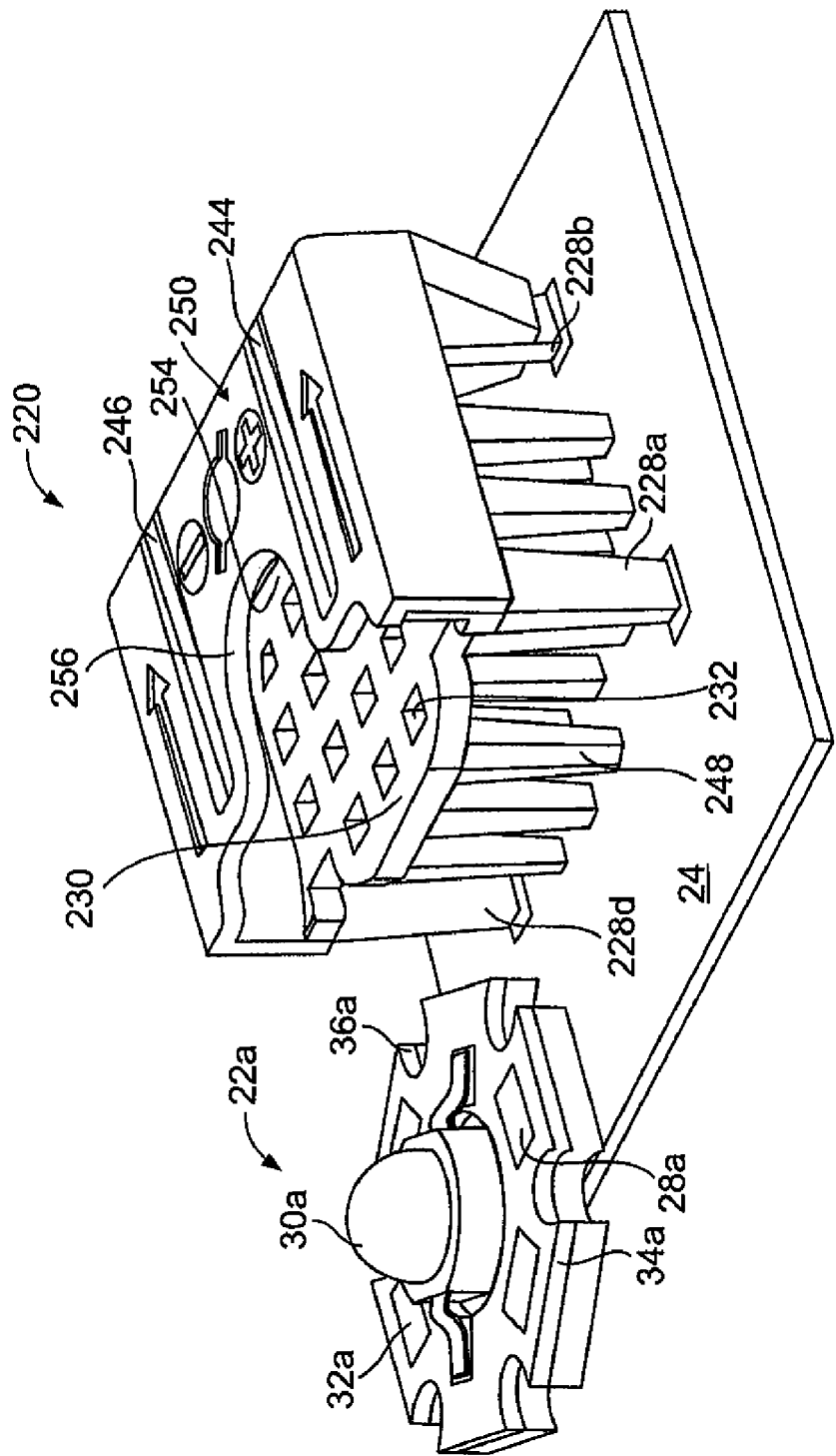
FIG. 9 is a top perspective view of an interconnect device which incorporates the features in accordance with a second embodiment of the present invention, which is seated on a circuit member, and having an LED device exploded therefrom.
Figure 10:
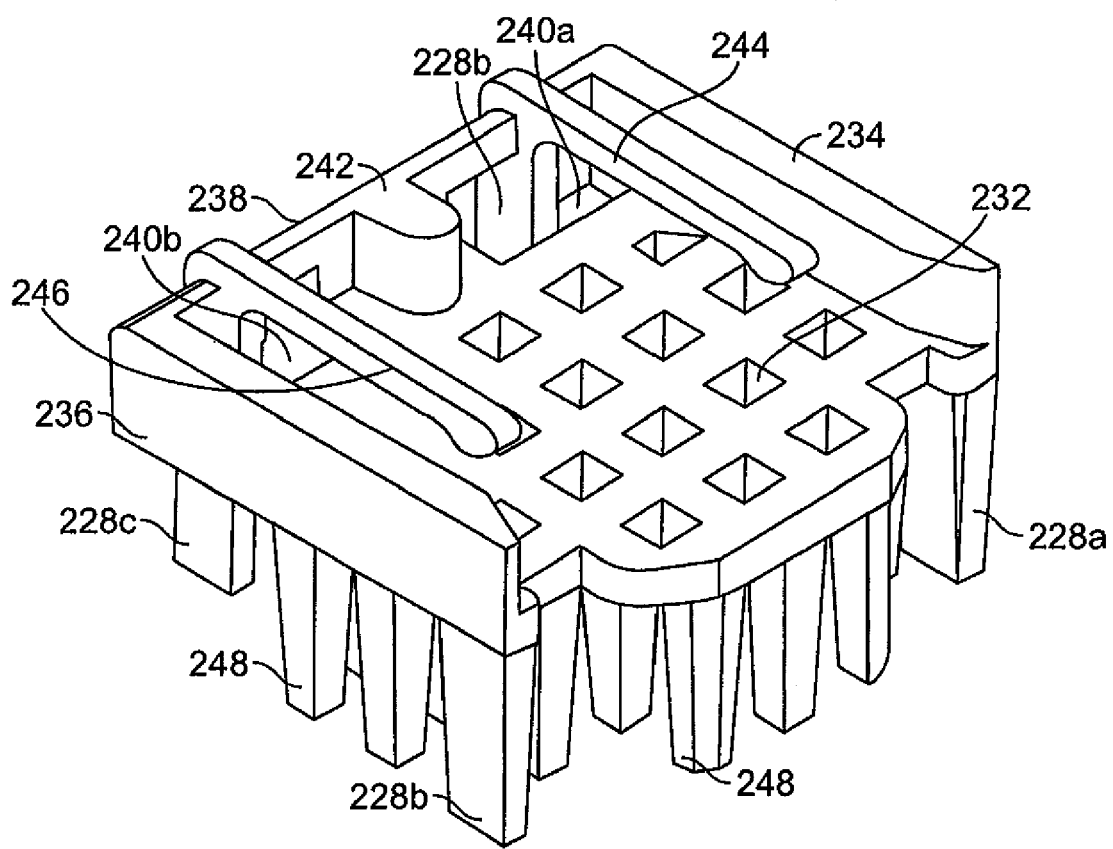
FIGS. 10 and 11 are top perspective views of a first shot of the interconnect device of FIG. 9.
Figure 11:
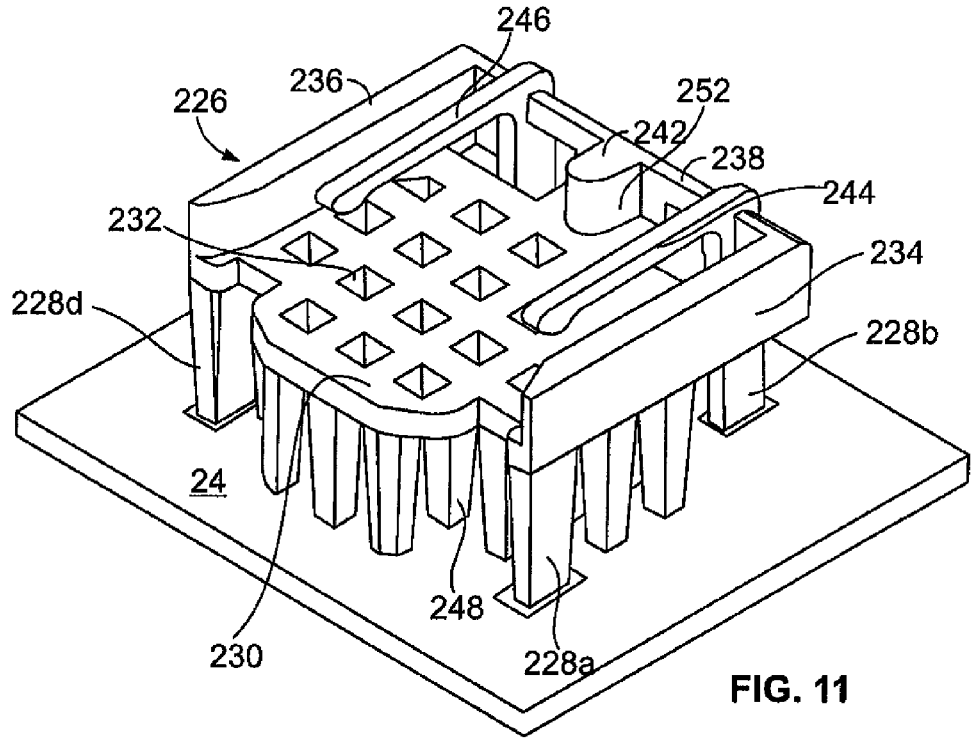
Figure 12:
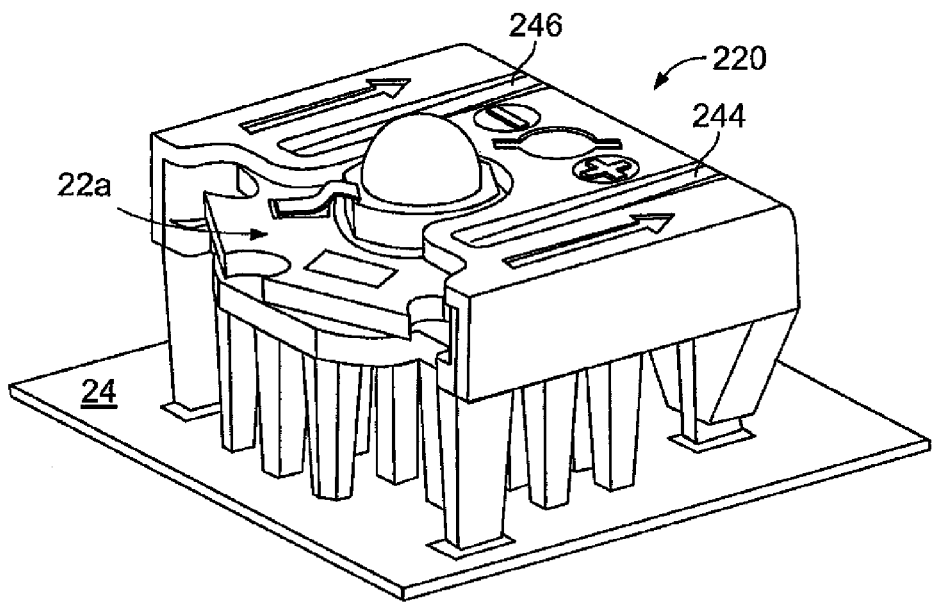
FIG. 12 is a top perspective view of the interconnect device of FIG. 9, and having the LED device attached thereto.
Figure 13:
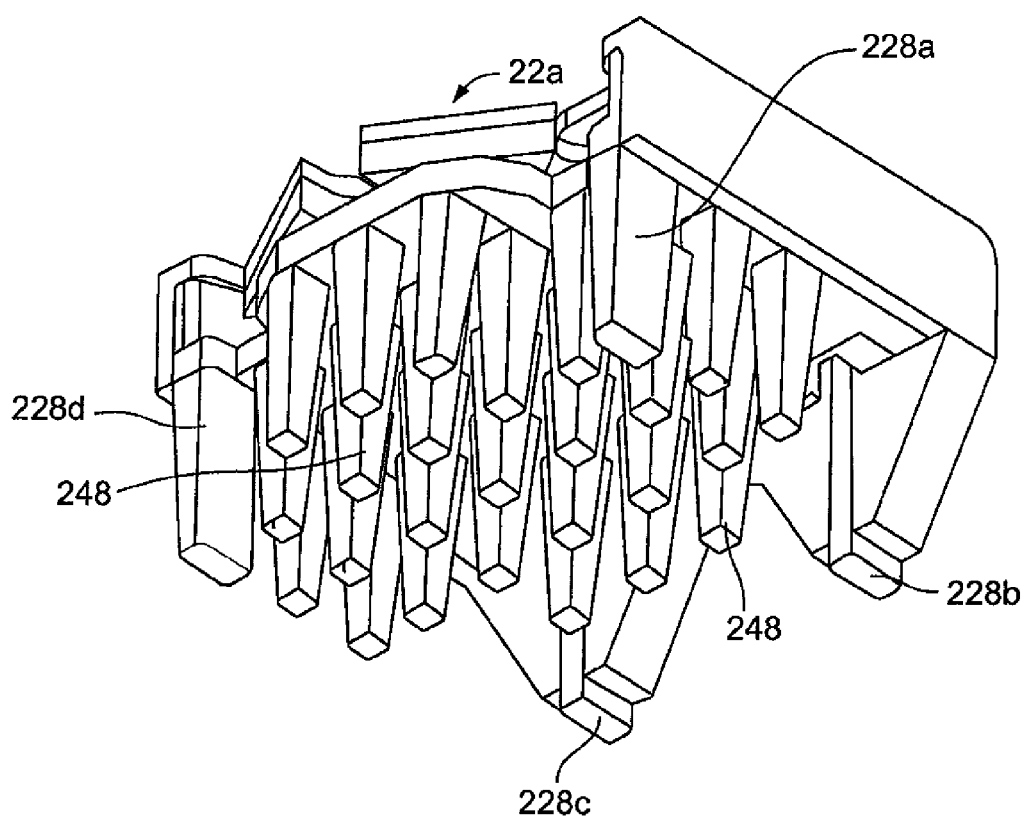
FIG. 13 is a bottom perspective view of the interconnect device of FIG. 9, and having the LED device attached thereto.
Figure 14:
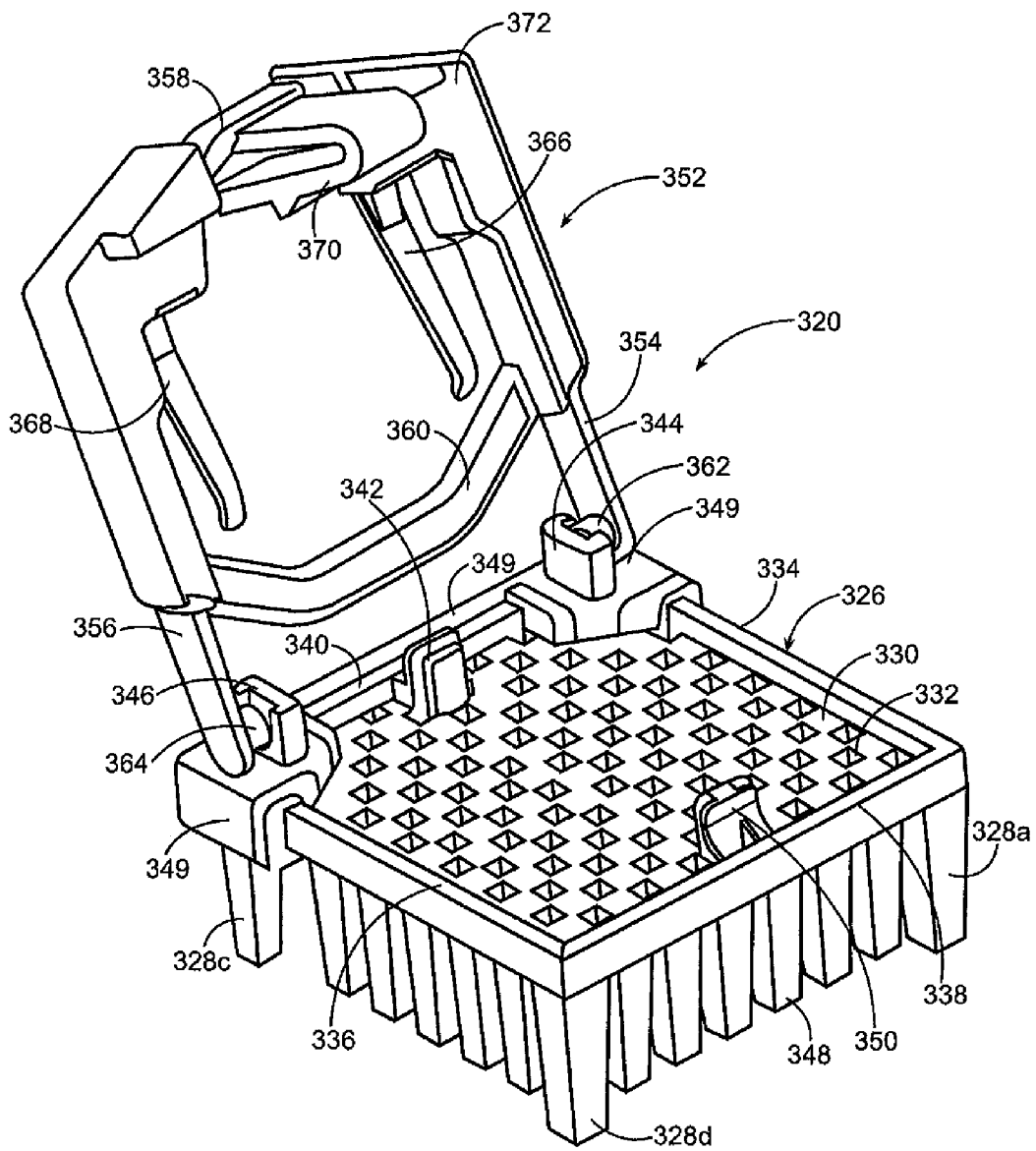
FIG. 14 is a top perspective view of an interconnect device which incorporates the features in accordance with a third embodiment of the present invention, showing the interconnect device in an open position which is ready for acceptance of an LED device therein.
Figure 15:
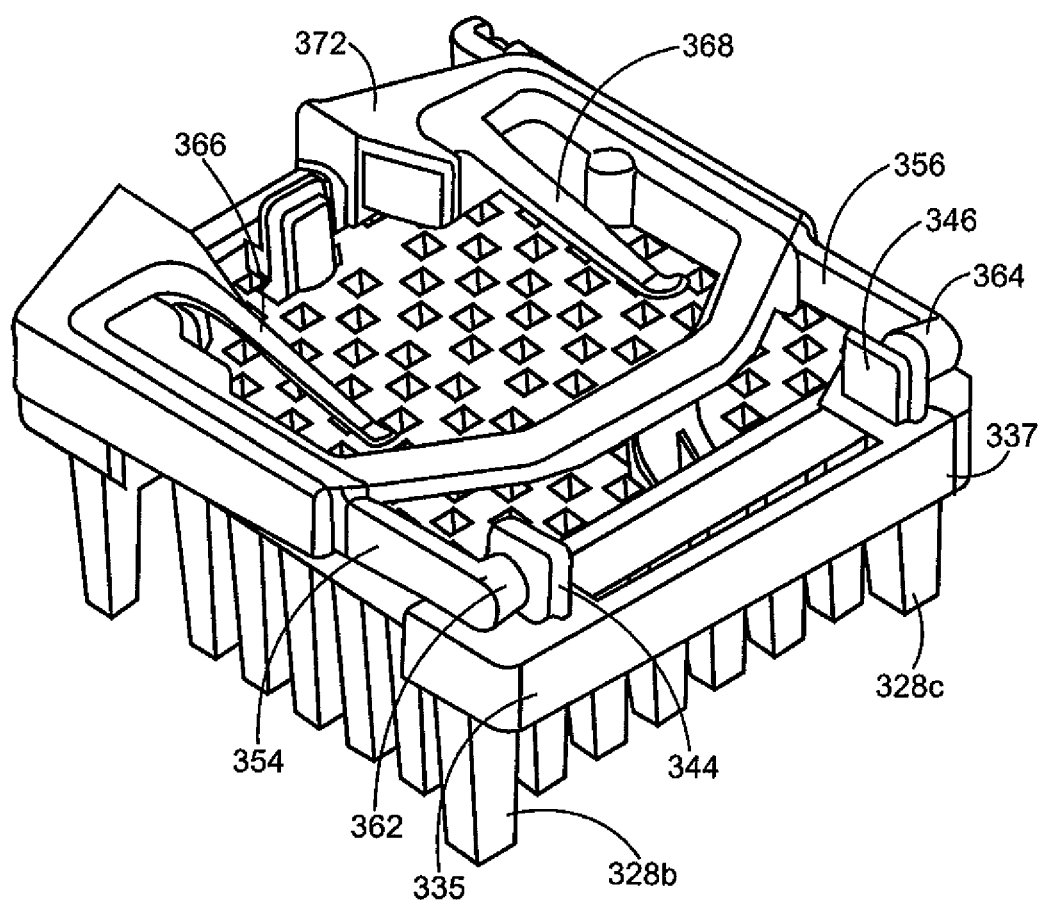
FIG. 15 is a top perspective view of the interconnect device of FIG. 14 in a closed position.
Figure 16:
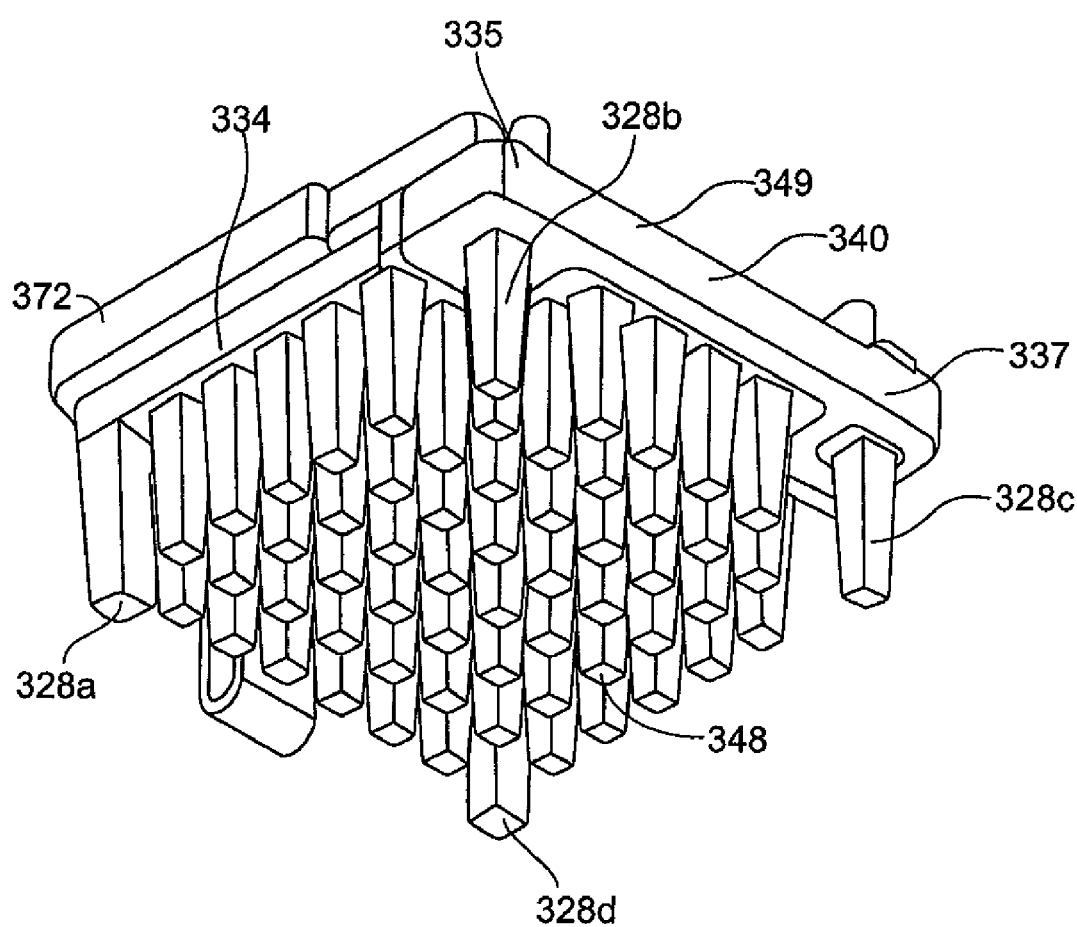
FIG. 16 is a bottom perspective view of the interconnect device of FIG. 9.
Figure 17:
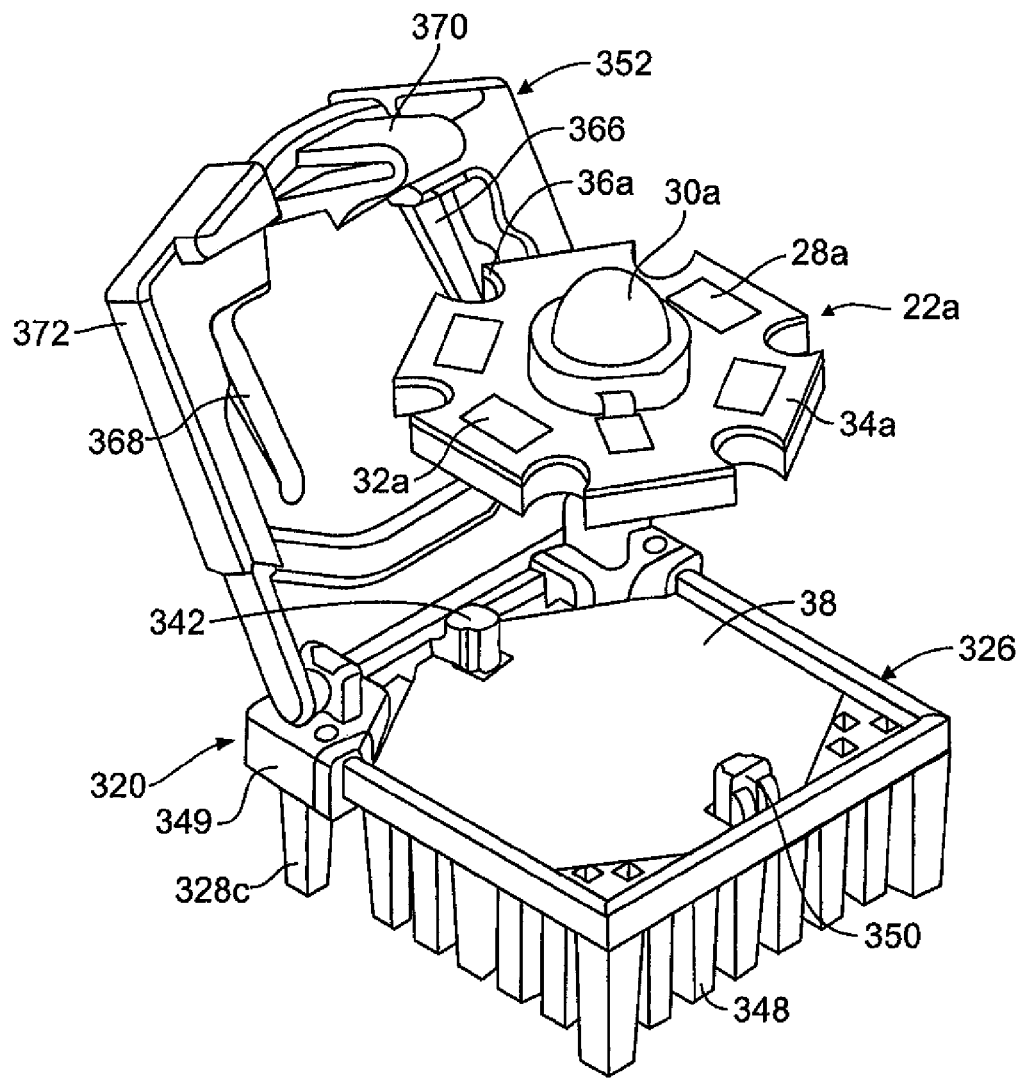
FIG. 17 is a top perspective view of the interconnect device of FIG. 9 in the open position, a heat spreader provided on the interconnect device and an LED device exploded therefrom.
Figure 18:
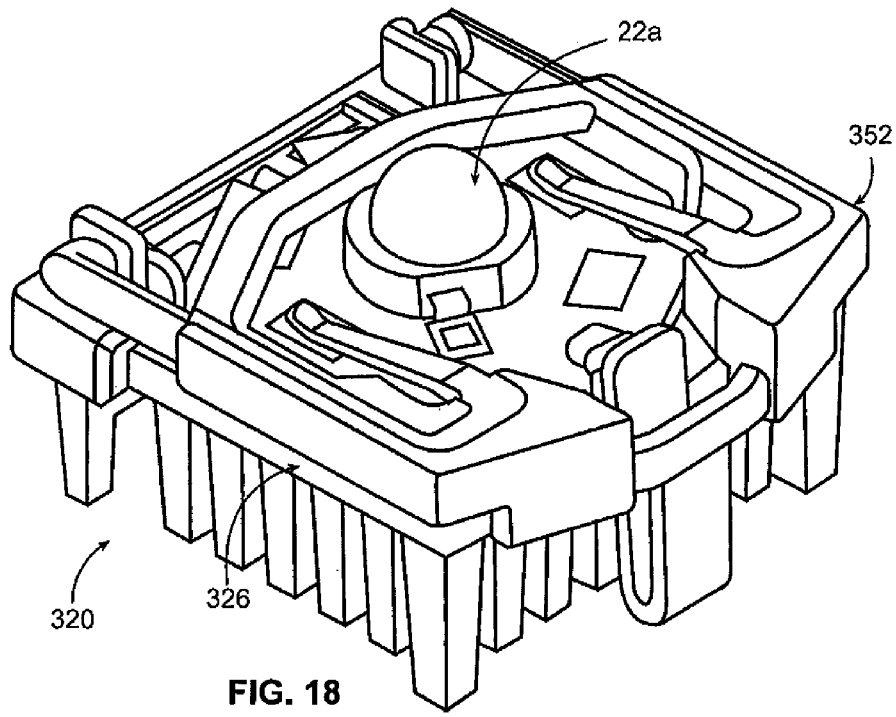
FIG. 18 is a top perspective view of the interconnect device of FIG. 9 in the closed position, with the heat spreader and LED device mounted therein.
Figure 19:
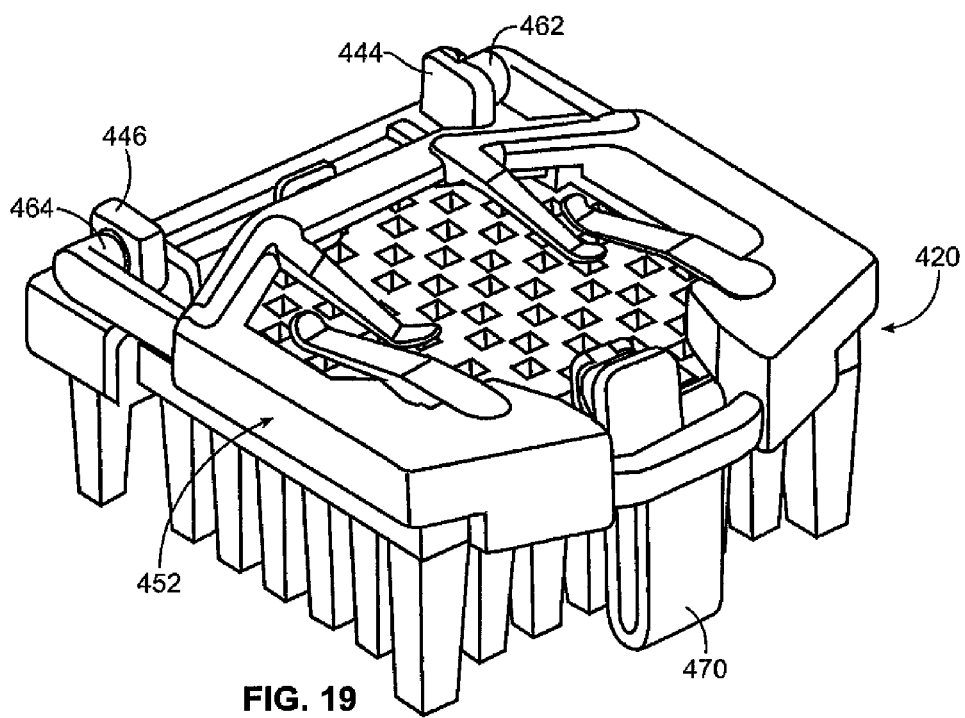
FIG. 19 is a top perspective view of an interconnect device which incorporates the features in accordance with a fourth embodiment of the present invention.

During operation of the LED device 22, the LED device 22 generates heat which is transferred to the base 126 of the interconnect device 120, and this heat must be removed. Because of the plating, the heat sink function is directly integrated into the interconnect device 120. As air is circulated around the base 126 of the interconnect device 120 by known means, the heat is removed. If desired, as shown in FIG. 8, fins 176 may be added to the exterior of the base 126 to provide additional surface area for heat dissipation.

Attention is now invited to the second embodiment of the interconnect device 220 which incorporates the features of the present invention which is shown in FIGS. 9-13.

The first shot creates a base member which includes a base 226 having a plurality of legs 228a, 228b, 228c, 228d extending from a lower end at the corners thereof. The first shot is formed of a plateable thermoplastic material which can be metalized because of a palladium catalyst added to the plastic. Each leg 228a, 228b, 228c, 228d terminates in a foot. If desired, a generally horizontal foot such as that shown in the first embodiment can be provided at the lower end of each leg 228a, 228b, 228c, 228d.

The base 226 includes a planar portion 230 which has a plurality of vias 232 provided therethrough. As shown, the vias 232 are provided in rows and columns, however, this is not a required configuration. Each leg 228a, 228b, 228c, 228d is generally vertical. Two of the legs 228a, 228d extend downwardly from the front two corners of the planar portion 230. A first side wall 234 extends upwardly from the planar portion 230 along one edge thereof; and a second side wall 236 extends upwardly from the planar portion 230 along an opposite edge thereof. The side walls 234, 236 extend rearwardly from the planar portion 230 a predetermined distance and are connected at their rear ends by a bridge wall 238. The bridge wall 238 is connected at its midpoint to a rear end of the planar portion 230. The remainder of the bridge wall 238 does not contact the planar portion 230 such that a pair of spaces 240a, 240b are formed between the bridge wall 238 and the planar portion 230. Legs 228b, 228c extend downwardly from the bridge wall 238 at spaced apart locations. A locating protrusion 242 extends forwardly from the bridge wall 238 and extends upwardly from the rear end of the planar portion 230.

A pair of spring beams 244, 246 are connected to, and may be integrally formed with, the bridge wall 238. The spring beams 244, 246 extend forwardly from the bridge wall 238 toward the front end of the planar portion 230. As shown, the spring beams 244, 246 align with the respective legs 228b, 228c for ease of molding, however, the spring beams 244, 246 do not need to align with the respective legs 228b, 228c. A space is provided between the spring beams 244, 246 and the planar portion 230 into which the LED device 22a can be inserted as described herein.

A plurality of spaced apart fins 248 extend downwardly from the bottom end of the planar portion 230 in the same direction as the legs 228a, 228b, 228c, 228b. The fins 248 are provided in rows and columns, however, this is not a required configuration. The fins 248 are offset from the vias 232 such that the fins 248 do not obstruct the vias 232 through the planar portion 230.

After formation of the base member by the first shot, the second shot, which forms a cover 250, is overmolded onto the base member. The second shot is formed of a non-plateable thermoplastic which acts as an insulator. After the second shot is completed, the only remaining surfaces of the first shot that are still exposed are surfaces that provide a heat sink portion of the interconnect device 220, and surfaces that provide the desired electrical paths. Specifically, the only remaining exposed surfaces are 1) the planar portion 230 with the exception of the rear edge thereof, 2) the fins 248, 3) legs 228a, 228d, 4) the side surface 252 of the locating protrusion 242, 5) the surfaces of legs 228b, 228c, with the exception of a portion of the side surfaces of the legs, and 6) the spring beams 244, 246. A space 254 is provided between the cover 250 and the planar portion 230 into which the LED device 22a is received. A curved recess 256 is provided in the cover 250 between the spring beams 244, 246 to accommodate the LED device 22a as discussed herein. The spring beams 244, 246 are not connected to the cover 250.

Thereafter, the exposed portions of the first shot are etched and only the exposed portions of the first shot are metal plated. Preferably, the exposed portions of the first shot are plated with a conductive copper layer and then metalized with a copper, nickel, palladium and/or gold finish.

As a result, a heat sink is provided by way of the planar portion 230 of the base 226 and the fins 248. An anode is formed by leg 228b and spring beam 244, and the cathode is formed by leg 228c and spring beam 246. The anode and the cathode are electrically isolated from each other by the insulative second shot, and the heat sink is electrically isolated from the anode and cathode. This provides for an electrical path between the circuit member 24 and the LED device 22a. The anode, cathode and heat sink are simultaneously formed when the exposed portions of the first shot are metal plated.

In use, the feet at the ends of the legs 228a, 228b, 228c, 228d are surface mount soldered to a power source, such as a circuit member 24. If desired, all of the fins 248 can be surface mount soldered to the circuit member 24. The legs 228a, 228b, 228c, 228d provide mechanical strength to the circuit member 24 to which the interconnect device 220 because the interconnect device 220 is soldered to the circuit member 24.

The LED device 22a has an upper portion 30a in which at least one LED is provided. The upper portion 30a includes a lens cover over the at least one LED. An anode 28a and a cathode 32a are provided on an insulative substrate 34a onto which the upper portion 30a is mounted. The anode 28a and cathode 32a are electrically isolated from each other by the insulative substrate 34a.

To mate the LED device 22a with the interconnect device 220, the substrate 34a is slid into the interconnect device 220 into the space 254 between the planar portion 230 and the cover 250. The anode 28a of the LED device 22a mates with the spring beam 244, and the cathode 32a of the LED device 22a mates with the spring beam 246. The spring beams 244, 246 flex relative to the LED device 22a during insertion of the LED device 22a into the interconnect device 220. The spring beams 244, 246 also serve to secure the LED device 22a in the interconnect device 220 by the clamping action created by the spring beams 244, 246. The locating protrusion 242 projects into a keyway 36a formed on the substrate 34a to ensure correct orientation of the LED device 22a within the interconnect device 220.

During operation of the LED device 22a, the LED device 22a generates heat which is transferred to the interconnect device 220, and this heat must be removed. Because of the plating, the heat sink function is directly integrated into the interconnect device 220. As air is circulated around the base 226 of the interconnect device 220 by known means, the heat is removed. The fins 248 are not required, but serve to provide additional surface area for heat dissipation. The vias 232 serve to transmit heat toward the fins 248.

If desired, a thermal pad, which acts as a heat spreader, (identified as 38 in FIG. 17) can be provided between the LED device 22a and the planar portion 230. The thermal pad 38 is a flat metal plate that serves to spread the heat over the planar portion 230.

Attention is invited to the third embodiment of the interconnect device 320 which incorporates the features of the present invention which is shown in FIGS. 14-18.

The first shot creates a base member which includes a base 326 having a plurality of legs 328a, 328b, 328c, 328d extending from a lower end at the corners thereof. The first shot is formed of a plateable thermoplastic material which can be metalized because of a palladium catalyst added to the plastic. Each leg 328a, 328b, 328c, 328d terminates in a foot. If desired, a generally horizontal foot such as that shown in the first embodiment can be provided at the lower end of each leg 328a, 328b, 328c, 328d.

The base 326 includes a planar portion 330 which has a plurality of vias 332 provided therethrough. As shown, the vias 332 are provided in rows and columns, however, this is not a required configuration. A first side wall 334 extends upwardly from the planar portion 330 along one edge thereof, a second side wall 336 extends upwardly from the planar portion 330 along an opposite edge thereof, a front wall 338 extends upwardly from the planar portion 330 along a front edge thereof, and a rear wall 340 extends upwardly from the planar portion 330 along the rear edge thereof.

A locating protrusion 342 extends forwardly from the rear wall 340 and extends upwardly from the rear end of the planar portion 330 at the midpoint of the rear end thereof. A pair of fingers 344, 346 are provided at the rear corners of the planar portion 330 and extend upwardly therefrom. An aperture (not shown) is provided in each finger 344, 346. A locking mechanism 350, which may take the form of a detent, is formed at the front of the planar portion 330 at the midpoint thereof.

A plurality of spaced apart fins 348 extend downwardly from the lower end of the planar portion 330 in the same direction as the legs 328a, 328b, 328c, 328b. The fins 348 are provided in rows and columns, however, this is not a required configuration. The fins 348 are offset from the vias 332, such that the fins 348 do not obstruct the vias 332 through the planar portion 330.

After the base member is created by the first shot, a second shot 349 is overmolded onto the base member. The second shot 349 is formed of a non-plateable thermoplastic which acts as an insulator. After the second shot 349 is completed, the only remaining surfaces of the first shot that are still exposed are surfaces that provide a heat sink portion of the interconnect device 320, and surfaces that provide the desired electrical paths. Specifically, the second shot 349 covers rear portions of the side walls 334, 336, and the rear wall 340 with the exception of respective portions 335, 337 thereof which are between the fingers 344, 346 and the legs 328b, 328c. In addition, the bottom surface of the planar portion 330 which is proximate to the legs 328b, 328c are overmolded with the second shot 349 with the exception of the portions thereof which are between the fingers 344, 346 and the legs 328b, 328c.

Thereafter, the exposed portions of the first shot are etched and only the exposed portions of the first shot are metal plated. Preferably, the exposed portions of the first shot are plated with a conductive copper layer and then metalized with a copper, nickel, palladium and/or gold finish.

In this embodiment, a separate component, cover 352, is also formed with two shot molding. The first shot creates a base member for cover 352, which is hingedly attached to the fingers 344, 346. The first shot is formed of a plateable thermoplastic material which can be metalized because of a palladium catalyst added to the plastic. The cover 352 includes a first side wall 354 and second side wall 356 which are connected at their front ends by a front bridge wall 358 and connected proximate to their rear ends by a rear bridge wall 360. A finger 362, 364, each of which has a pin (not shown) extending perpendicularly therefrom, is provided at the rear end of each side wall 354, 356. The fingers 362, 364 are generally perpendicular relative to the side walls 354, 356. A pair of spring beams 366, 368 extend rearwardly from the front bridge wall 358 toward the rear bridge wall 360. A locking mechanism 370, which takes the form of a finger having a detent thereof, extends downwardly from the front bridge wall 358 at the midpoint thereof.

After this base member which is used to form the cover 352 is created by the first shot, the second shot 372 is overmolded onto the base member. The second shot 372 is formed of a non-plateable thermoplastic which acts as an insulator. After the second shot 372 is completed, the only remaining surfaces of the first shot that are still exposed are 1) the fingers 362, 364, 2) a rear portion of each side wall 354, 356 and the top surfaces of the entire side walls 354, 356, 3) upper surface portions of the front bridge wall 358 between spring beams 366, 368 and the side walls 354, 356, 4) the spring beams 366, 368, 5) the locking mechanism 370 and the portion of the front bridge wall 358 proximate to the locking mechanism 370.

Thereafter, this first shot is etched and metal plated. Preferably, the exposed portions of the first shot are plated with a conductive copper layer and then metalized with a copper, nickel, palladium and/or gold finish.

To attach the cover 352 to the base 326, the fingers 362, 364 of the cover 352 are attached to the fingers 344, 346 of the base 326 via the pins which are inserted into the apertures. A space is provided between the cover 352 and the base 326 into which the LED device 22a is received as discussed herein.

As a result, a heat sink is provided by way of the planar portion 330 of the base 326 and the fins 348. An anode is formed by leg 328b, portion 335, interconnected fingers 344, 362, side wall 354, the upper surface portion of the front bridge wall 358 between the spring beam 366 and side wall 354, and the spring beam 366. A cathode is formed by leg 328c, portion 337, interconnected fingers 346, 364, side wall 356, the upper surface portion of the front bridge wall 358 between the spring beam 368 and side wall 356, and the spring beam 368. The anode and the cathode are electrically isolated from each other by the insulative second shots 349, 372, and the heat sink is electrically isolated from the anode and cathode. This provides for an electrical path between the circuit member 24 and the LED device 22a. The anode, cathode and heat sink are simultaneously formed when the exposed portions of the first shots are metal plated.

In use, the feet at the ends of the legs 328a, 328b, 328c, 328d are surface mount soldered to a power source, such as a circuit member 24. If desired, all of the fins 348 can be surface mount soldered to the circuit member 24.

The LED device 22a is identical to that described with regard to the second embodiment and as such, the specifics are not repeated herein.

To insert the LED device 22a, the cover 352 is pivoted away from the base 326 to provide access to the space therebetween. The LED device 22a is seated onto the base 326 and the locating protrusion 342 projects into the keyway 36a formed on the substrate 34a to ensure correct orientation of the LED device 22a within the interconnect device 320. The cover 352 is then pivoted toward the base 326 and the locking mechanism 370 on the cover 352 mates with the locking mechanism 350 on the base 326 to secure the LED device 22a therein. The anode 28a on the LED device 22a mates with the spring beam 366 and the cathode 32a on the LED device 22a mates with the other spring beam 368. The spring beams 366, 368 can flex relative to the LED device 22a during insertion of the LED device 22a into the interconnect device 320.

During operation of the LED device 22a, the LED device 22a generates heat which is transferred to the base 326 of the interconnect device 320, and this heat must be removed. Because of the plating, the heat sink function is directly integrated into the interconnect device 320. As air is circulated around the base 326 of the interconnect device 320 by known means, the heat is removed. The fins 348 are not required, but serve to provide additional surface area for heat dissipation. The vias 332 serve to transmit heat toward the fins 348.

If desired, a thermal pad, which acts as a heat spreader, (identified as 38 in FIG. 17) can be provided between the LED device 22a and the base 326 of the molded interconnect member 320. The thermal pad 38 is a flat metal plate that serve to spread the heat over the base 326.

The fourth embodiment of the interconnect device 420 which incorporates the features of the present invention is shown in FIGS. 19-23.

Figure 20:
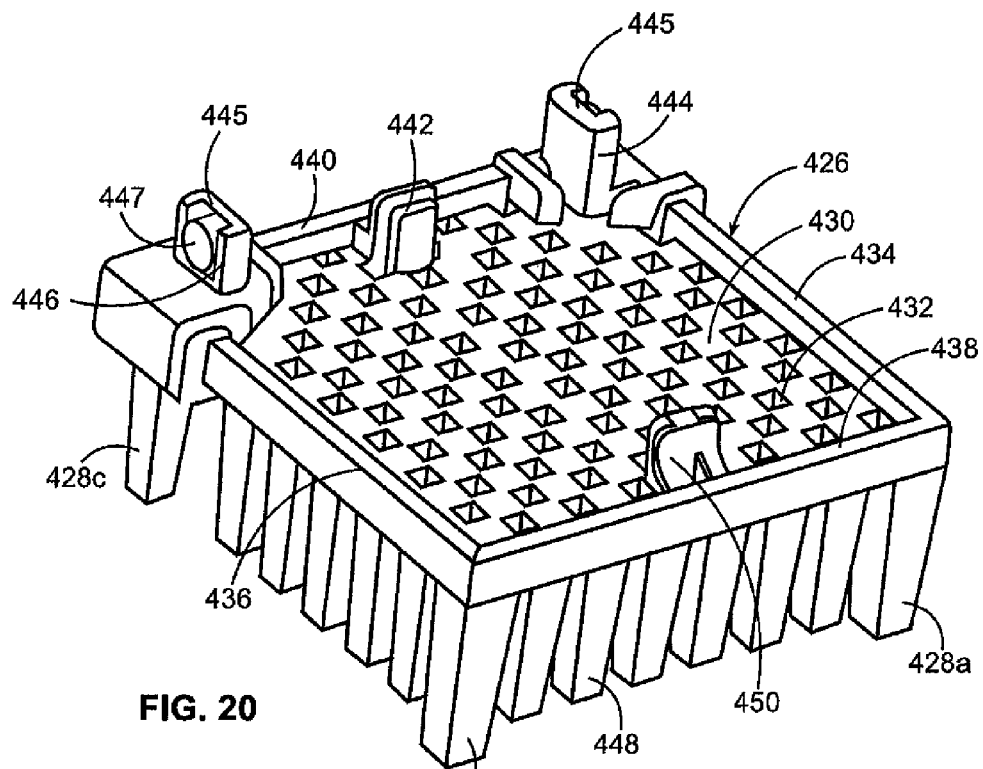
FIG. 20 is a top perspective views of a first shot of a bottom portion of the interconnect device shown in FIG. 19.

As shown in FIG. 20, the first shot creates a base member which includes a base 426 having a plurality of legs 428a, 428b, 428c (only three of which are shown) extending from a lower end at the corners thereof. The first shot is formed of a plateable thermoplastic material which can be metalized because of a palladium catalyst added to the plastic. Each leg terminates in a foot. If desired, a generally horizontal foot such as that shown in the first embodiment can be provided at the lower end of each leg.

The base 426 includes a planar portion 430 which has a plurality of vias 432 provided therethrough. As shown, the vias 432 are provided in rows and columns, however, this is not a required configuration. A first side wall 434 extends upwardly from the planar portion 430 along one edge thereof, a second side wall 436 extends upwardly from the planar portion 430 along an opposite edge thereof, a front wall 438 extends upwardly from the planar portion 430 along a front edge thereof, and a rear wall 440 extends upwardly from the planar portion 430 along the rear edge thereof.

A locating protrusion 442 extends forwardly from the rear wall 440 and extends upwardly from the rear end of the planar portion 430 at the midpoint of the rear end thereof. A pair of fingers 444, 446 are provided at the rear corners of the planar portion 430 and extend upwardly therefrom. A slot 445 extends from an upper end of each finger 444, 446 to an aperture 447 provided within the respective finger 444, 446. The apertures 447 are deeper in depth than the slots 445. A locking mechanism 450, which may take the form of a detent, is formed at the front of the planar portion 430 at the midpoint thereof.

A plurality of spaced apart fins 448 extend downwardly from the lower end of the planar portion 430 in the same direction as the legs 428a, 428b, 428c. The fins 448 are provided in rows and columns, however, this is not a required configuration. The fins 448 are offset from the vias 432, such that the fins 448 do not obstruct the vias 432 through the planar portion 430.

Figure 21:
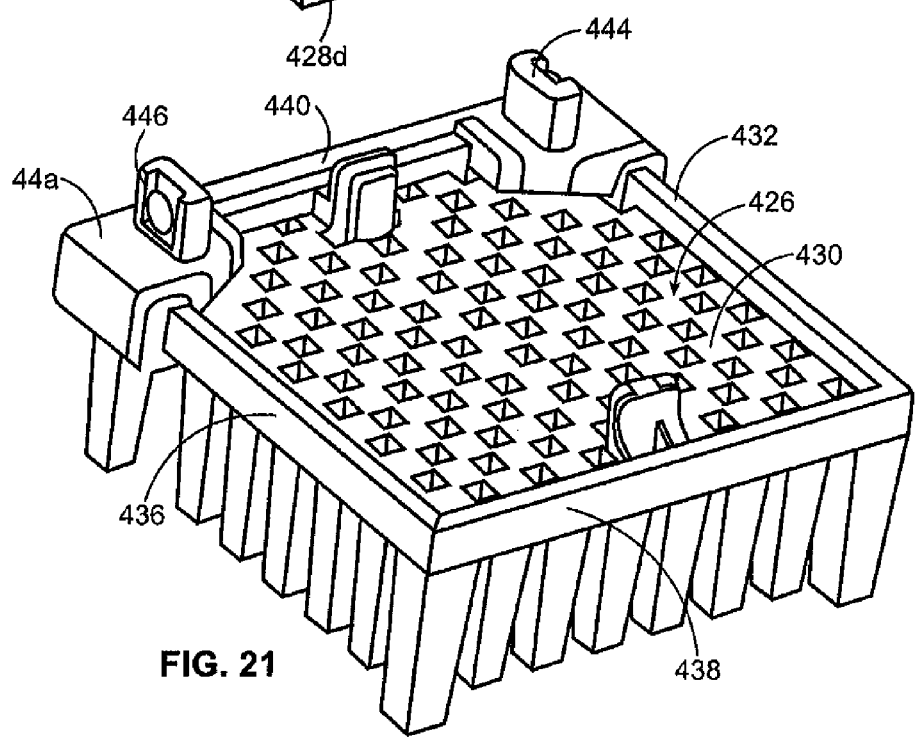
FIG. 21 is a top perspective view of the second shot of the bottom portion shown in FIG. 20.

After the base member is created by the first shot, as shown in FIG. 21, a second shot 449 is overmolded onto the base member. The second shot 449 is formed of a non-plateable thermoplastic which acts as an insulator. After the second shot 449 is completed, the only remaining surfaces of the first shot that are still exposed are surfaces that provide a heat sink portion of the interconnect device 420, and surfaces that provide the desired electrical paths. Specifically, the second shot 449 covers rear portions of the side walls 434, 436, and the rear wall 440 with the exception of respective portions which are between the fingers 444, 446 and the legs 428c and the unseen leg in the rear corner. In addition, the bottom surface of the planar portion 430 which is proximate to the legs 428b, 428c are overmolded with the second shot 449 with the exception of the portions thereof which are between the fingers 444, 446 and the legs 428b, 428c.

Thereafter, the exposed portions of the first shot are etched and only the exposed portions of the first shot are metal plated. Preferably, the exposed portions of the first shot are plated with a conductive copper layer and then metalized with a copper, nickel, palladium and/or gold finish.

Figure 22:
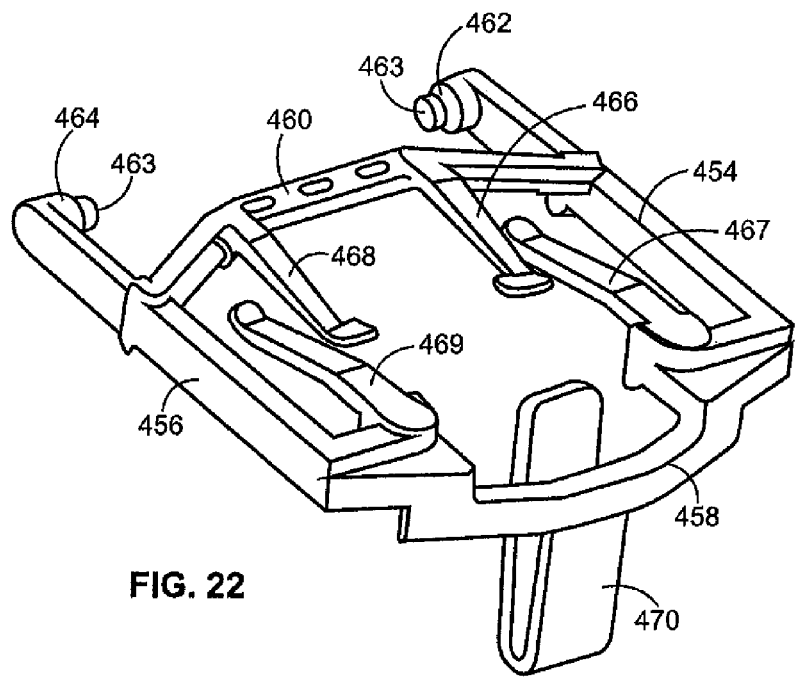
FIG. 22 is a top perspective view of a first shot of a cover which is used in the interconnect device shown in FIG. 19.

In this embodiment, a separate component, cover 452, is also formed with two shot molding. As shown in FIG. 22, the first shot creates a base member for cover 452, which is hingedly attached to the fingers 444, 446. The first shot is formed of a plateable thermoplastic material which can be metalized because of a palladium catalyst added to the plastic. The cover 452 includes a first side wall 454 and second side wall 456 which are connected at their front ends by a front bridge wall 458 and connected proximate to their rear ends by a rear bridge wall 460. A finger 462, 464, each of which has a pin 463 extending therefrom is provided at the rear end of each side wall 454, 456. The fingers 462, 464 are generally perpendicular relative to the side walls 454, 456. A rear pair of spring beams 466, 468 extend forwardly from the rear bridge wall 460 toward the front bridge wall 458. A forward pair of spring beams 467, 469 extend forwardly from the front bridge wall 458 toward the rear bridge wall 460. A locking mechanism 470, which takes the form of a finger having a detent thereof, extends downwardly from the front bridge wall 458 at the midpoint thereof.

Figure 23:
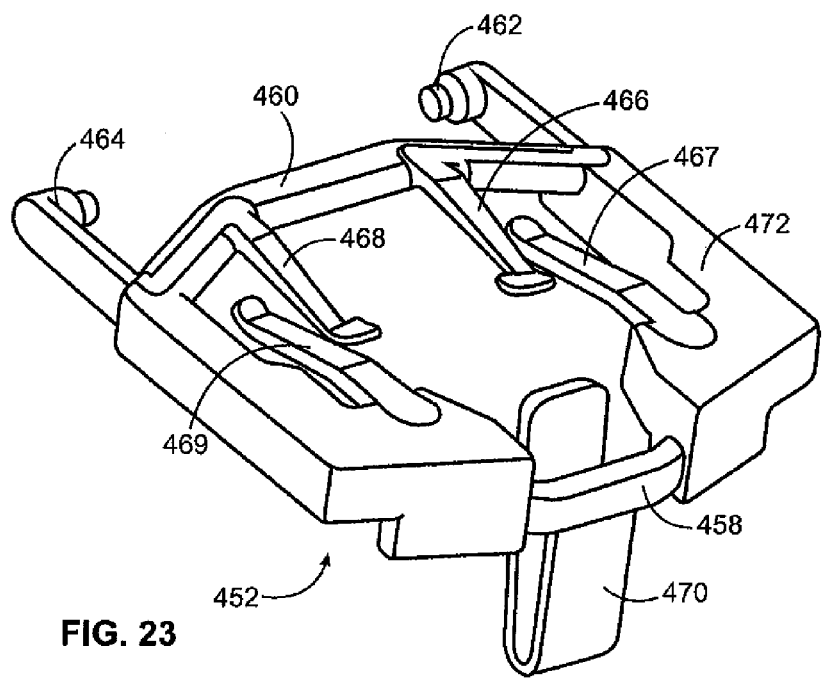
FIG. 23 is a top perspective view of a second shot of the cover shown in FIG. 22.
Figure 24:
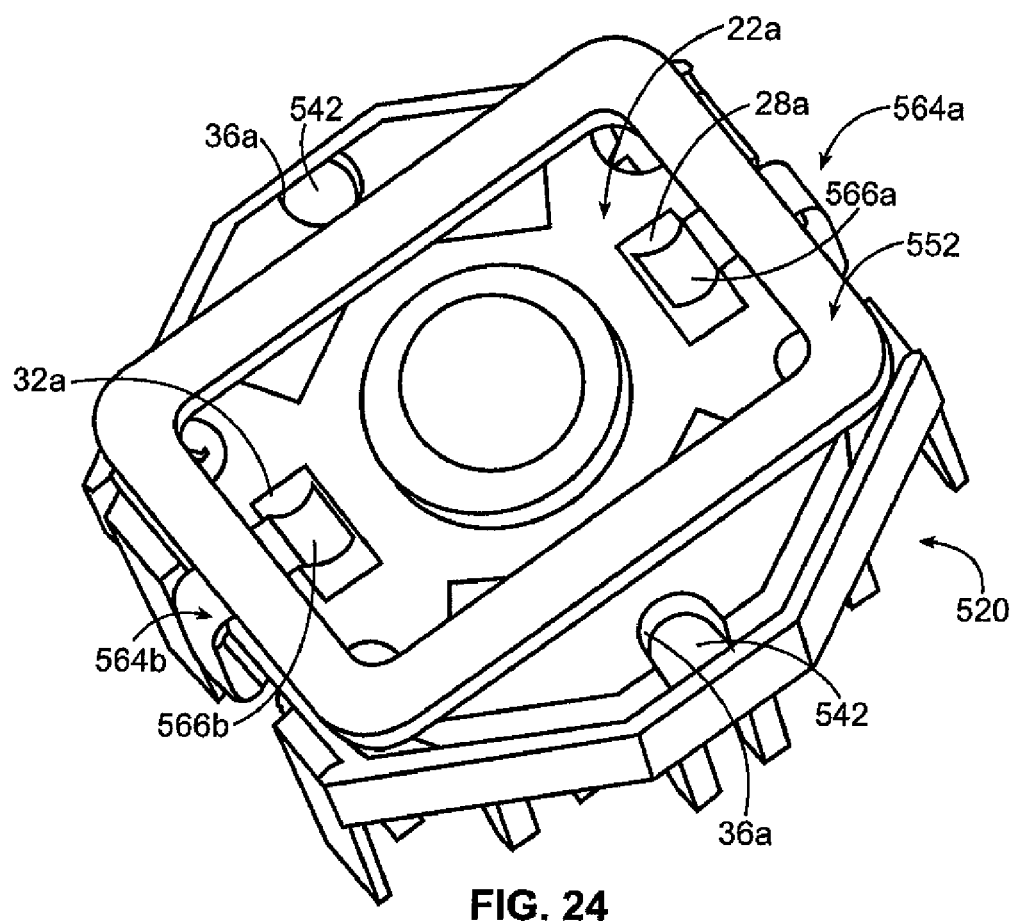
FIG. 24 is a top perspective view of an interconnect device which incorporates the features in accordance with a fifth embodiment of the present invention and having an LED device attached thereto.
Figure 25:
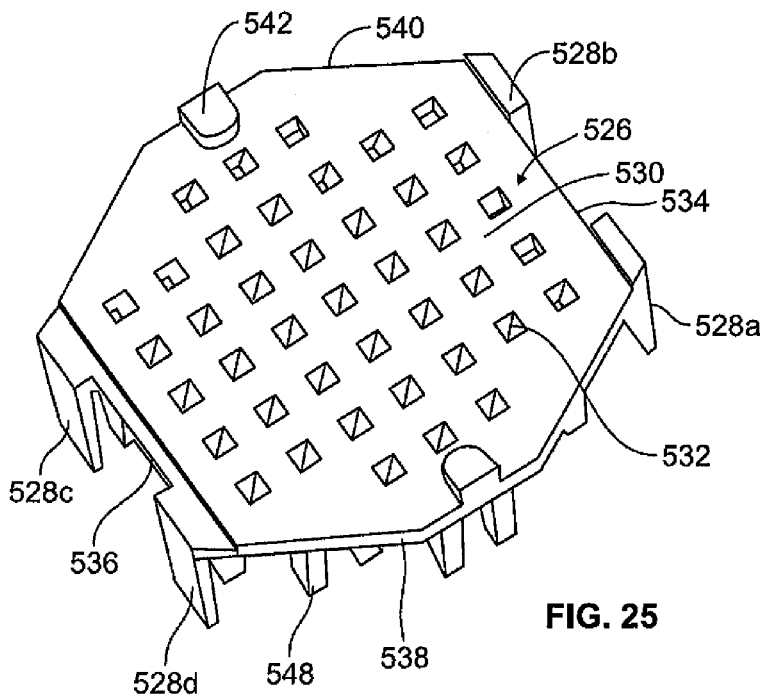
FIG. 25 is a top perspective views of a first shot of the interconnect device of FIG. 24.
Figure 26:
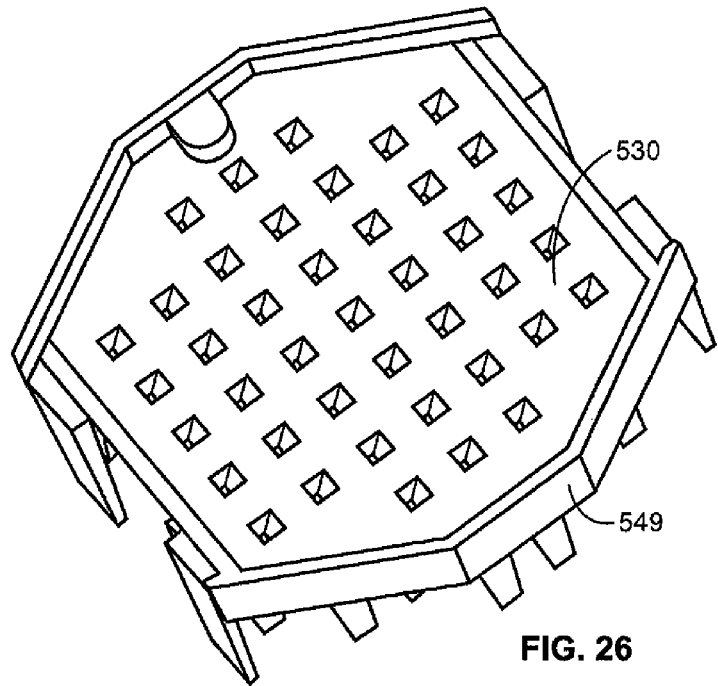
FIG. 26 is a top perspective view of a second shot of the interconnect device of FIG. 24.
Figure 27:
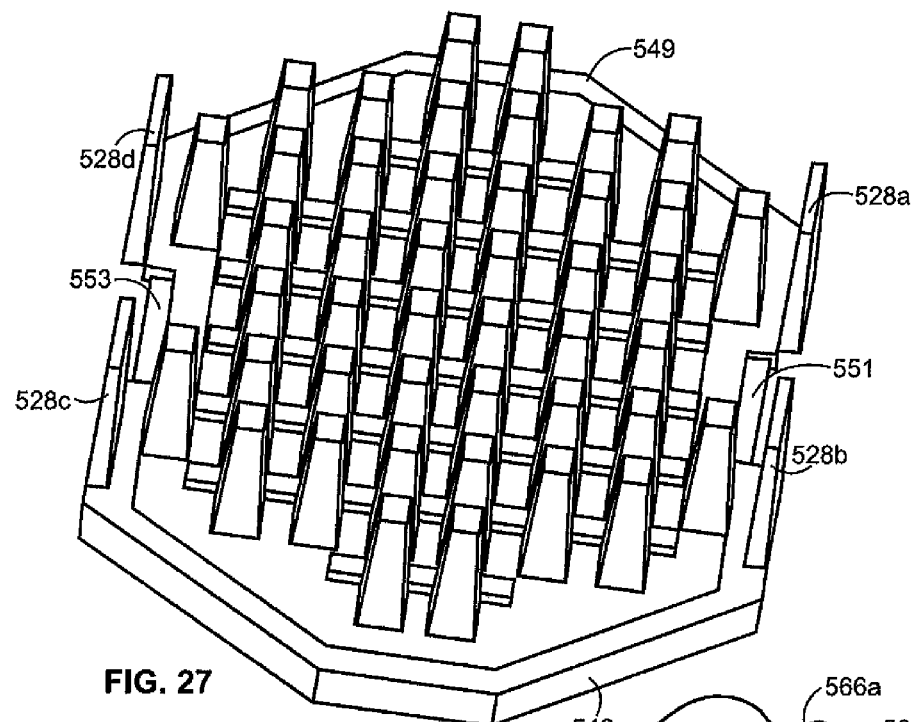
FIG. 27 is a bottom perspective view of a second shot of the interconnect device of FIG. 24.
Figure 28:
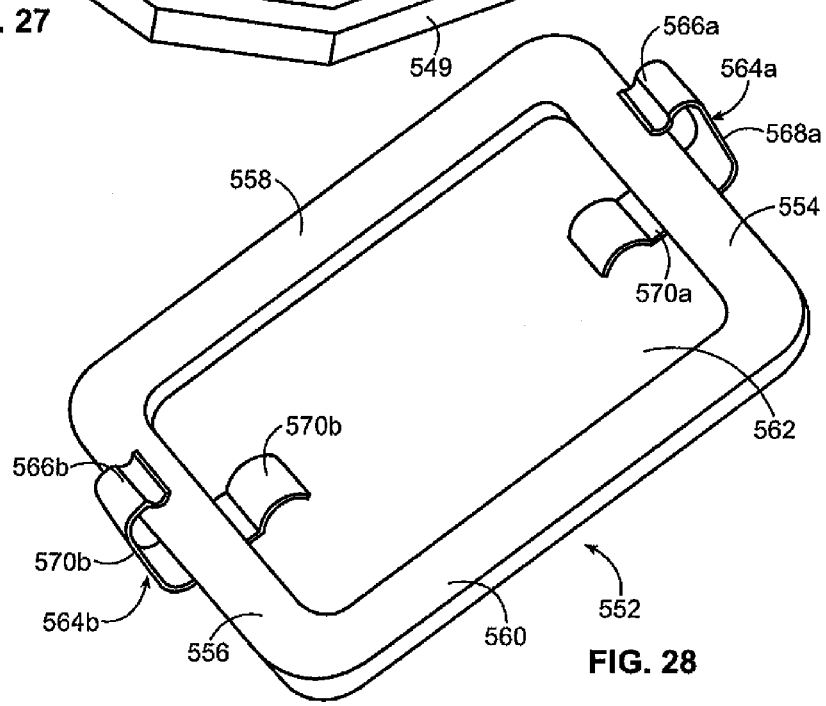
FIG. 28 is a perspective view of a cover which is used in the interconnect device of FIG. 24.
Figure 29:
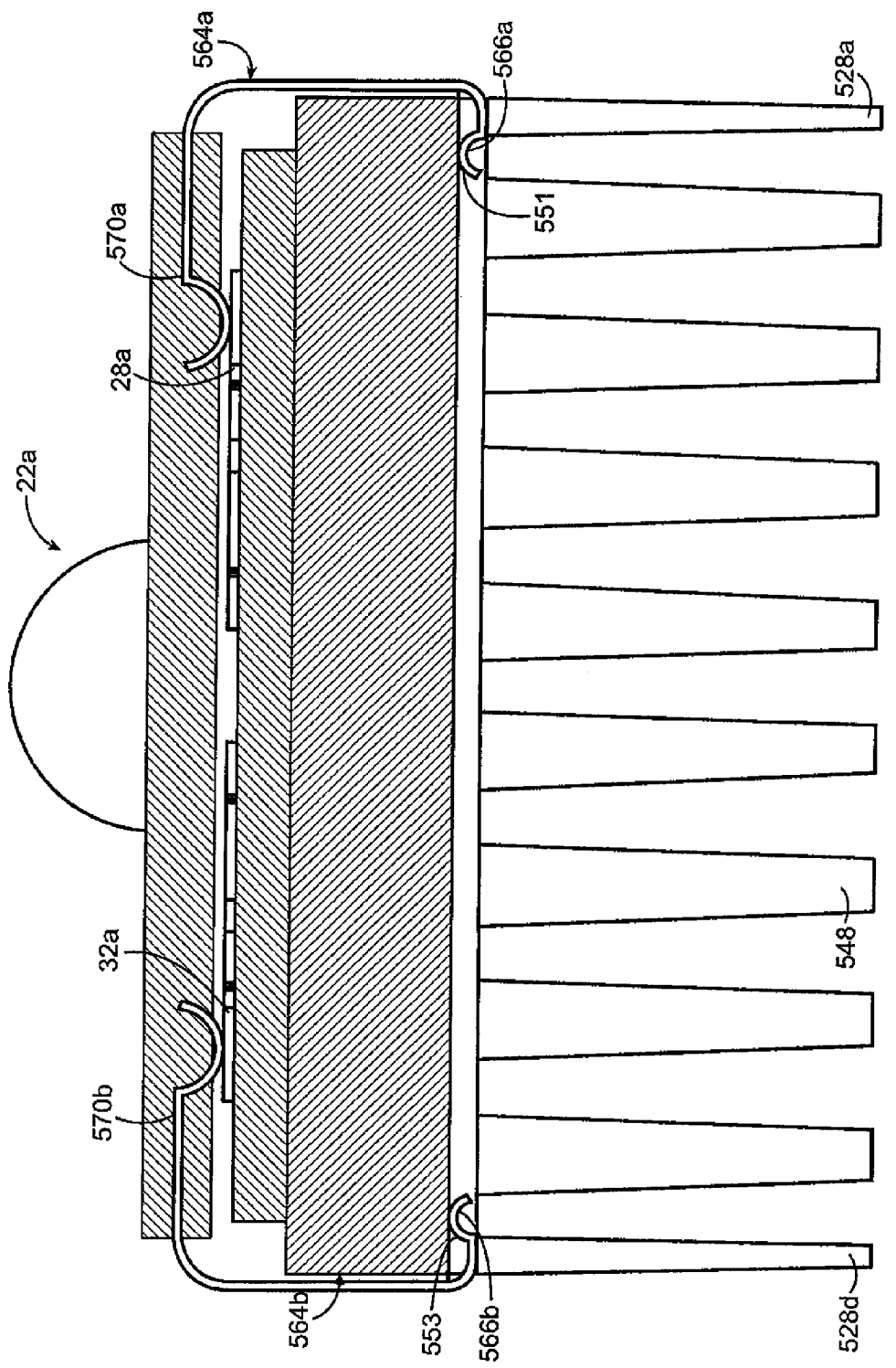
FIG. 29 is a cross-sectional view of the interconnect device of FIG. 24, having an LED device attached thereto.

After this base member which is used to form the cover 452 is created by the first shot, as shown in FIG. 23, the second shot 472 is overmolded onto the base member. The second shot 472 is formed of a non-plateable thermoplastic which acts as an insulator. After the second shot 472 is completed, the only remaining surfaces of the first shot that are still exposed are 1) the fingers 462, 464, 2) the upper surfaces of the portions of the rear bridge wall 460 between the fingers 462, 464 and the rear spring beams 467, 469, 3) the rear spring beams 466, 468, 4) the front spring beams 467, 469, and 5) the locking mechanism 470 and the portion of the front bridge wall 458 proximate to the locking mechanism 470.

Thereafter, this first shot is etched and metal plated. Preferably, the exposed portions of the first shot are plated with a conductive copper layer and then metalized with a copper, nickel, palladium and/or gold finish.

To attach the cover 452 to the base 426, the fingers 462, 464 of the cover 452 are attached to the fingers 444, 446 of the base 426 via the pins which are slid along the slots 445 and into the apertures 447. The locking mechanism 470 is slid into locking mechanism 450. By this action, the cover 453 is snapped into place. A space is provided between the cover 452 and the base 426 into which the LED device 22a is received as discussed herein.

As a result, a heat sink is provided by way of the planar portion 430 of the base 426 and the fins 448. An anode is formed by the leg which is not shown, the portion of the rear wall 440 between the finger 444 and the leg which is not shown, interconnected fingers 444, 462, side wall 454, the upper surface portion of the rear bridge wall 460 between the spring beam 466 and side wall 454, and the spring beam 466. A cathode is formed by leg 428c, the portion of the rear wall 440 between the finger 446 and leg 428c, interconnected fingers 446, 464, side wall 456, the upper surface portion of the rear bridge wall 460 between the spring beam 468 and side wall 456, and the spring beam 468. The anode and the cathode are electrically isolated from each other by the insulative second shots 449, 472, and the heat sink is electrically isolated from the anode and cathode. This provides for an electrical path between the circuit member 24 and the LED device 22a. The anode, cathode and heat sink are simultaneously formed when the exposed portions of the first shots are metal plated.

In use, the feet at the ends of the legs 428a, 428b, 428c are surface mount soldered to a power source, such as a circuit member 24. If desired, all of the fins 448 can be surface mount soldered to the circuit member 24.

The LED device 22a which is used but is not shown in FIGS. 19-23 is identical to that described with regard to the second embodiment and as such, the specifics are not repeated herein.

The LED device 22a is seated on the planar portion 430 prior to attachment of the cover 452 to the base 426. The LED device 22a is seated on the base 426 and the locating protrusion 442 projects into the keyway 36a formed on the substrate 34a to ensure correct orientation of the LED device 22a within the interconnect device 420. Thereafter, the cover 452 is snapped onto the base 426 to secure the LED device 22a therein. The anode 28a on the LED device 22a mates with the spring beam 466 and the cathode 32a on the LED device 22a mates with the other spring beam 468. The spring beams 466, 467, 468, 469 can flex relative to the LED device 22a during snapping of the cover 452 onto the base 426.

During operation of the LED device 22a, the LED device 22a generates heat which is transferred to the base 426 of the interconnect device 420, and this heat must be removed. Because of the plating, the heat sink function is directly integrated into the interconnect device 420. As air is circulated around the base 426 of the interconnect device 420 by known means, the heat is removed. The fins 448 are not required, but serve to provide additional surface area for heat dissipation. The vias 432 serve to transmit heat toward the fins 448.

If desired, a thermal pad, which acts as a heat spreader, (identified as 38 in FIG. 17) can be provided between the LED device 22a and the base 426 of the molded interconnect member 420. The thermal pad 38 is a flat metal plate that serve to spread the heat over the base 426.

Attention is invited to the fifth embodiment of the interconnect device 520 which incorporates the features of the present invention which is shown in FIGS. 24-29.

The first shot creates a base member which includes a base 526 having a plurality of legs 528a, 528b, 528c, 528d extending from a lower end at the corners thereof. The first shot is formed of a plateable thermoplastic material which can be metalized because of a palladium catalyst added to the plastic. Each leg 528a, 528b, 528c, 528d terminates in a foot. If desired, a generally horizontal foot such as that shown in the first embodiment can be provided at the lower end of each leg 528a, 528b, 528c, 528d.

The base 526 includes a planar portion 530 which has a plurality of vias 532 provided therethrough. As shown, the vias 532 are provided in rows and columns, however, this is not a required configuration. A first side edge 534 is provided along a first side of the planar portion 530, a second side edge 536 is provided along the opposite side of the planar portion 530, a front edge 538 is provided along a front end of the planar portion 530, and a rear edge 540 is provided along a rear end of the planar portion 530.

A locating protrusion 542 extends forwardly from the rear edge 540 and extends upwardly from the rear end of the planar portion 530 at the midpoint of the rear edge 540 thereof. A plurality of spaced apart fins 548 extend downwardly from the lower end of the planar portion 530 in the same direction as the legs 528a, 528b, 528c, 528b. The fins 548 are provided in rows and columns, however, this is not a required configuration. The fins 548 are offset from the vias 532, such that fins 548 do not obstruct the vias 532 through the planar portion 530.

After the base member is created by the first shot, a second shot 549 is overmolded onto the base member. The second shot 549 is formed of a non-plateable thermoplastic which acts as an insulator. After the second shot 549 is completed, the only remaining surfaces of the first shot that are still exposed are surfaces that provide a heat sink portion of the interconnect device 520, and surfaces that provide the desired electrical paths. Specifically, the second shot 549 covers the front and rear edges 538, 540 and wraps slightly onto the top and bottom surfaces of the planar portion 530 proximate to the front and rear edges 538, 540, the top surface of the planar portion 530 along each side edge 534, 536, and the bottom surface of the planar portion 530 along each side edge 534, 536. Between the legs 528a, 528b, the second shot 549 provided on the bottom surface planar portion 530 along side edge 534 jogs inwardly, so that a portion 551 of the bottom surface of the planar portion 530 proximate to the side edge 534 is exposed. Between the legs 528c, 528d, the second shot 549 provided on the bottom surface planar portion 530 along side edge 536 jogs inwardly, so that a portion 553 of the bottom surface of the planar portion 530 proximate to the side edge 536 is exposed. The second shot 549 thus forms a continuous ring around the planar portion 530.

Thereafter, the exposed portions of the first shot are etched and only the exposed portions of the first shot are metal plated. Preferably, the exposed portions of the first shot are plated with a conductive copper layer and then metalized with a copper, nickel, palladium and/or gold finish.

A cover 552 is formed by an insulative material, such as plastic. The cover 552 is generally rectangular in shape having a first side wall 554 and an opposite second side wall 556, a front wall 558 and an opposite rear wall 560. An aperture 562 is provided within the walls 554, 556, 558, 560. A generally U-shaped metal clip 564a, 564b, which may be formed of spring steel or other suitable conductive materials, is attached to each side wall 554, 556. Each clip 564a, 564b has a mating section 566a, 566b which has an arcuate bend therein, a bridge section 568a, 568b which extends generally perpendicularly to the mating section 566a, 566b to a spring beam 570a, 570b. The spring beam 570a, 570b extends generally perpendicularly to the bridge section 568a, 568b and generally parallel to the mating section 566a, 566b. Each spring beam 570a, 570b has an arcuate portion at the free end thereof. The respective bridge section 568a, 568b extends through the respective side wall 554, 556, such that the arcuate portion at the free end of the spring beam 570a, 570b overlaps the aperture 562.

In use, the feet at the ends of the legs 528a, 528b, 528c, 528d are surface mount soldered to a power source, such as a circuit member. If desired, all of the fins 548 can be surface mount soldered to the circuit member.

The LED device 22a is identical to that described with regard to the second embodiment and as such, the specifics are not repeated herein. The LED device 22a is seated on the planar portion 530 prior to attachment of the cover 552 to the base 526. The locating protrusion 542 (two of which are provided in this embodiment, and it is to be understood that the two can be provided in the second through fourth embodiments if desired) on the interconnect device 520 projects into the keyway 36a (two of which are provided in this embodiment, and it is to be understood that the two can be provided in the second through fourth embodiments if desired) formed on the substrate 34a to ensure collect orientation of the LED device 22a within the interconnect device 520. To attach the cover 552 to the base 526, the cover 552 is positioned above the LED device 22a and the clips 564a, 564b are positioned over the side edges 534, 536. The cover 552 is moved toward the LED device 22a. Once the bridge sections 568a, 568b of the clips 564a, 564b contact the LED device 22a or the side edges 534, 536 of the planar portion, the bridge and mating sections 568a, 568b, 566a, 566b of the clips 564a, 564b deflect outwardly. Once the mating sections 566a, 566b clear the side edges 554, 556, the bridge and mating sections 568a, 568b, 566a, 566b resume their original, undetected state. As a result, the bridge sections 568a, 568b respectively contact the portions 551, 553 and the respective spring beams 570 contact the anode 28a and the cathode 32a on the LED device 22a. The anode 28a on the LED device 22a mates with the spring beam 566a and the cathode 32a on the LED device 22a mates with the other spring beam 566b. The spring beams 570a, 570b can flex relative to the LED device 22a during attachment of the cover 552 to the base 526.

As a result, a heat sink is provided by way of the planar portion 530 of the base 526 and the fins 548. An anode of the interconnect device 520 is formed by leg 528b (leg 528a is terminated onto the insulative substrate), the side edge 534 between legs 528a and 528b, the portion 551, and the clip 564a. A cathode of the interconnect device 520 is formed by leg 528c (leg 528d is terminated onto the insulative substrate), the side edge 536 between legs 528c and 528d, the portion 553, and the clip 564b. The anode and the cathode are electrically isolated from each other by the insulative second shots 549, 472, and the heat sink is electrically isolated from the anode and cathode. This provides for an electrical path between the circuit member 24 and the LED device 22a. The anode, cathode and heat sink are simultaneously formed when the exposed portions of the first shots are metal plated.

During operation of the LED device 22a, the LED device 22a generates heat which is transferred to the base 526 of the interconnect device 520, and this heat must be removed. Because of the plating, the heat sink function is directly integrated into the interconnect device 520. As air is circulated around the base 526 of the interconnect device 520 by known means, the heat is removed. The fins 548 are not required, but serve to provide additional surface area for heat dissipation. The vias 532 serve to transmit heat toward the fins 548.

If desired, a thermal pad, which acts as a heat spreader, (identified as 38 in FIG. 17) can be provided between the LED device 22a and the base 526 of the molded interconnect member 520. The thermal pad 38 is a flat metal plate that serve to spread the heat over the base 526.

Figure 30:
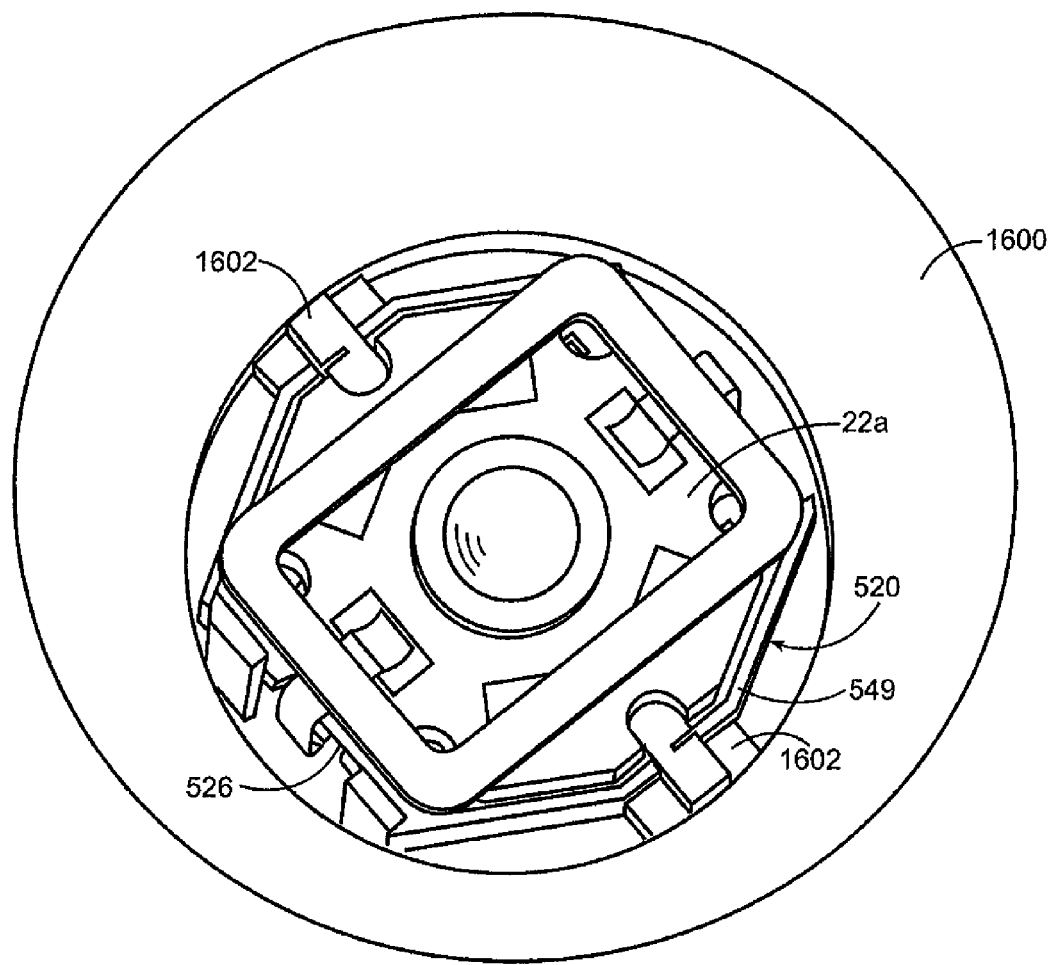
FIG. 30 is a top perspective view of the interconnect device of FIG. 24 and the LED device, the interconnect device having a reflector attached thereto.
Figure 31:
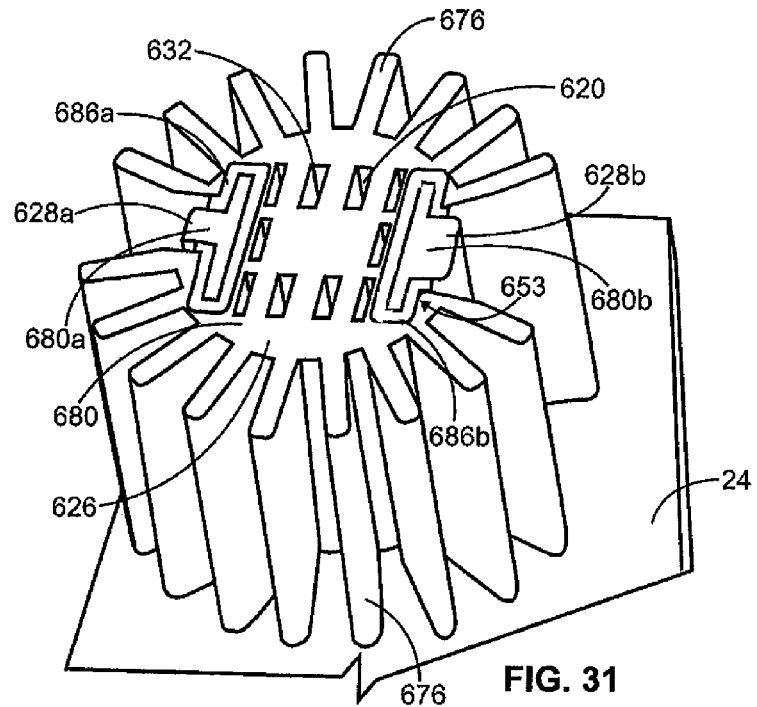
FIG. 31 is a top perspective view of an interconnect device which incorporates the features in accordance with a sixth embodiment of the present invention and attached to a circuit member.
Figure 32:
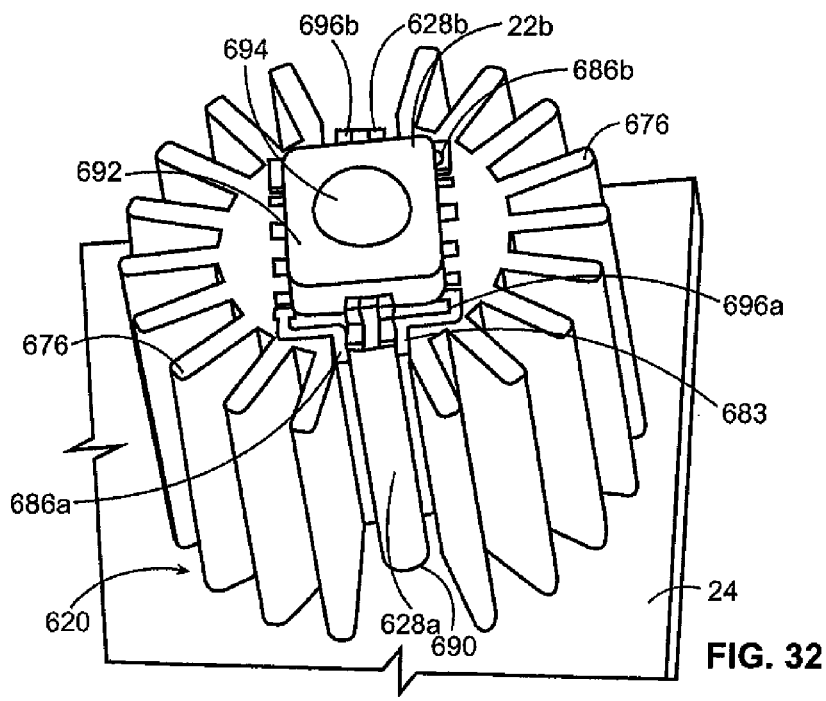
FIG. 32 is a top perspective view of the interconnect device of FIG. 31, having an LED device attached thereto and attached to a circuit member.
Figure 33:
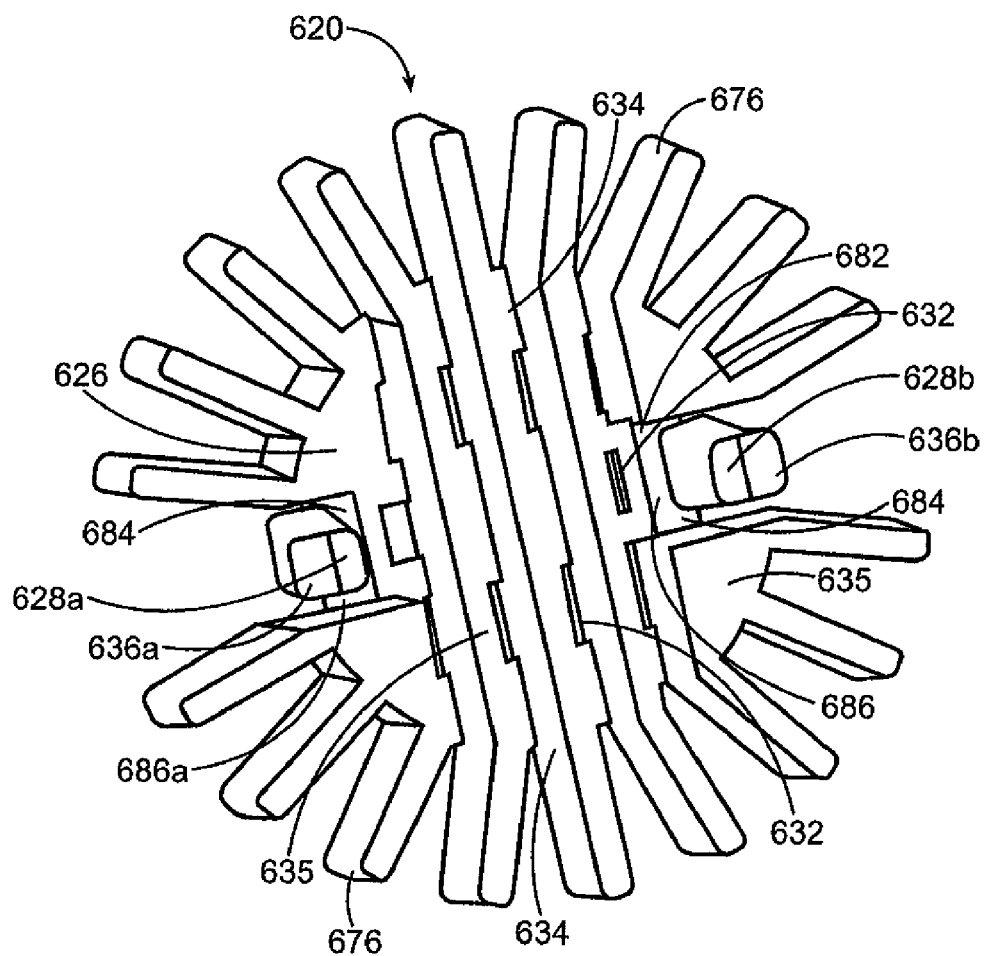
FIG. 33 is a bottom perspective view of the interconnect device of FIG. 31.
Figure 34:
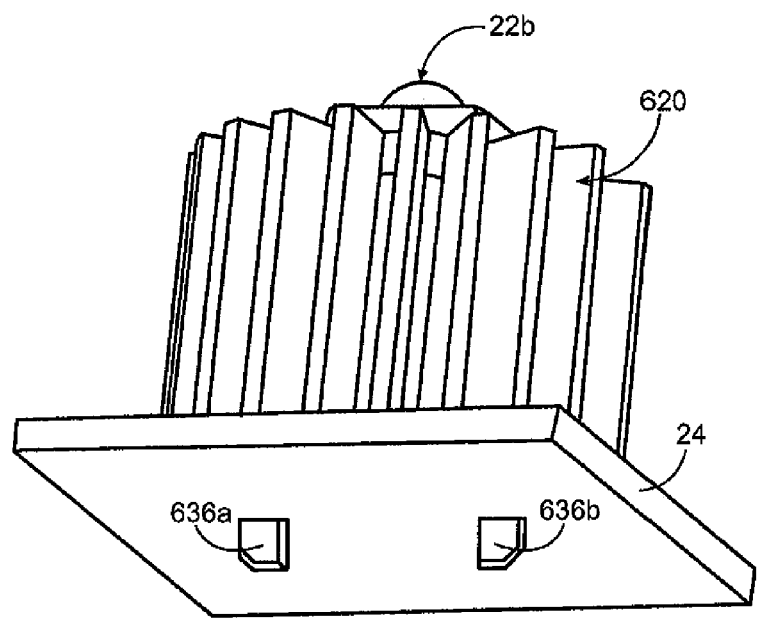
FIG. 34 is another bottom perspective view of the interconnect device of FIG. 31, having an LED device attached thereto and attached to a circuit member.

As shown in FIG. 30, a reflector 1600 can be attached to the base 526 of the interconnect device 520 by at least two attachment points 1602. As shown, the reflector 1600 is a bowl-shaped structure that aids in directing the light emitted from the LED device 22a. It is to be understood that the reflector 1600 can take a variety of shapes, as long as the reflector 1600 provides reflective properties to the LED device 22a.

The reflector 1600 is formed at the same time as the interconnect device 520. The reflector 1600 is not overmolded by the second shot 549 such that when the exposed portions of the first shot are etched and metal plated, the reflector 1600 is also etched and metal plated. The reflector 1600 can be polished to a high degree of reflectivity. Alternatively, the reflector 1600 can be formed as a separate component and suitably attached to the interconnect device 520.

While the reflector 1600 is shown in FIG. 30 as being electrically isolated from the heat sink which is formed by the interconnect device 520 by the second shot 549, the reflector 1600 does not need to be electrically isolated from the interconnect device 520. If the reflector 1600 is not electrically isolated from the interconnect device 520, the reflector 1600 will also function as part of the heat sink.

Attention is invited to the sixth embodiment of the interconnect device 620 which is shown in FIGS. 31-35. The interconnect device 620 provides a holder to which a high power/intensity LED device 22b can be attached. In this embodiment, the LED device 22b is permanently attached to the interconnect device 620, as opposed to the first through fifth embodiments wherein the LED device 22, 22a is inserted and can be removed from the interconnect device 120, 220, 320, 420, 520. In the sixth embodiment, the need to wire bond or hand solder the LED device 22b directly to the circuit member 24 is eliminated as described herein. The LED device 22b and the interconnect device 620 are removed from the circuit member 24 and replaced when the LED device 22b no longer functions. This significantly reduces costs by eliminating the costly and time consuming reworking of wire bonding or hand soldering the LED 22b device to the circuit member 24. Furthermore, an ease of field service is provided. The interconnect device 620 and associated LED device 22b can be easily upgraded in the field to change the color, brightness and the like.

The first shot creates a base member which includes a base 626 having a pair of legs 628a, 628b extending from a bottom end thereof, and a plurality of spaced apart fins 676 extending from the exterior of the base 626. The base 626 is generally cylindrical and has a plurality of vias 632 extending from a top surface 680 to the bottom surface 682 therethrough. The top surface 680 and the bottom surface 682 of the base 626 are generally planar. The first shot is formed of a plateable thermoplastic material that can be metalized because of a palladium catalyst added to the plastic.

The fins 676 are provided at spaced apart locations along the exterior of the base 626. The fins 676 extend from the top end to the bottom end of the base 626 and along the bottom surface 682, such that a plurality of walls 635 defining passageways 634 are formed along the bottom surface 682 of the base 626. The passageways 634 are in communication with the vias 632. The fins 676 provide additional surface area for heat dissipation as discussed herein.

Each leg 628a, 628b is generally vertical and extends from the base 626 from the top end to the bottom end thereof, and extends downwardly from the bottom end of the base 626 a predetermined distance to a free end. A generally horizontal foot 636a, 636b extends perpendicularly from the free end of the respective leg 628a, 628b. As shown, the legs 628a, 628b are diametrically opposed on the base 626, however other positioning the legs 628a, 628b is within the scope of the invention. If desired, more than two legs with associated feet can be provided. Each foot 636a, 636b is enlarged relative to the respective leg 628a, 628b and is spaced from the bottom end of the base 626. The feet 636a, 636b are used to snap fit the interconnect device 620 into a circuit board 24 as discussed herein. The feet 636a, 636b do not need to be identical in shape and may differ in size and configuration. The fins 676 adjacent to the legs 628a, 628b are spaced therefrom such that portions 683 of the side edges of the base 626 and a portion 684 of the bottom surface 682 of the base 626 is exposed at all points between the legs 628a, 628b and these fins 676.

After the base member is created by the first shot, the second shot 653 is overmolded onto the base member. The second shot 653 is formed of a non-plateable thermoplastic which acts as an insulator. The second shot 653 creates two separate, but continuous boundary lines 686a, 686b on the base member. Each continuous boundary line 686a, 686b separates the respective leg 628a, 628b from the fins 676 adjacent thereto and separates sections 680a, 680b of the top surface 680 from the remainder of the top surface 680 of the base 626. The sections 680a, 680b are proximate to the top ends of the legs 628a, 628b. Each boundary line 686a, 686b extends along the portions 683, 684, and onto the top surface 680 of the base 626 to form the sections 680a, 680b. As shown, the sections 680a, 680b are generally rectangular in shape, however, other shapes can be contemplated. The boundary lines 686a, 686b do not intersect the vias 632. The remainder of the first shot that is not covered by the boundary lines 686a, 686b are still exposed and are surfaces that provide a heat sink portion of the interconnect device 620, and surfaces that provide the desired electrical paths.

Thereafter, the exposed portions are etched and only the exposed portions of the first shot are metal plated. Preferably, the exposed and etched portions of the first shot are plated with a conductive copper layer and then metalized with a copper, nickel, palladium and/or gold finish.

As a result, a heat sink is provided by way of the top surface 680 of the base 626 with the exceptions of the sections 680a, 680b, the fins 676, the exterior surface of the base 626 between the fins 676, the vias 632, and the bottom surface 682 of the base 626 with the exceptions of the portions 684. The vias 632 serve to transmit heat toward the fins 676. An anode of the interconnect device 620 is formed by foot 636a, leg 628a and section 680a. A cathode of the interconnect device 620 is formed by foot 636b, leg 628b and section 680b. The anode and the cathode are electrically isolated from each other by the insulative second shot 653, and the heat sink is electrically isolated from the anode and cathode. This provides for an electrical path between the circuit member 24 and the LED device 22b, which is mounted to the sections 680a, 680b as described herein. As a result, the heat sink function and the electrical path function are provided by the interconnect device 620. The anode, cathode and heat sink are simultaneously formed when the exposed portions of the first shot are metal plated.

The feet 636a, 636b are snap fit into associated apertures 690 in the circuit member 24. The portions of the legs 628a, 628b which extend from the bottom end of the base 626 can be flexed relative to each other to allow the feet 636a, 636b to pass through the apertures 690 and then the legs 628a, 628b resume their natural state to lock the feet 636a, 636b into the circuit member 24. This allows for the interconnect device 620 to be removed from the circuit member 24 in the event that the LED device 22b becomes defective. Alternatively, if desired, the feet 636a, 636b (or the bottom end of the legs 628a, 628b if the feet 636a, 636b are eliminated) of the interconnect device 620 can be wave soldered or surface mount soldered to the circuit member 24.

The LED device 22b is formed from a substrate 692 on which at least one LED 694 is provided. A lens cover is provided over the at least one LED 694. A first conductive contact 696a has an end electrically connected, for example by wire bonding, to the silicant in the substrate 692, and the other end of the conductive contact 696a is electrically connected, for example by soldering, electrical epoxy, to the anode of the interconnect device 620 which is formed by foot 636a, leg 628a and section 680a. A second conductive contact 696b, which is electrically isolated from the first conductive contact 696a, has an end electrically connected, for example by wire bonding, to the silicant in the substrate 692, and the other end of the conductive contact 696a is electrically connected, for example by soldering, electrical epoxy, to the cathode of the interconnect device 620 which is formed by foot 636b, leg 628b and section 680b. The bottom surface of the substrate 692 has a thermal pad, not shown, which sits against and is soldered to the top surface 680 of the base 626, but not against sections 680a, 680b since only the conductive contacts 696a, 696b contact the substrate 692 in these sections 680a, 680b. The edges of the substrate 692 may sit against the portions of the boundary lines 686a, 686b which are provided on the top surface 680 of the base 626.

Figure 35:
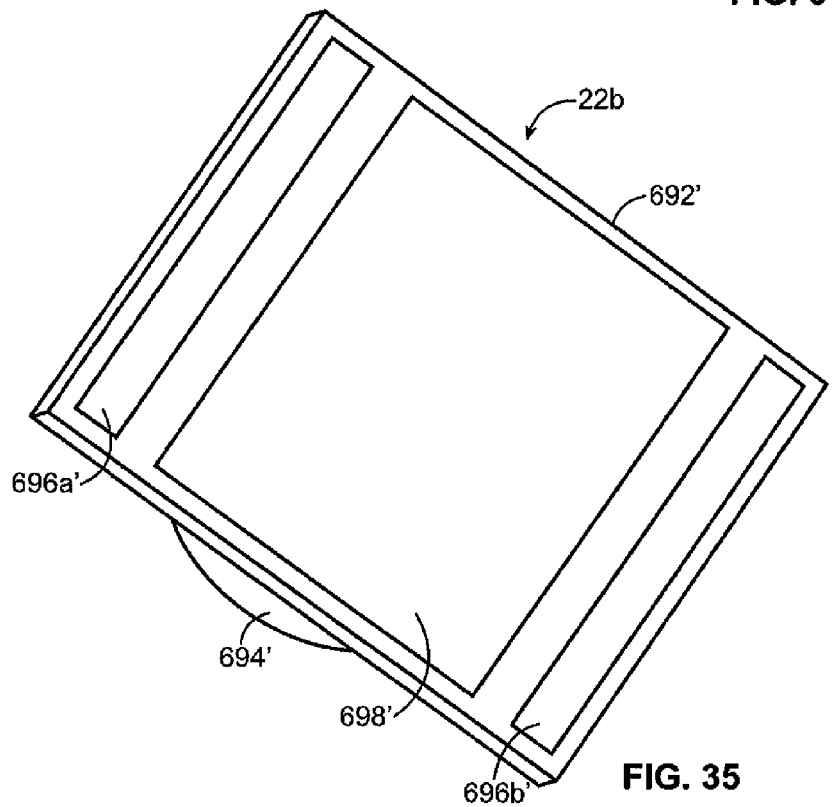
FIG. 35 is a bottom plan view of an LED device which can be used with the interconnect device of FIG. 31.
Figure 36:
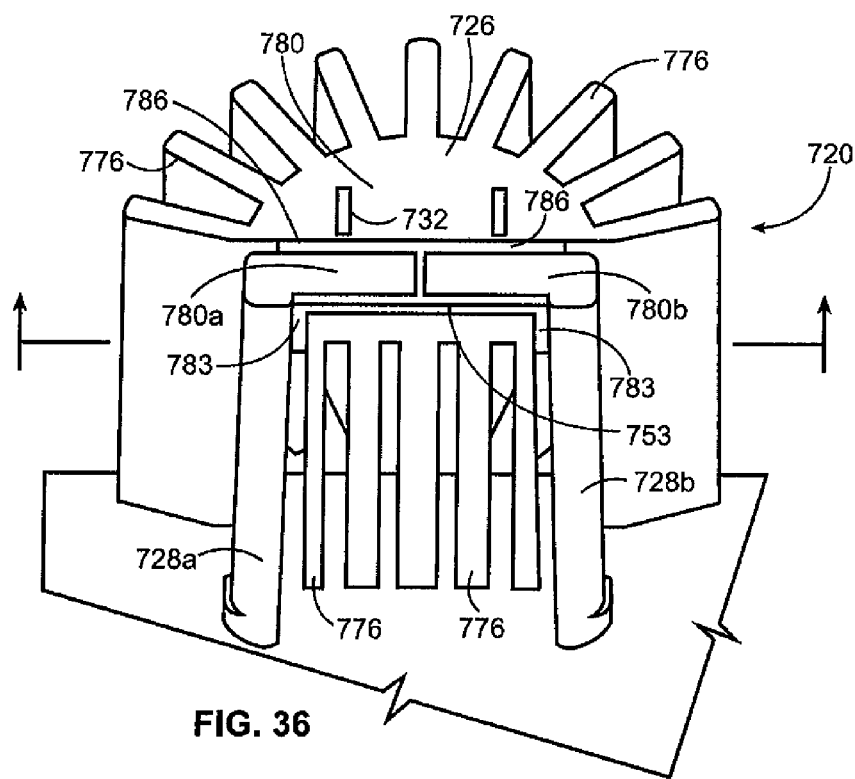
FIG. 36 is a top perspective view of an interconnect device which incorporates the features in accordance with a seventh embodiment of the present invention and attached to a circuit member.
Figure 37:
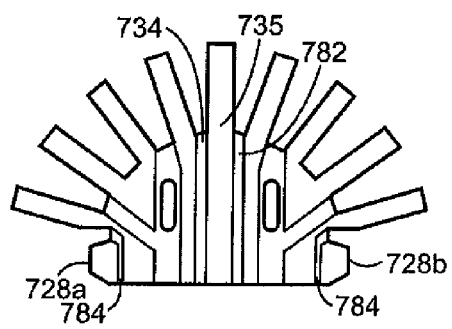
FIG. 37 is a bottom plan view of the interconnect device of FIG. 36.
Figure 38:
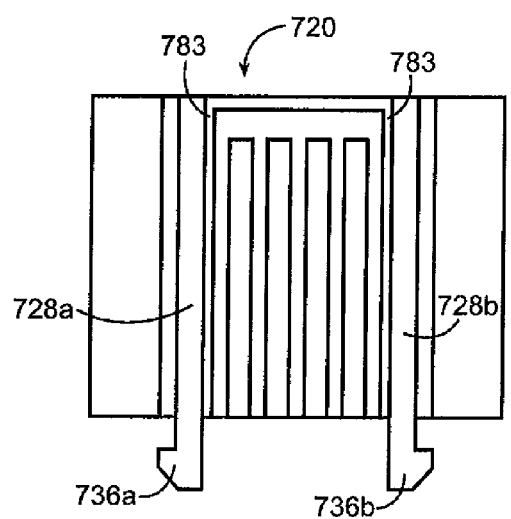
FIG. 38 is a front elevational view of the interconnect device of FIG. 36.
Figure 39:
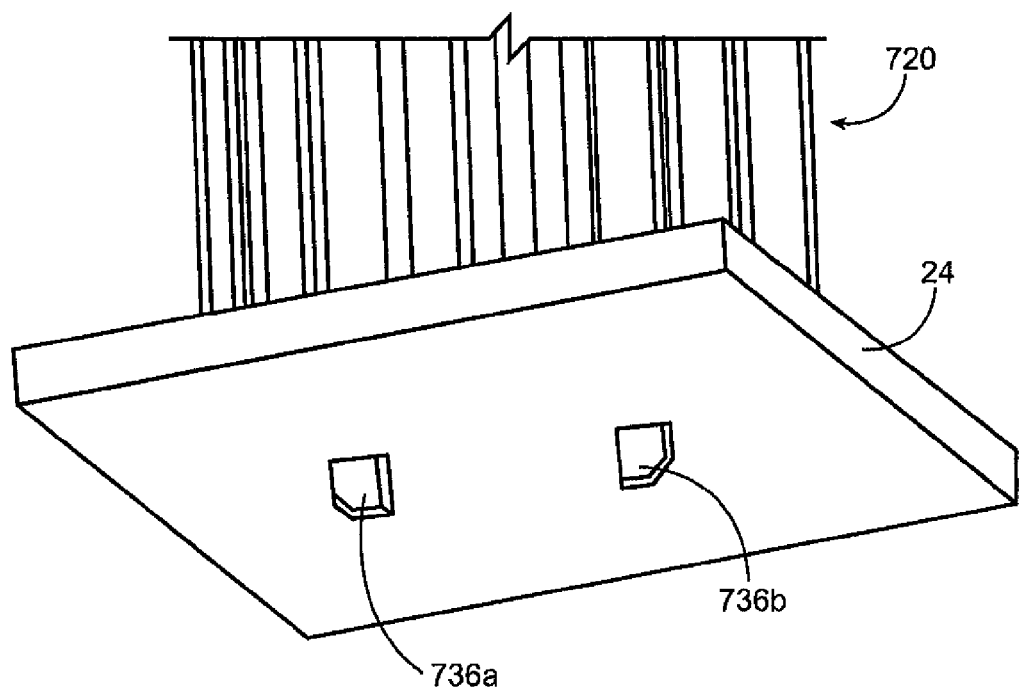
FIG. 39 is a bottom perspective view of the interconnect device of FIG. 36, and attached to a circuit member.

Alternatively, as shown in FIG. 35, the LED device 22b can be formed from a substrate 692' on which at least one LED 694' is provided. A lens cover is provided over the at least one LED 694'. A first conductive contact 696a' is provided on the underside of the substrate 692' and is electrically connected, for example by soldering, electrical epoxy, to the anode of the interconnect device 620 which is formed by foot 636a, leg 628a and section 680a. A second conductive contact 696b', which is electrically isolated from the first conductive contact 696a', is provided on the underside of the substrate 692' and is electrically connected, for example by soldering, electrical epoxy, to the cathode of the interconnect device 620 which is formed by foot 636b, leg 628b and section 680b. The bottom surface of the substrate 692' has a thermal pad 698' which sits against and is soldered to the top surface 680 of the base 626, but not against sections 680a, 680b since only the conductive contacts 696a', 696b' contact the substrate 692' in these sections 680a, 680b.

During operation of the LED device 22b, the LED device 22b generates heat which is transferred to the base 626, and this heat must be removed. Because of the plating, the heat sink function is directly integrated into the interconnect device 620. As air is circulated around the base 626 by known means, the heat is removed.

Attention is invited to the seventh embodiment of the interconnect device 720 which is shown in FIGS. 36-41. The interconnect device 720 provides a holder to which a high power/intensity LED device 22c can be attached. Like the sixth embodiment, in this seventh embodiment, the LED device 22c is permanently attached to the interconnect device 720, as opposed to the first through fifth embodiments wherein the LED device 22, 22a is inserted and can be removed from the interconnect device 120, 220, 320, 420, 520. In the seventh embodiment, the need to wire bond or hand solder the LED device 22c directly to the circuit member 24 is eliminated as described herein. The LED device 22c and the interconnect device 720 are removed from the circuit member 24 and replaced when the LED device 22c no longer functions. This significantly reduces costs by eliminating the costly and time consuming reworking of wire bonding or hand soldering the LED 22c device to the circuit member 24. Furthermore, an ease of field service is provided. The interconnect device 720 and associated LED device 22c can be easily upgraded in the field to change the color, brightness and the like.

The first shot creates a base member which includes a base 726 having a pair of legs 728a, 728b extending from the flat edge of the half cylinder, and a plurality of spaced apart fins 776 extending from the exterior of the base 726. The base 726 is generally a half cylinder and vias 732 extend from a top surface 780 to a bottom surface 782 of the base 726. The top surface 780 and the bottom surface 782 of the base 726 are generally planar. The first shot is formed of a plateable thermoplastic material that can be metalized because of a palladium catalyst added to the plastic.

The fins 776 are provided at spaced apart locations along the exterior of the base 726. The fins 776 extend from the top end to the bottom end of the base 726 and along the bottom surface 782, such that a plurality of walls 735 defining passageways 734 are formed along the bottom surface 7682 of the base 762. The passageways 734 are in communication with the vias 732. The fins 776 provide additional surface area for heat dissipation as discussed herein.

Each leg 728a, 728b is generally vertical, extends from the top end to the bottom end of the base 726 and extends outwardly from the base 726, and extends downwardly from the bottom end of the base 726 a predetermined distance to a free end. A generally horizontal foot 736a, 736b extends perpendicularly from the free end of the respective leg 728a, 728b. As shown, the legs 728a, 728b are diametrically opposed and are provided at the corners of the base 726, however other positioning the legs 728a, 728b is within the scope of the invention. If desired, more than two legs with associated feet can be provided. Each foot 736a, 736b is enlarged relative to the respective leg 728a, 728b and is spaced from the bottom end of the base 726. The feet 736a, 736b are used to snap fit the interconnect device 720 into a circuit board 24 as discussed herein. The feet 736a, 736b do not need to be identical in shape and may differ in size. The fins 776 adjacent to the legs 728a, 728b are spaced therefrom such that portions 783 of the side edges of the base 726 and a portion 784 of the bottom surface 782 of the base 726 is exposed at all points between the legs 728a, 728b and these fins 776.

After the base member is created by the first shot, the second shot 753 is overmolded onto the base member. The second shot 753 is formed of a non-plateable thermoplastic which acts as an insulator. The second shot 753 creates a continuous boundary line 786 on the base member. The continuous boundary line 786 separates the legs 728a, 728b from the fins 776 and separates sections 780a, 780b of the top surface 780 from the remainder of the top surface 780 of the base 726. The sections 780a, 780b are proximate to the top ends of the legs 728a, 728b.

The boundary line 786 extends along the portions 783, 784 and onto the top surface 780 of the base 726 to form the sections 780a, 780b. As shown, sections 780a, 780b are generally rectangular in shape, however, other shapes can be contemplated. The boundary line 786a does not intersect the vias 732. The remainder of the first shot that is not covered by the boundary line 786 are still exposed and are surfaces that provide a heat sink portion of the interconnect device 720, and surfaces that provide the desired electrical paths.

Thereafter, the exposed portions are etched and only the exposed portions of the first shot are metal plated. Preferably, the exposed and etched portions of the first shot are plated with a conductive copper layer and then metalized with a copper, nickel, palladium and/or gold finish.

As a result, a heat sink is provided by way of the top surface 780 of the base 726 with the exceptions of the sections 780a, 780b, the fins 776, the exterior surface of the base 726 between the fins 776, and the bottom surface 782 of the base 726. The vias 732 serve to transmit heat toward the fins 776. An anode of the interconnect device 720 is formed by foot 736a, leg 728a and section 780a. A cathode of the interconnect device 720 is formed by foot 736b, leg 728b and section 780b. The anode and the cathode are electrically isolated from each other by the insulative second shot 753, and the heat sink is electrically isolated from the anode and cathode. This provides for an electrical path between the circuit member 24 and the LED device 22c which is mounted to the sections 780a, 780b as described herein. As a result, the heat sink function and the electrical path function are provided by the interconnect device 720. The anode, cathode and heat sink are simultaneously formed when the exposed portions of the first shot are metal plated.

The feet 736a, 736b are snap fit into associated apertures 790 in the circuit member 24. The portions of the legs 728a, 728b which extend from the bottom end of the base 726 can be flexed relative to each other to allow the feet 736a, 736b to pass through the apertures 790 and then the legs 728a, 728b resume their natural state to lock the feet 736a, 736b into the circuit member 24. This allows for the interconnect device 720 to be removed from the circuit member 24 in the event that the LED device 22c becomes defective. Alternatively, if desired, the feet 736a, 736b (or the bottom end of the legs 728a, 728b if the feet 736a, 736b are eliminated) of the interconnect device 720 can be wave soldered or surface mount soldered to the circuit member 24.

Figure 40:
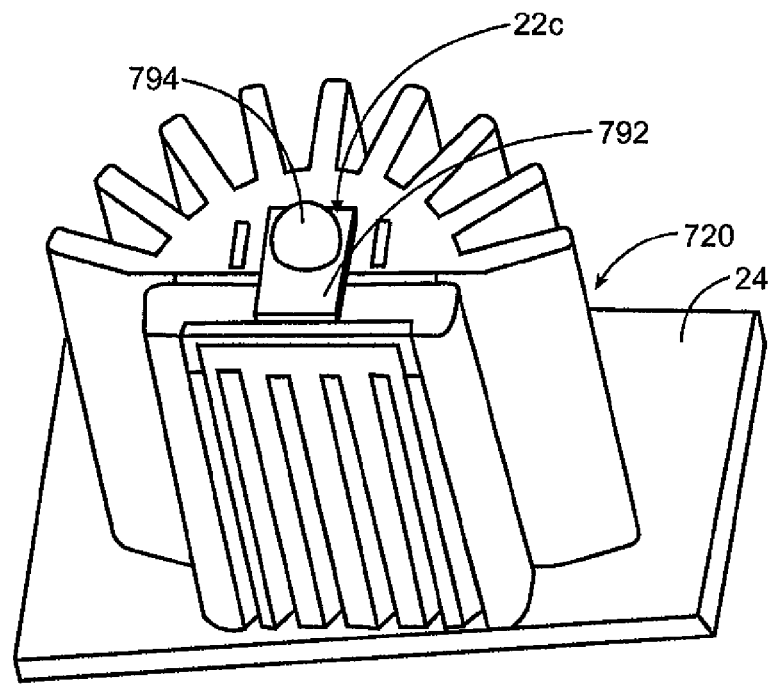
FIG. 40 is a top perspective view of the interconnect device of FIG. 36, having an LED device attached thereto and attached to a circuit member.
Figure 41:
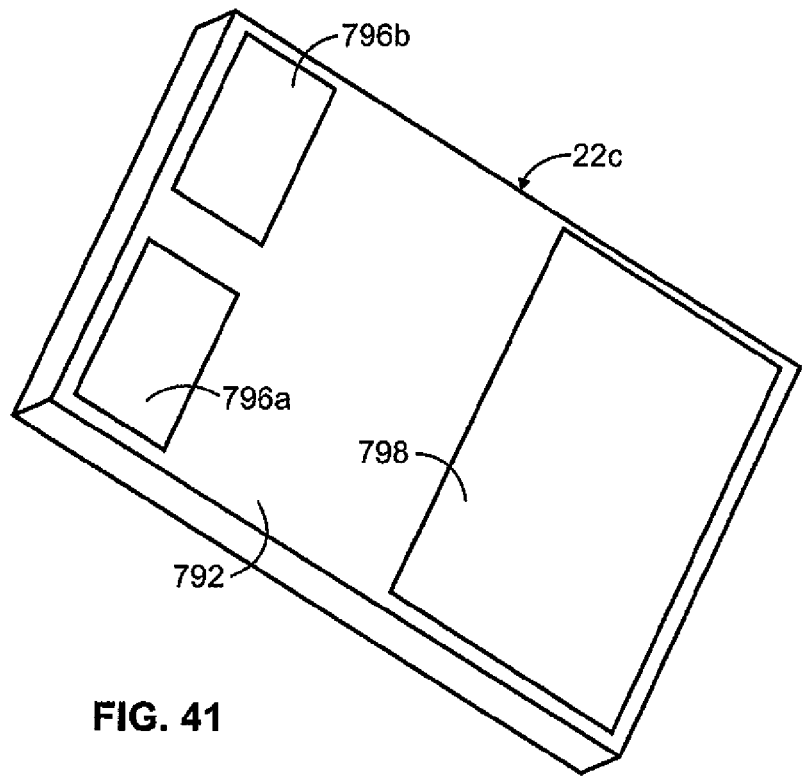
FIG. 41 is a bottom plan view of the LED device used with the interconnect device of FIG. 36.

As shown in FIGS. 40 and 41, the LED device 22c is formed from a substrate 792 on which at least one LED 794 is provided. A lens cover is provided over the at least one LED 794. A first conductive contact 796a is provided on the underside of the substrate 792 and is electrically connected, for example by soldering, electrical epoxy, to the anode of the interconnect device 720 which is formed by foot 736a, leg 728a and section 780a. A second conductive contact 796b, which is electrically isolated from the first conductive contact 796a, is provided on the underside of the substrate 792 and is electrically connected, for example by soldering, electrical epoxy, to the cathode of the interconnect device 720 which is formed by foot 736b, leg 728b and section 780b. The bottom surface of the substrate 792 has a thermal pad 798 which sits against and is soldered to the top surface 780 of the base 726, but not against sections 780a, 780b since only the conductive contacts 796a, 796b contact the substrate 792 in these sections 780a, 780b.

During operation of the LED device 22c, the LED device 22c generates heat which is transferred to the base 726, and this heat must be removed. Because of the plating, the heat sink function is directly integrated into the interconnect device 720. As air is circulated around the base 726 by known means, the heat is removed.

It is to be understood that the sixth embodiment can be fitted with the LED device 22c shown in the seventh embodiment, and the seventh embodiment can be fitted with the LED device 22b shown in the sixth embodiment, if desired, with minor modifications being made to the LED devices 22b, 22c which are apparent to one of ordinary skill in the art.

Therefore, in these sixth and seventh embodiments, the interconnect device 620, 720 provides a holder to which a high power/intensity LED device 22b, 22c can be attached. The interconnect device 620, 720 provides thermal management for the LED device 22b, 22c to prevent the LED device 22b, 22c from overheating. The interconnect device 620, 720 uses three-dimensional features, such as fins 676, 767 or thermal vias 632, 732 to provide a large surface area to dissipate heat generated by the LED device 22b, 22c. Some of the advantages of the interconnect device 620, 720 are:

1. The surface area of the interconnect device 620, 720 can be optimized for dissipating varying amounts of heat by increasing the diameter or height of the interconnect device 620, 720. The fins 676, 767 can be varied to increase the amount of surface area.

2. Additional components, such as resistors, capacitors, or driver electronics can be added to the interconnect device 620, 720 in order to make it a stand alone light source.

3. The boundary lines 686a, 686b, 786 on the interconnect device 620, 720 can be color coded to make it easy to distinguish the color of the LED device 22b, 22c that is mounted thereto.

4. The interconnect device 620, 720 can be plated with varying thicknesses of copper, nickel and/or gold to be optimized for transferring heat to the surfaces from which the heat is being dissipated.

5. The snap fit feature provided by the legs 628a, 628b, 728a, 728b and feet 636a, 636b, 736a, 736b can be incorporated into the interconnect device 620, 720 so that the interconnect device 620, 720 can be snapped into a conventional circuit member 24 to create the electrical and/or thermal connection.

6. The snap features can be surface mount soldered, if desired. The plastics used in the manufacture of the interconnect device 620, 720 are capable of withstanding lead free reflow temperatures.

7. The shape, size, and location of the thermal and electrical connections on the interconnect device 620, 720 can be modified by changing the inserts on the top in order for the interconnect device 620, 720 to accommodate various LED devices.

8. The snap features allow the interconnect device 620, 720 to be removed from the circuit member 24 after it has been assembled. This makes it possible to replace defective LED devices 22b, 22c, as well as change their color.

9. The interconnect device 620, 720 is much lighter than its equivalent prior art component. This is important for high LED count applications.

Figure 42:
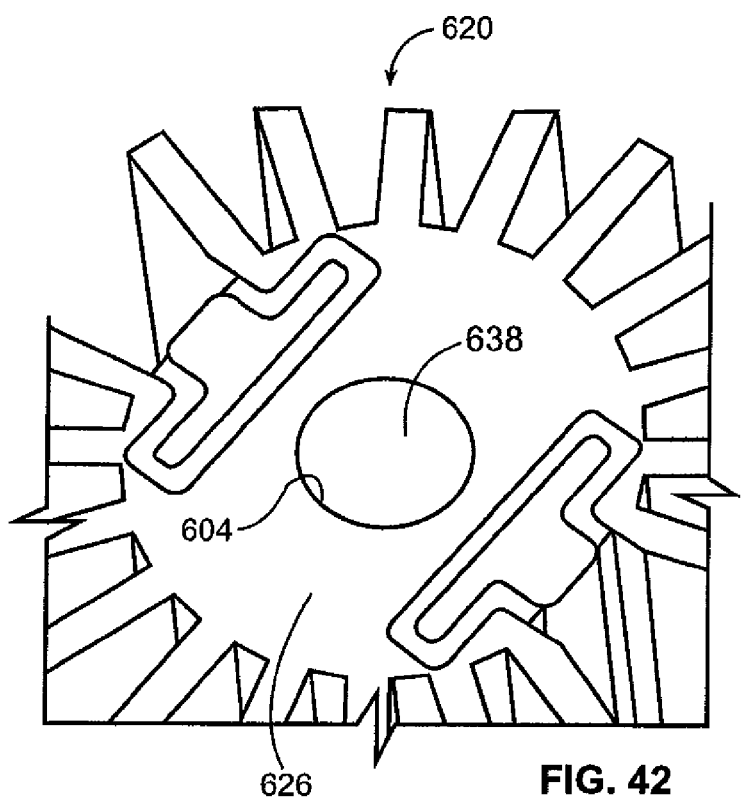
FIG. 42 is a partial top perspective view of the interconnect device of FIG. 31, with modifications thereto.
Figure 43:
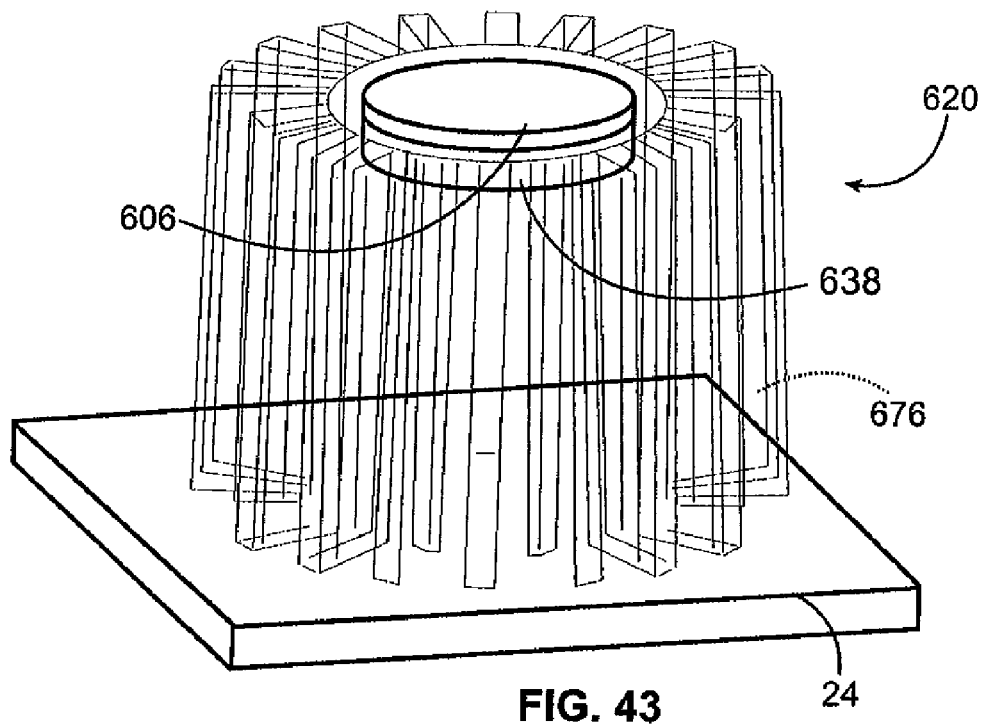
FIG. 43 is a top perspective view of the modified interconnect device of FIG. 42, which is shown in phantom line, and attached to a circuit member.

A modification that can be effected to the interconnect devices 220, 320, 420, 520, 620, 720 of the second through seventh embodiments is the use of a heat spreader 638, which as shown is a metal slug, preferably formed of copper, mounted in the top surface of the base 226, 326, 426, 526, 626, 726 of the interconnect devices 220, 320, 420, 520, 620, 720, to assist in conducting heat to the fins 248, 348, 448, 548, 676, 767, or if the fins 248, 348, 448, 548, 676, 767 are not provided, then to the portion of the interconnect devices 220, 320, 420, 520, 620, 720 that forms the heat sink. The heat spreader 638 is situated directly under the thermal pad 38, 698', 798 when the LED device 22a, 22b, 22c is attached, or if a thermal pad is not used, then directly under the LED device 22a, 22b, 22c, when attached. While the heat spreader 638 is shown associated with and described with respect to the sixth embodiment of the interconnect device 620 in FIGS. 42 and 43; it is to be understood that the heat spreader 638 can be used with any of the interconnect devices 220, 320, 420, 520, 720. If the heat spreader 638 is provided, the vias 232, 332, 432, 532, 632, 732, if provided, may be eliminated. As shown in FIGS. 42 and 43, the vias 232, 332, 432, 532, 632, 732 have been eliminated. The heat spreader 638 provides a thermal path between the thermal pad 38, 698', 798 and the fins 248, 348, 448, 548, 676, 767, which provides for an improved thermal path versus when the heat spreader 638 is not used in the interconnect devices 220, 320, 420, 520, 620, 720.

The heat spreader 638 may be formed by cutting a length of the copper from a round copper wire. The heat spreader 638 may have a variety of diameters, depending on the intended application. Preferably, the heat spreader 638 is approximately the same size as the area that is in contact with the thermal pad. It is to be understood, however, that the heat spreader 638 does not need to be round and take a variety of shapes.

A recess 604 is formed in the top surface of the base 626 during the first shot. The recess 604 can have any desired depth. The heat spreader 638 can be placed into the recess 604 before or after the plating is performed and fills the recess 604. If the heat spreader 638 is placed into the recess 604 before the plating is performed, the heat spreader 638 will also be plated. If the heat spreader 638 is placed into the recess 604 after the plating is performed, the heat spreader 638 is press-fit into the recess 604. The LED 22b is then attached as described herein. As shown in FIG. 43, a layer of solder 606 is shown to attach the LED 22b to the heat spreader 638.

Because two shot molding is used to form the interconnect device 120, 220, 320, 420, 520, 620, 720, surface mount feet or legs for soldering to the circuit member 24 can be provided.

While the first through seventh embodiments have been described with the first shot being the plateable material and the second shot being the non-plateable material, it is to be understood that the shots could be reversed such that the portions of the interconnect device 120, 220, 320, 420, 520, 620, 720 which are formed of the non-plateable material can be effected in the first shot and the portions of the interconnect device 120, 220, 320, 420, 520, 620, 720 which are formed of the plateable material can be effected in the second shot, as would be apparent to one of ordinary skill in the art.

Figure 44:
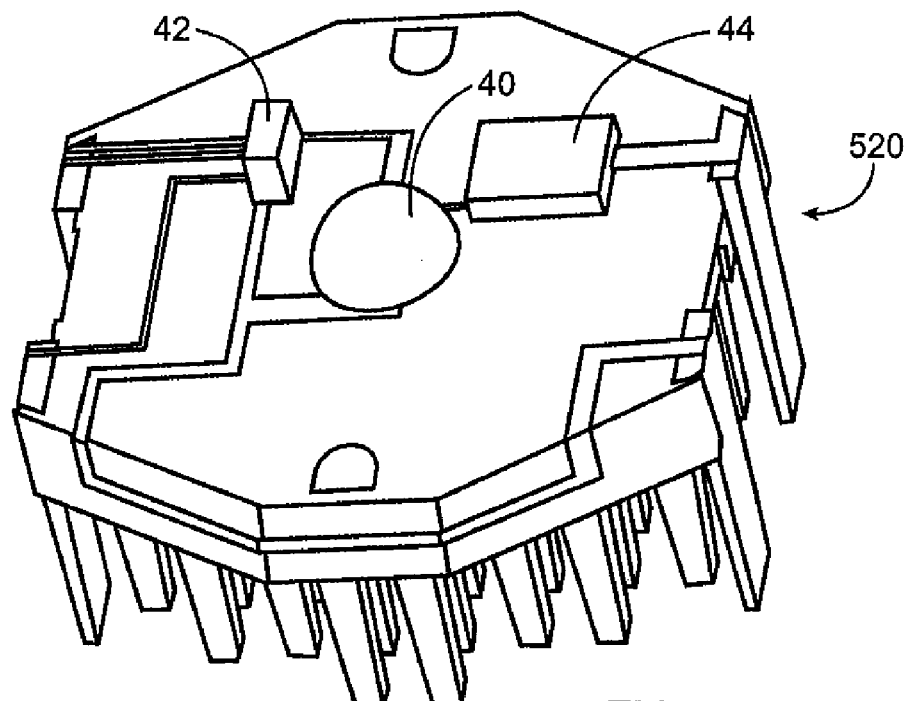
FIG. 44 is a top perspective view of an interconnect device of FIG. 24, having circuit traces and heat generating electrical components mounted thereon.

FIG. 44 shows the interconnect device 520 having laser marked circuit traces formed thereon. Heat generating electrical components, such as an LED 40, a resistor 42 and a capacitor 44, are attached to the base 526 of the interconnect device 520. While the laser marked circuit traces and the heat generating electrical components are shown on the fifth embodiment, it is to be understood that the laser marked circuit traces and the heat generating electrical components can be provided on any of the other embodiments.

While the reflector 1600 is shown in the fifth embodiment, it is to be understood that the reflector 1600 can be used in any of the first through seventh embodiments.

Figure 45:
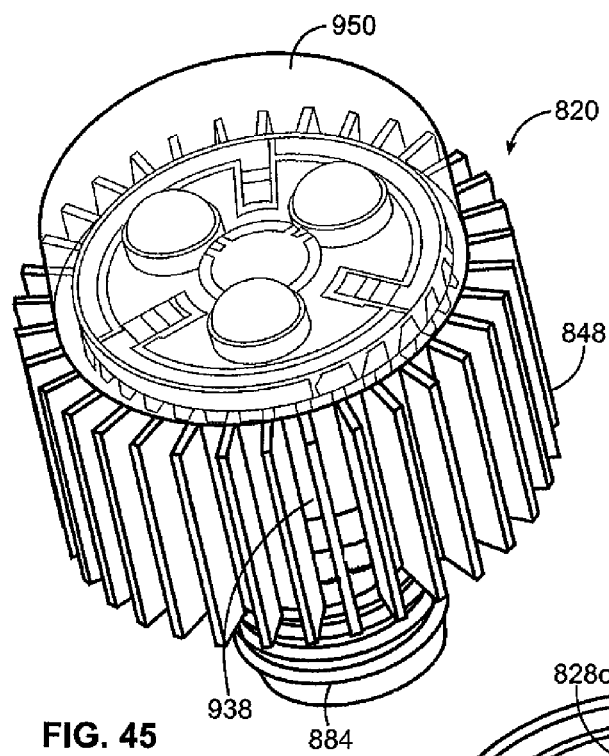
FIG. 45 is a top perspective view of an interconnect device which incorporates the features in accordance with a eighth embodiment of the present invention.
Figure 46:
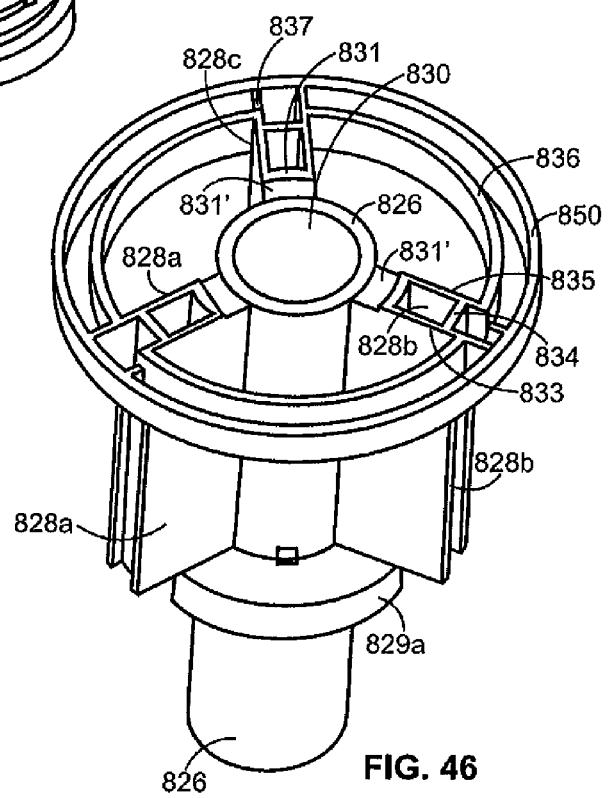
FIG. 46 is a top perspective view of the first shot of the interconnect device of FIG. 45.
Figure 47:
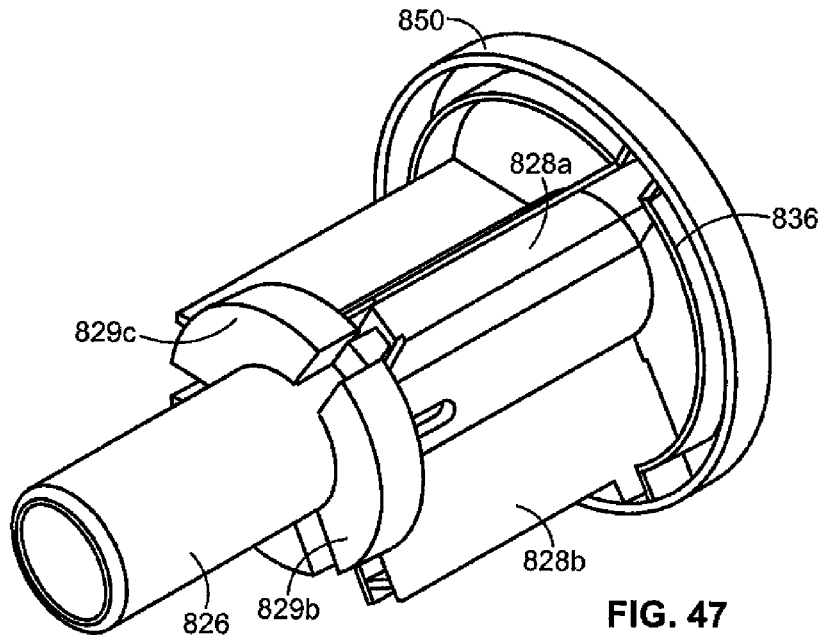
FIG. 47 is an alternate top perspective view of the first shot of the interconnect device of FIG. 45.
Figure 48:
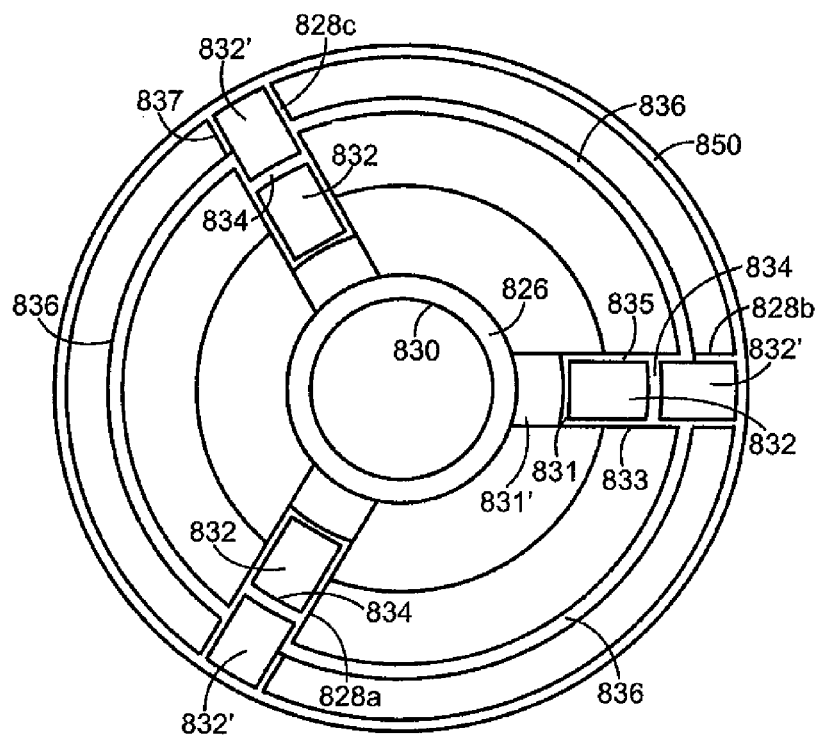
FIG. 48 is a top plan view of the first shot of the interconnect device of FIG. 45.

Attention is invited to the eighth embodiment of the interconnect device 820 which is shown in FIGS. 45-59. As shown in FIGS. 46-48, the first shot creates a base member which includes a generally cylindrical base 826 having a plurality of legs 828a, 828b, 828c radiating outwardly from a middle portion thereof, a plurality of lower flanges 829a, 829b, 829c radiating outwardly from proximate to a lower end thereof, an outer ring 850 extending around the legs 828a, 828b, 828c, and arcuate bridges 838 between the legs 828a, 828b, 828c. The base 826 has a cylindrical central passageway 830 extending from the upper end to the lower end. The first shot is formed of a non-plateable thermoplastic which acts as an insulator.

As shown, three legs 828a, 828b, 828c are provided and are equidistantly-spaced from each other around the base 826. Each leg 828a, 828b, 828c is formed by a first wall 831 which extends radially outwardly from the base 826, a second wall 833 which extends from one edge of the first wall and radially outwardly from the base 826, a third wall 835 which extends from the other edge of the first wall 831 and radially outwardly from the base 826, and a fourth wall 834 which extend between the second and third walls 833, 835 at approximately the midpoint thereof. A recessed section 831' is provided in each first wall 831 proximate to the base 826. A cutout 837 is provided in the upper surface of each third wall 835 at its outer end. The outer ring 850 is continuous and extends around the legs 828a, 828b, 828c at the outer ends of the second and third walls 833, 835. A pair of passageway 832, 832' are formed by walls 831, 833, 834, 835 and ring 850 and extend through each leg 828a, 828b, 828c from the upper end to the lower end thereof.

An arcuate bridge 836 extends between each of the legs 828a, 828b, 828c and is spaced inwardly from the outer ring 850. Each arcuate bridge 836 extends from the second wall 835, proximate to the cutout 837, of one leg, to the first wall 833 of the adjacent leg.

The flanges 829a, 829b, 829c are spaced apart from each other and are positioned proximate to the lower end of the legs 828a, 828b, 828c. The flanges 829a, 829b, 829c do not close the lower ends of the passageway 832, 832' through the legs 828a, 828b, 828c.

Figure 49:
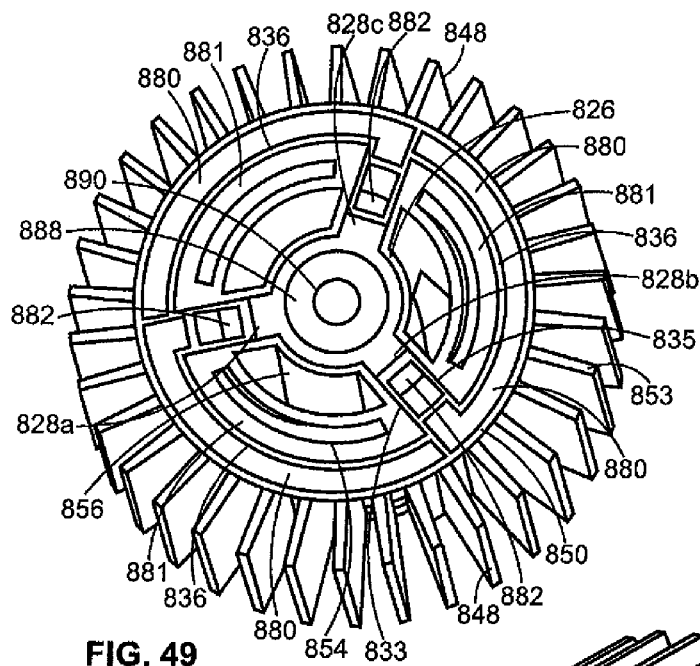
FIG. 49 is a top perspective view of the first and second shots of the interconnect device of FIG. 45.
Figure 50:
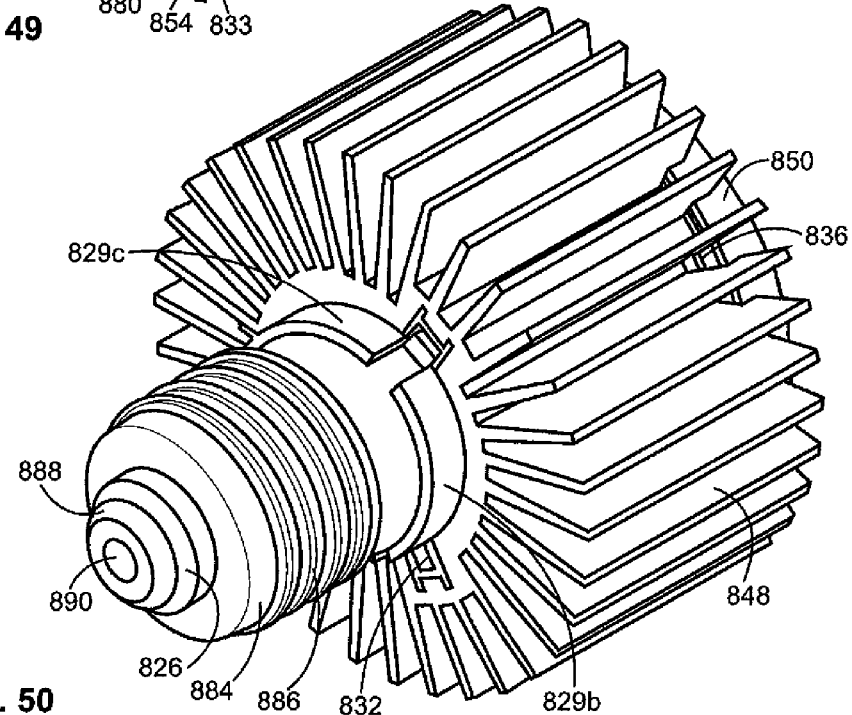
FIG. 50 is a bottom perspective view of the first and second shots of the interconnect device of FIG. 45.
Figure 51:
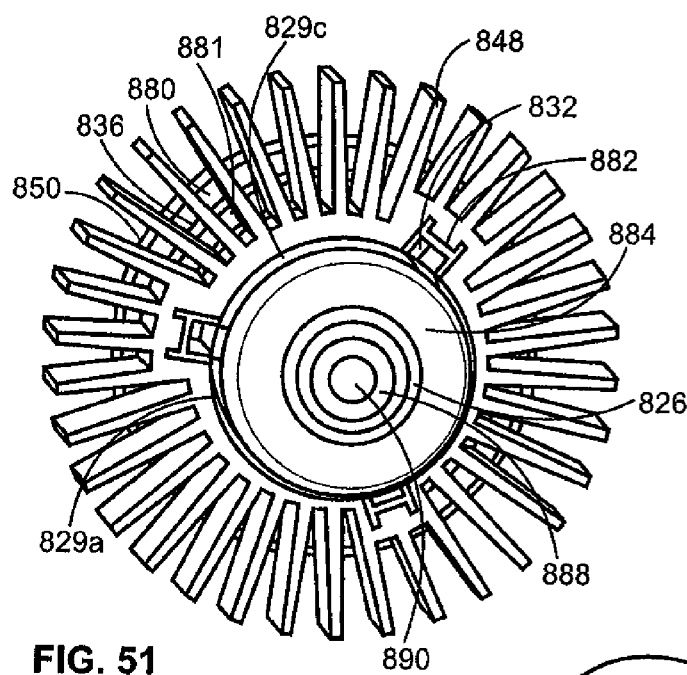
FIG. 51 is an alternate bottom perspective view of the first and second shots of the interconnect device of FIG. 45.

After the base member is created by the first shot, the second shot 853, as shown in FIGS. 49-51, is overmolded onto the base member. The second shot 853 is formed of a plateable thermoplastic material that can be metalized because of a palladium catalyst added to the plastic. Once metalized, the exposed surfaces of second shot 853 provide a heat sink portion of the interconnect device 820, and surfaces that provide the desired electrical paths.

A portion 880 of the second shot 853 fills the area between the outer ring 850 and the arcuate bridges 836, and also fills the cutout 837 and the passageway 832'. A portion 881 of the second shot 853 fills the areas between the arcuate bridges 836, the adjacent legs and the base 826, with the exception of passageways 854, 856 formed in portions 881. A portion 882 of the second shot 853 also fills in a section of each passageway 832 which is closest to the base 826, but does not completely fill each passageway 832. The remainder of the surfaces forming each passageway 832 remain exposed. The upper ends of the outer ring 850, the arcuate bridges 836 and the legs 828a, 828b, 828c (with the exception of the cutout 837 area) remain exposed.

A plurality of radially extending fins 848 are formed by the second shot 853 and extend outwardly from the base 826 and legs 828a, 828b, 828c. The bottom end of the legs 828a, 828b, 828c remain exposed. The fins 848 extend between the arcuate bridges 836/outer ring 850 and the flanges 829a, 829b, 829c. The upper end of the fins 848 partially overlap the outer surface of the outer ring 850, but the remainder of the outer surface of the outer ring 850 remains exposed. The flanges 829a, 829b, 829c remain exposed. Passageways are formed in some of the fins 848 which communicate with the passageways 854.

Figure 60A:
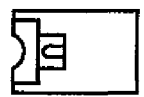
FIGS. 60A-60O show schematic examples of light bulb bases that can provided with the interconnect device of FIG. 45.
Figure 60B:
Figure 60C:
Figure 60D:
Figure 60E:
Figure 60F:
Figure 60G:
Figure 60H:
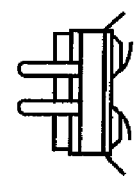
Figure 60I:
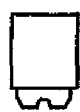
Figure 60J:
Figure 60K:
Figure 60L:
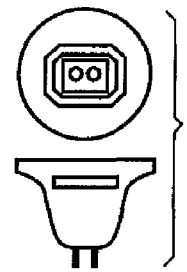
Figure 60M:
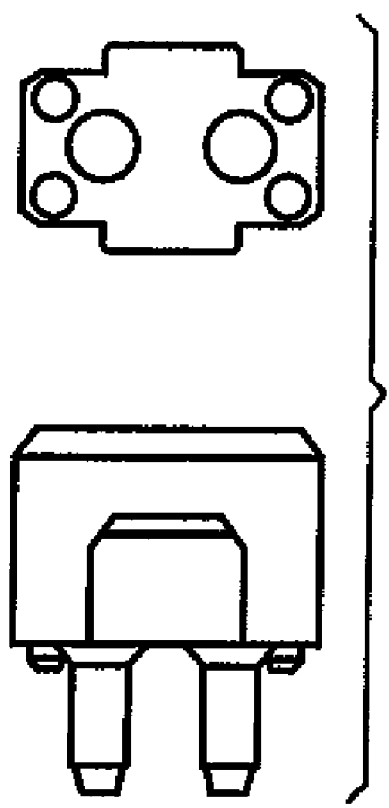
Figure 60N:
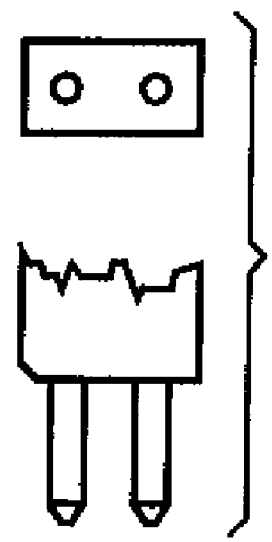
Figure 60O:
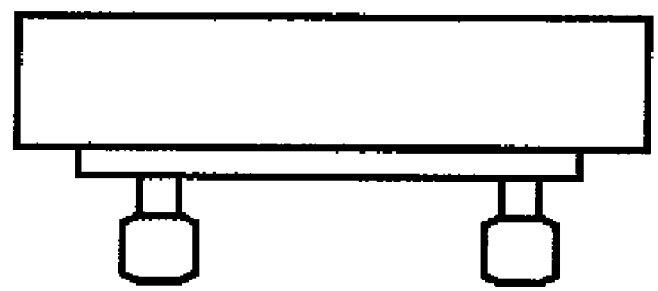

A portion 884 of the second shot 853 overlays the lower portion of the base 826, with the exception of the bottommost end of the base 826. Portion 884 has a thread form 886 provided thereon. Portion 884 also overlays the sections of the base 826 between the flanges 829a, 829b, 829c. Portion 884 forms a base which is capable of being mated with a lightbulb socket (not shown) which provides the power source. As shown, portion 884 in FIG. 45 is an Edison base. It is to be understood that instead of portion 884 forming an Edison base, portion 884 can be formed as any of the known forms for plugging, screwing or otherwise mating into a lightbulb socket, such as those shown in, but not limited to, FIGS. 60A-60. As is known in the art, FIG. 60A shows a recessed single contact base, FIG. 60B shows a candelabra base, FIG. 60C shows a double contact bayonet base, FIG. 60D shows intermediate E17 base, FIG. 60E shows a medium E26 base, FIG. 60F shows a mini-can E11 screw base, FIG. 60G shows a miniature screw base, FIG. 60H shows a mogul end prong base, FIG. 60I shows a mogul prefocus base, FIG. 60J shows a bulb screw terminal G53 base, FIG. 60K shows a G4 bipin base, FIG. 60L shows a GU5.3 base, FIG. 60M shows a GY9.5 base, FIG. 60N shows a GY6.35 bipin base, and FIG. 60O shows a GU24 base.

The passageway 830 in the base 826 is filled by a portion 888 of the second shot 853, with the exception of a cylindrical passageway 890 formed in the center thereof. The portion 888 also covers the lower end of the base 826.

Thereafter, portions 880, 881, 882, 886, 888 and the fins 848 formed by the second shot 853 are etched and only the exposed portions of the second shot 853 are metal plated. Preferably, the exposed and etched portions of the second shot 853 are plated with a conductive copper layer and then metalized with a copper, nickel, palladium and/or gold finish. The top surface is flat, with the exception of the area provided by the recesses 831'.

Figure 52:
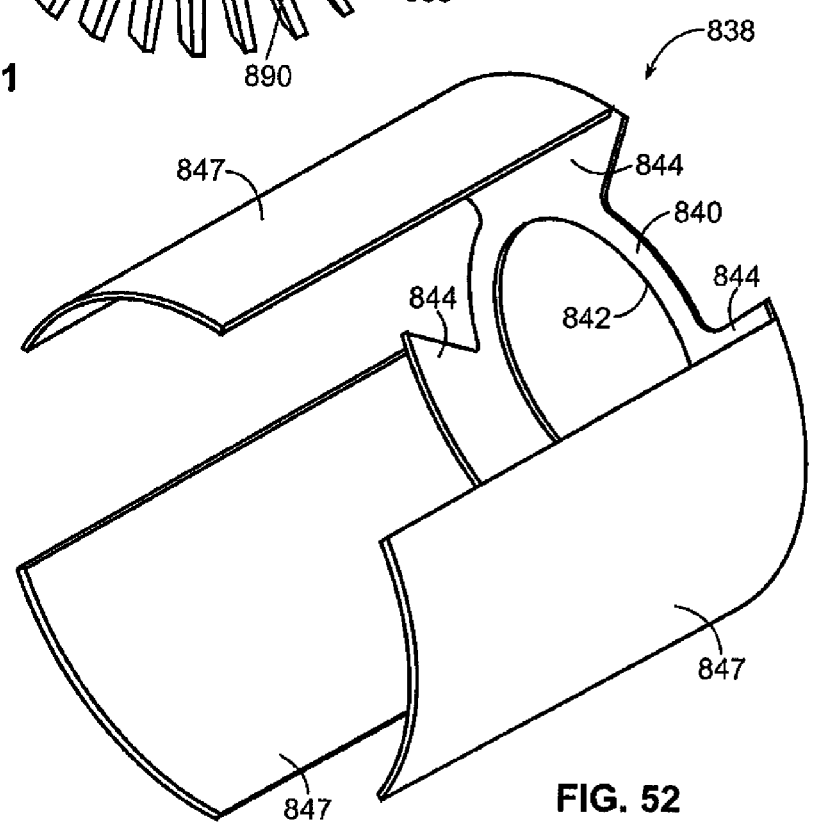
FIG. 52 is a bottom perspective view of a heat spreader used in the interconnect device of FIG. 45.
Figure 53:
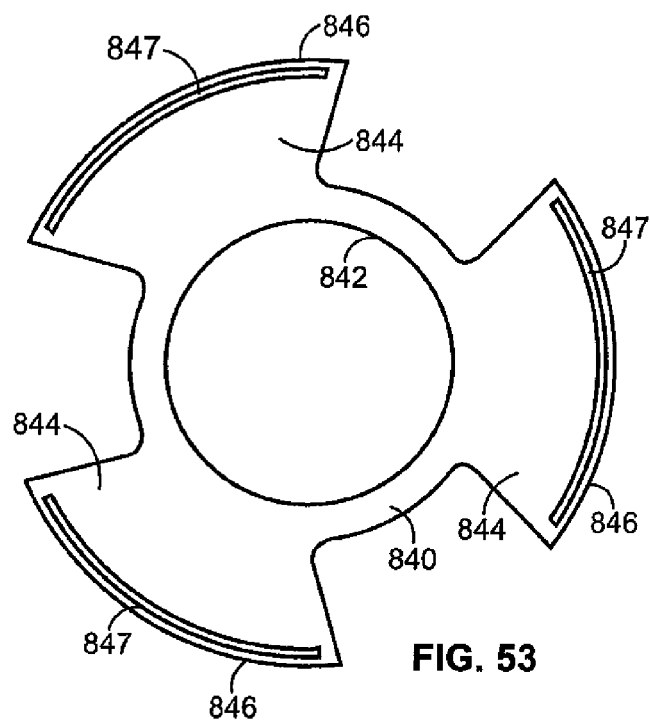
FIG. 53 is a bottom perspective view of the heat spreader of FIG. 52.
Figure 54:
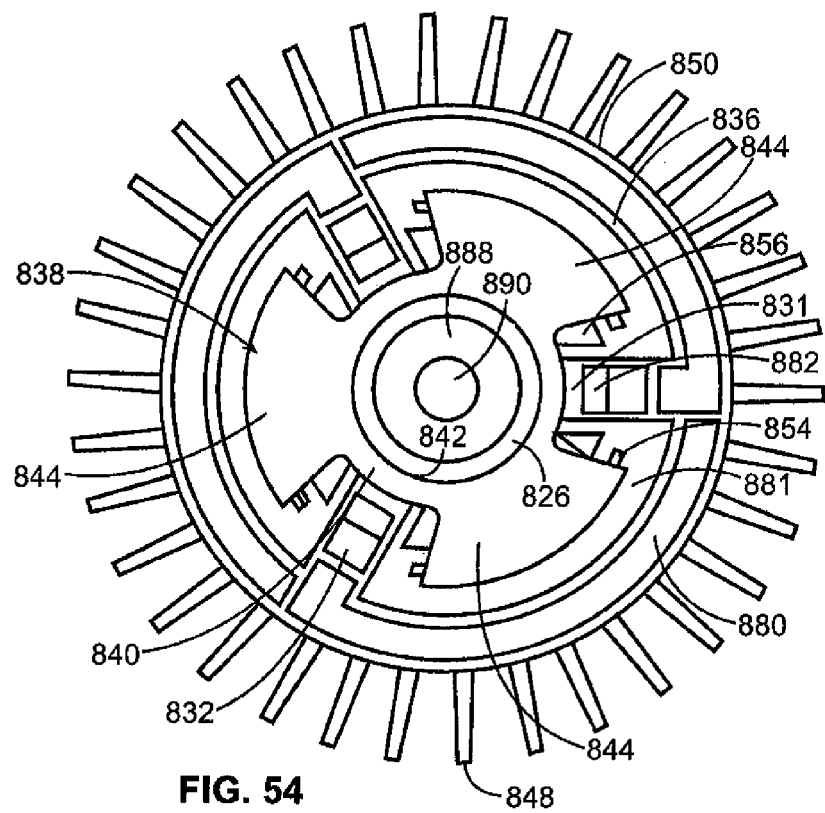
FIGS. 54-57 are top plan views of the interconnect device of FIG. 45 in the process of being assembled.

After plating, a heat spreader 838 is inserted into the passageways 854 and the passageways which are formed in some of the fins 848 which communicate with the passageways 854, see FIG. 54. The heat spreader 838 is best shown in FIGS. 52 and 53. The heat spreader 838 is a metal member, preferably formed of copper, which has been stamped out of a flat sheet of material and bent and formed into the desired shape. The heat spreader 838 includes a circular base 840 having an aperture 842 therethrough. A plurality of arms 844 extend radially outwardly from the base 840. The edges of the arms 844 taper outwardly from the base 840 such that the width of each arm 844 at the connection to the base 840 is smaller than the width of each arm 844 at its opposite outer end 846. The outer end 846 of each arm 844 is rounded such that the ends 846 fall along a common circle. A leg 847 extends downwardly from each outer end 846. Each leg 847 is curved such that the legs 847 fall along a common circle. The heat spreader 838 is attached by inserting the legs 847 into the passageways 854. The heat spreader 838 can be mounted in the passageways 854 by any suitable means, such as using thermal grease, solder paste (with reflow), or being press-fit. The lower surface of the respective legs 844 sit against the upper surface of the portions 881 and over the passageways 856. The base 840 overlays the recesses 831' in the legs 828a, 828b, 828c and encircles the upper end of the base 826.

Figure 55:
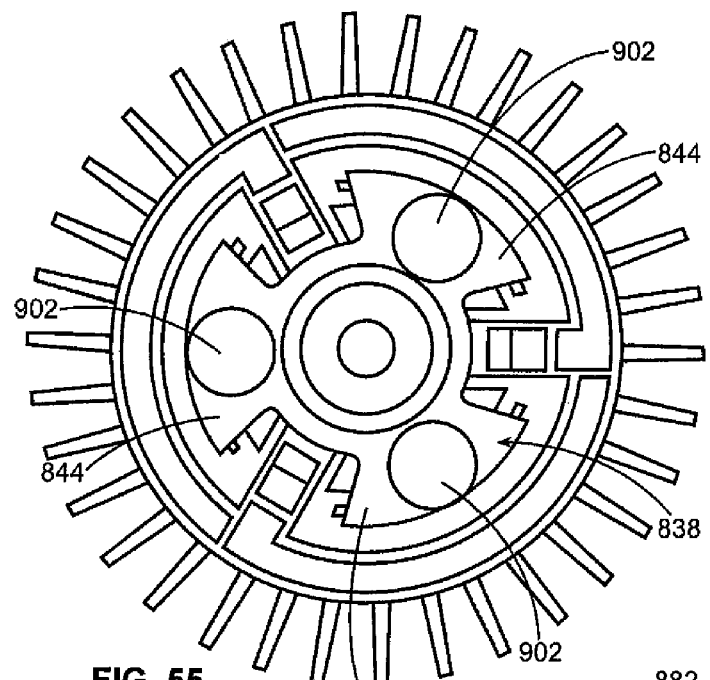

As shown in FIG. 55, a thin metal slug 902, preferably formed of copper, is mounted to each leg 844 of the heat spreader 838. The slug 902 may be soldered to the heat spreader 838.

Figure 56:
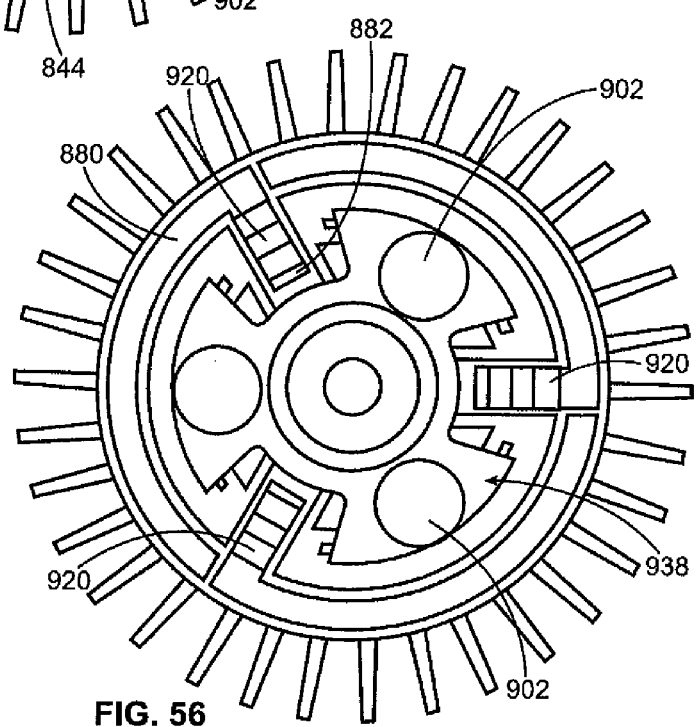
Figure 57:
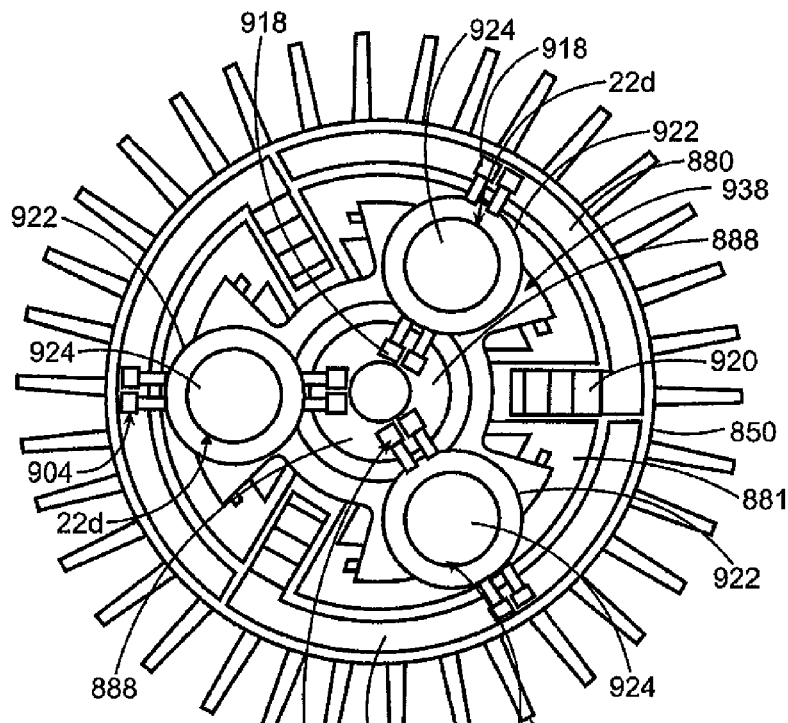

After plating, as shown in FIG. 56, resistors 920 are fixedly mounted on the top surface and span between portions 880 and 882. The resistors 890 are preferably soldered onto portions 880, 882.

Figure 59:
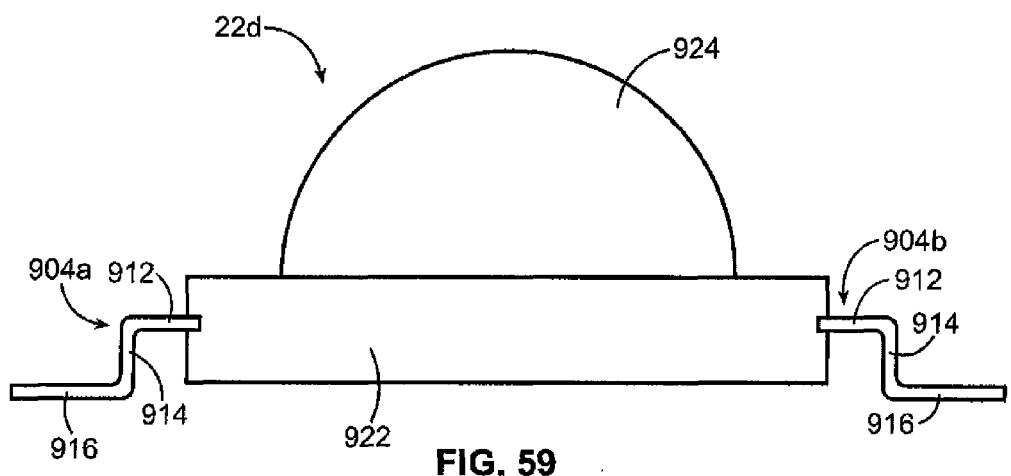
FIG. 59 is a side elevational view of the interconnect device shown in FIG. 56.

As shown in FIG. 59, the LED device 22d is formed from a substrate 922 on which at least one LED 924 is provided. A lens cover is provided over the at least one LED 924. A first conductive contact 904a has an end electrically connected, for example by wire bonding, to the silicant in the substrate 922, and the other end of the conductive contact 904a is electrically connected, for example by soldering, electrical epoxy, to the anode of the interconnect device 820. A second conductive contact 904b, which is electrically isolated from the first conductive contact 904a, has an end electrically connected, for example by wire bonding, to the silicant in the substrate 692, and the other end of the conductive contact 904b is electrically connected, for example by soldering, electrical epoxy, to the cathode of the interconnect device 820.

Figure 58:
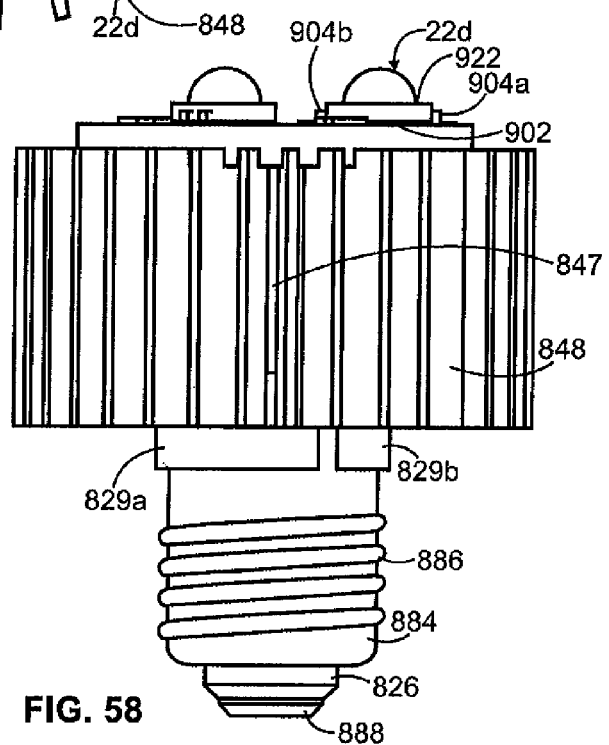
FIG. 58 is a side elevational view of a LED device used in the interconnect device of FIG. 45.

Each contact 904a, 904b is best illustrated in FIGS. 58 and 59. Each contact 904a, 904b is a conductive metal member which has been stamped out of a flat sheet of material and bent and formed into the desired shape. The contact 904a, 904b has a flat base within the base 922, and a pair of legs which extending from the base. Each leg has a first section 912 which extends outwardly from the base and is planar with the base within base 922, a second section 914 which is perpendicular to the first section 912 and a third section 916 which is perpendicular to the second section 910 and parallel to the first section 912. An enlarged end 918 is provided at the end of each third section 916. The enlarged ends 918 of one contact 904a are mounted on portion 880. The enlarged ends 918 of the other contact 904b are mounted on portion 888. The respective bases 922 abut against the respective slugs 902 as best shown in FIG. 58.

As a result, a heat sink is provided by way of slug 902, heat spreader 938, plated portion 881 (which includes plated passageways 854) and plated fins 848. An anode or power path is formed by portion 888 which is electrically connected to contact 902b of LED device 22d. A cathode or ground path is formed from the LED device 22d via contact 902a which is electrically connected to portion 880 which is electrically connected to resistor 920 which is electrically connected to portion 882 which is electrically connected to portion 884. The anode or power and the cathode or ground are electrically isolated from each other by the insulative first shot, and the heat sink is electrically isolated from the anode and cathode. The anode or power and the cathode or ground provide for an electrical path between the circuit member and the LED device 22d. As a result, the heat sink function and the electrical path function are provided by the interconnect device 820. The anode, cathode and heat sink are simultaneously formed when the exposed portions of the first shot are metal plated.

During operation of the LED device 22d, the LED device 22d generates heat which must be removed. The heat is transferred to the slug 902 and the heat spreader 838, and then to the fins 848. Because of the plating, the heat sink function is directly integrated into the interconnect device 820. As air is circulated around the interconnect device 820 by known means, the heat is removed.

As shown in FIG. 45, a lens cover 950 covers the heat spreader 838, the slugs 902, the contacts 904, the resistors 920, and the LED devices 22d. The lens cover 950 may be colored, or transparent.

In this eighth embodiment, the interconnect device 820 provides a holder to which a high power/intensity LED device 22d can be attached. The interconnect device 820 provides thermal management for the LED device 22d to prevent the LED device 22d from overheating. The interconnect device 820 uses three-dimensional features, such as fins 848 to provide a large surface area to dissipate heat generated by the LED device 22d. Some of the advantages of the interconnect device 820 are:

1. The surface area of the interconnect device 820 can be optimized for dissipating varying amounts of heat by increasing the diameter or height of the interconnect device 820. The fins 848 can be varied to increase the amount of surface area.
2. Additional components, such as resistors, capacitors, or driver electronics can be added to the interconnect device 820.
3. The first shot on the interconnect device 820 can be color coded to make it easy to distinguish the color of the LED device 22d that is mounted thereto.
4. The interconnect device 820 can be plated with varying thicknesses of copper, nickel and/or gold to be optimized for transferring heat to the surfaces from which the heat is being dissipated.

Several advantages are realized by producing a heat sink in the manner described with regard to these embodiments. The interconnect device 120, 220, 320, 420, 520, 620, 720, 820 is significantly lighter than solid aluminum heat sinks. The interconnect device 120, 220, 320, 420, 520, 620, 720, 820 creates an electromechanical package for the LED device 22, 22a, 22b, 22c, 22d to be packaged so that thermal management, mechanical support, and electrical interconnection features are all integrated into one component. While specific shapes are shown, there are an unlimited number of possible shapes, which also makes it possible to create LED device packaging that makes it possible to easily maintain, rework, and field repair the LED device 22, 22a, 22b, 22c, 22d installed into the package. This ultimately reduces the system cost of the overall package.

The electrical contact features for the anode/power and cathode/ground for the LED device 22, 22a, 22b, 22c, 22d are isolated, while providing thermal management to remove the heat from the LED device 22, 22a, 22b, 22c, 22d. If the interconnect device 120, 220, 320, 420, 520, 620, 720, 820 were produced from a material such as aluminum, multiple components would be required to electrically and thermally isolate the various functions required to make this interconnect device 120, 220, 320, 420, 520, 620, 720, 820 function.

While the interconnect device 120, 220, 320, 420, 520, 620, 720, 820 has been described as being formed by using two or more shot molding, other manufacturing processes may be used to form the present invention.

A combination of laser etching and a two or more shot method can be used. The two shot plus laser method of forming the interconnect device 120, 220, 320, 420, 520, 620, 720, 820 is not complicated and does not require many steps to produce the interconnect device 120, 220, 320, 420, 520, 620, 720, 820, thereby resulting in a cost effective and economic process. The lead times for tooling is not high and the limitations on resolution is practically non-existent. This manufacturing method significantly increases the capabilities of two shot molding process and the laser marking process and provides design flexibility.

Some of the basic principles of materials and plating that makes the combination of laser etching and a two or more shot method process possible are as follows: 1. the plating process for the selective metallization for two shot parts and laser marked parts is the same after the two shot part has been etched and the laser markable material has been marked; 2. some plastics are etched with caustic solutions and will not be affected by acidic etchants such as chromic acid; and 3. some plastics are etched with chromic acid etchant and will not be affected by caustic etchants.

The various process sequences that can be used to produce a device, such as the present heat sink, that has the advantages of both a two shot device and a laser marked device is as follows:

Process #1
1. Mold a palladium filled material, in a first shot, that is chromic acid etchable (example, syndiotactic polystyrene (SPS) material);
2. Overmold, in a second shot, the palladium filled material with a laser direct structureable (LDS) material that is etchable with caustic etchant (example, liquid crystal polymer (LCP), polyethylene terephthalate (PET), polybutylene terephthalate (PBT)) to form a product;
3. Etch the product with chromic acid etchant;
4. Laser mark the LDS material with a desired marking, such as a circuit pattern; and
5. Plate the product with the desired metalizations. Typical metalizations include copper, nickel, palladium and gold.

Process #2
1. Mold a LDS material that can only be etched in caustic etchant (example, liquid crystal polymer (LCP), polyethylene terephthalate (PET), polybutylene terephthalate (PBT)) in a first shot;
2. Overmold the LDS material with a palladium filled material in a second shot thereby forming a product, the palladium filled material only being etchable in chromic acid etchant (example, syndiotactic polystyrene (SPS) material);
3. Etch the product in chromic acid etchant;
4. Laser mark the LDS material with a desired marking, such as a circuit pattern; and
5. Plate the product with the desired metalizations. Typical metalizations include copper, nickel, palladium and gold.

Process #3
1. Mold a palladium filled material in a first shot, the palladium filled material being etchable in caustic acid etchant (example, liquid crystal polymer (LCP));
2. Overmold the palladium filled material with an LDS material in a second shot thereby forming a product, the LDS material being etchable with chromic acid etchant and not etchable by caustic acid etchant (example, Nylon—sold under the trademark ULTRAMID® T KR4380 LS);
3. Etch the product in caustic acid etchant;
4. Laser mark the LDS material with a desired marking, such as a circuit pattern; and
5. Plate the product with the desired metalizations. Typical metalizations include copper, nickel, palladium and gold.

Process #4
1. Mold an LDS material in a first shot, the LDS material not being etchable by caustic acid etchant (example: polycarbonate acrylonitrile butadiene styrene blend (PC/ABS), nylon);
2. Overmold the LDS material with a palladium filled material in a second shot thereby forming a product, the palladium filled material being etchable by caustic acid etchant (example, liquid crystal polymer (LCP), polyethylene terephthalate (PET), polybutylene terephthalate (PBT));
3. Etch the product in caustic acid etchant;
4. Laser mark the LDS material with a desired marking, such as a circuit pattern; and
5. Plate the product with the desired metalizations. Typical metalizations include copper, nickel, palladium and gold.

These method steps define the various methods that can be used to produce the variations of a two shot/LDS interconnect device. The advantages are that the method produces a product with three-dimensional, plated through-holes, fine pitch, variable patterns, by low cost manufacturing.

Alternatively, the interconnect device 120, 220, 320, 420, 520, 620, 720, 820 can be formed with only a single shot of LDS material which is then laser marked to form the desired patterns which will form the circuit pattern and the heat sink. Thereafter, the product is plated with the desired metalizations. Typical metalizations include copper, nickel, palladium and gold.

While the second through eighth embodiment describe the heat sink being electrically isolated from the anode/power and cathode/ground, it is to be understood that this is not necessarily required, depending on the type of LED (if a direct current LED is used) used with the interconnect device 220, 320, 420, 520, 620, 720, 820. As with the first embodiment of the interconnect device 120, provided the proper LED is used, the heat sink may be electrically connected to one of the anode/power and cathode/ground. As a result, the heat sink and the one of the anode/power and cathode/ground which are electrically connected provides a heat dissipating surface and such surface is primarily thermally functional and generally electrically non-functional. In a DC circuit, it is not necessary to electrically isolate the circuitry from the heat sink. Therefore, the heat sink can form a part of or be attached to the circuitry, but it is not essential to the function of the electrical circuitry. In other words, if the heat sink component were removed or electrically isolated from the electrical circuit, the circuit would still operate electrically.

While preferred embodiments of the present invention are shown and described, it is envisioned that those skilled in the art may devise various modifications of the present invention without departing from the spirit and scope of the appended claims.

The invention claimed is:

1. A method of manufacturing an interconnect device for connecting to a heat generating device and for connection to a power source, comprising:
    forming a base member by a first shot of material;
    overmolding a portion of said base member with a material in a second shot;
    one of said first and second shots being a non-plateable, insulative material and the other of said shots being a plateable material;
    forming a first plated component on said plateable material, said first plated providing a heat sink function for the heat generating device when the heat generating device is connected to the interconnect device; and
    forming a second plated component on said plateable material, said second plated providing an electrical path between the heat generating device and the circuit member.

2. The method of claim 1, wherein the shot of a non-plateable material can be formed of a variety of different colors.

3. The method of claim 1, wherein said steps of forming said first plated component and forming said second plated component are performed simultaneously.

4. The method of claim 1, wherein during said step of forming said base member, a recess is formed therein, and thereafter inserting a heat spreader into said recess prior to forming said first plated component.

5. The method of claim 1, wherein during said step of forming said base member, a recess is formed therein, and thereafter inserting a heat spreader into said recess after forming said first plated component.

* * * * *